(12) United States Patent
Abatchev et al.

(10) Patent No.: US 7,429,536 B2
(45) Date of Patent: Sep. 30, 2008

(54) METHODS FOR FORMING ARRAYS OF SMALL, CLOSELY SPACED FEATURES

(75) Inventors: Mirzafer Abatchev, Boise, ID (US); Gurtej Sandhu, Boise, ID (US)

(73) Assignee: MICRON Technology, Inc., Boise, ID (US)

( * ) Notice: Subject to any disclaimer, the term of this patent is extended or adjusted under 35 U.S.C. 154(b) by 324 days.

(21) Appl. No.: 11/134,982

(22) Filed: May 23, 2005

(65) Prior Publication Data

US 2006/0263699 A1   Nov. 23, 2006

(51) Int. Cl.
*H01L 21/302* (2006.01)
*H01L 21/461* (2006.01)
(52) U.S. Cl. .................. 438/725; 438/597; 438/709
(58) Field of Classification Search .................. 438/597, 438/424, 427, 430, 942, 944, 950, 709, 725; 257/E21.038, E21.039; 430/5, 311, 313
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,648,937 A | 3/1987 | Ogura et al. | |
| 4,716,131 A | 12/1987 | Okazawa et al. | |
| 4,776,922 A | 10/1988 | Bhattascharyya et al. | |
| 4,838,991 A | 6/1989 | Cote et al. | |
| 5,013,680 A | 5/1991 | Lowrey et al. | |
| 5,047,117 A | 9/1991 | Roberts | |
| 5,053,105 A | 10/1991 | Fox, III | |
| 5,117,027 A | 5/1992 | Bernhardt et al. | |
| 5,328,810 A | 7/1994 | Lowrey et al. | |
| 5,330,879 A | 7/1994 | Dennison | |
| 5,514,885 A | 5/1996 | Myrick | |
| 5,670,794 A | 9/1997 | Manning | |
| 5,753,546 A | 5/1998 | Koh et al. | |
| 5,789,320 A | 8/1998 | Andricacos et al. | |

(Continued)

FOREIGN PATENT DOCUMENTS

DE   42 36 609 A1   5/1994

(Continued)

OTHER PUBLICATIONS

Bergeron, et al., "Resolution Enhancement Techniques for the 90nm Technology Node and Beyond," Future Fab International, Issue 15, Jul. 11, 2003, 4 pages.

(Continued)

*Primary Examiner*—Thao X. Le
*Assistant Examiner*—Eric W Jones
(74) *Attorney, Agent, or Firm*—Knobbe Martens Olson & Bear, LLP

(57) ABSTRACT

Methods of forming arrays of small, densely spaced holes or pillars for use in integrated circuits are disclosed. Various pattern transfer and etching steps can be used, in combination with pitch-reduction techniques, to create densely-packed features. Conventional photolithography steps can be used in combination with pitch-reduction techniques to form sumperimposed, pitch-reduced patterns of crossing elongate features that can be consolidated into a single layer.

42 Claims, 54 Drawing Sheets

U.S. PATENT DOCUMENTS

| | | | |
|---|---|---|---|
| 5,795,830 | A | 8/1998 | Cronin et al. |
| 5,998,256 | A | 12/1999 | Juengling |
| 6,004,862 | A | 12/1999 | Kim et al. |
| 6,010,946 | A | 1/2000 | Hisamune et al. |
| 6,042,998 | A | 3/2000 | Brueck et al. |
| 6,057,573 | A | 5/2000 | Kirsch et al. |
| 6,063,688 | A | 5/2000 | Doyle et al. |
| 6,071,789 | A | 6/2000 | Yang et al. |
| 6,211,044 | B1 | 4/2001 | Xiang et al. |
| 6,288,454 | B1 | 9/2001 | Allman et al. |
| 6,291,334 | B1 | 9/2001 | Somekh |
| 6,297,554 | B1 | 10/2001 | Lin |
| 6,348,380 | B1 | 2/2002 | Weimer et al. |
| 6,362,057 | B1 | 3/2002 | Taylor, Jr. et al. |
| 6,383,907 | B1 | 5/2002 | Hasegawa et al. |
| 6,395,613 | B1 | 5/2002 | Juengling |
| 6,423,474 | B1 | 7/2002 | Holscher |
| 6,455,372 | B1 | 9/2002 | Weimer |
| 6,514,884 | B2 | 2/2003 | Maeda |
| 6,522,584 | B1 | 2/2003 | Chen et al. |
| 6,534,243 | B1 | 3/2003 | Templeton |
| 6,548,396 | B2 | 4/2003 | Naik et al. |
| 6,559,017 | B1 | 5/2003 | Brown et al. |
| 6,566,280 | B1 | 5/2003 | Meagley et al. |
| 6,573,030 | B1 | 6/2003 | Fairbairn et al. |
| 6,602,779 | B1 | 8/2003 | Li et al. |
| 6,632,741 | B1 | 10/2003 | Clevenger et al. |
| 6,667,237 | B1 | 12/2003 | Metzler |
| 6,673,684 | B1 | 1/2004 | Huang et al. |
| 6,686,245 | B1 | 2/2004 | Mather et al. |
| 6,689,695 | B1 | 2/2004 | Lui et al. |
| 6,706,571 | B1 | 3/2004 | Yu et al. |
| 6,709,807 | B2 | 3/2004 | Hallock et al. |
| 6,734,107 | B2 | 5/2004 | Lai et al. |
| 6,744,094 | B2 | 6/2004 | Forbes |
| 6,773,998 | B1 | 8/2004 | Fisher et al. |
| 6,794,699 | B2 | 9/2004 | Bissey et al. |
| 6,800,930 | B2 | 10/2004 | Jackson et al. |
| 6,867,116 | B1 | 3/2005 | Chung |
| 6,875,703 | B1 | 4/2005 | Furukawa et al. |
| 6,893,972 | B2 | 5/2005 | Rottstegge et al. |
| 6,962,867 | B2 | 11/2005 | Jackson et al. |
| 7,015,124 | B1 | 3/2006 | Fisher et al. |
| 7,074,668 | B1 | 7/2006 | Park et al. |
| 7,115,525 | B2 * | 10/2006 | Abatchev et al. ............ 438/725 |
| 7,183,597 | B2 | 2/2007 | Doyle |
| 7,208,379 | B2 | 4/2007 | Venugopal et al. |
| 7,291,560 | B2 | 11/2007 | Parascandola et al. |
| 2002/0042198 | A1 | 4/2002 | Bjarnason et al. |
| 2002/0045308 | A1 | 4/2002 | Juengling |
| 2002/0063110 | A1 | 5/2002 | Cantell et al. |
| 2002/0127810 | A1 | 9/2002 | Nakamura et al. |
| 2003/0006410 | A1 | 1/2003 | Doyle |
| 2003/0044722 | A1 | 3/2003 | Hsu et al. |
| 2003/0119307 | A1 | 6/2003 | Bekiaris et al. |
| 2003/0127426 | A1 | 7/2003 | Chang et al. |
| 2003/0157436 | A1 | 8/2003 | Manger et al. |
| 2003/0207207 | A1 | 11/2003 | Li |
| 2003/0207584 | A1 | 11/2003 | Sivakumar et al. |
| 2003/0230234 | A1 | 12/2003 | Nam et al. |
| 2004/0000534 | A1 | 1/2004 | Lipinski |
| 2004/0018738 | A1 | 1/2004 | Liu |
| 2004/0023475 | A1 | 2/2004 | Bonser et al. |
| 2004/0023502 | A1 | 2/2004 | Tzou et al. |
| 2004/0041189 | A1 | 3/2004 | Voshell et al. |
| 2004/0043623 | A1 | 3/2004 | Liu et al. |
| 2004/0053475 | A1 | 3/2004 | Sharma |
| 2004/0079988 | A1 | 4/2004 | Harari |
| 2004/0106257 | A1 | 6/2004 | Okamura et al. |
| 2004/0235255 | A1 | 11/2004 | Tanaka et al. |
| 2005/0074949 | A1 * | 4/2005 | Jung et al. .................. 438/424 |
| 2005/0164454 | A1 | 7/2005 | Leslie |
| 2005/0186705 | A1 | 8/2005 | Jackson et al. |
| 2005/0272259 | A1 | 12/2005 | Hong |
| 2006/0024945 | A1 | 2/2006 | Kim et al. |
| 2006/0046200 | A1 | 3/2006 | Abatchev et al. |
| 2006/0046201 | A1 | 3/2006 | Sandhu et al. |
| 2006/0046422 | A1 | 3/2006 | Tran et al. |
| 2006/0046484 | A1 | 3/2006 | Abatchev et al. |
| 2006/0083996 | A1 | 4/2006 | Kim |
| 2006/0172540 | A1 | 8/2006 | Marks et al. |
| 2006/0211260 | A1 | 9/2006 | Tran et al. |
| 2006/0216923 | A1 | 9/2006 | Tran et al. |
| 2006/0231900 | A1 | 10/2006 | Lee et al. |
| 2006/0250593 | A1 | 11/2006 | Nishi |
| 2006/0263699 | A1 | 11/2006 | Abatchev et al. |
| 2006/0267075 | A1 | 11/2006 | Sandhu et al. |
| 2006/0273456 | A1 | 12/2006 | Sant et al. |
| 2006/0281266 | A1 | 12/2006 | Wells |
| 2007/0026672 | A1 | 2/2007 | Tang et al. |
| 2007/0045712 | A1 | 3/2007 | Haller et al. |
| 2007/0048674 | A1 | 3/2007 | Wells |
| 2007/0049011 | A1 | 3/2007 | Tran |
| 2007/0049030 | A1 | 3/2007 | Sandhu et al. |
| 2007/0049032 | A1 | 3/2007 | Abatchev et al. |
| 2007/0049035 | A1 | 3/2007 | Tran |
| 2007/0049040 | A1 | 3/2007 | Bai et al. |
| 2007/0050748 | A1 | 3/2007 | Juengling |
| 2007/0210449 | A1 | 9/2007 | Caspary et al. |
| 2007/0215960 | A1 | 9/2007 | Zhu et al. |
| 2007/0275309 | A1 | 11/2007 | Liu |

FOREIGN PATENT DOCUMENTS

| | | |
|---|---|---|
| EP | 0227303 | 7/1987 |
| EP | 0491408 | 6/1992 |
| EP | 1357433 | 10/2003 |
| JP | 05343370 | 12/1993 |
| JP | H8-55908 | 2/1996 |
| JP | H8-55920 | 2/1996 |
| TW | 440924 | 6/2001 |
| TW | 462080 | 11/2001 |
| WO | WO 02/099864 A1 | 12/2002 |
| WO | WO 2004/001799 A2 | 12/2003 |
| WO | WO 2004/003977 | 1/2004 |
| WO | WO 2005/034215 A1 | 4/2005 |
| WO | WO 2006/026699 | 3/2006 |

OTHER PUBLICATIONS

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Chung et al., "Pattern multiplication method and the uniformity of nanoscale multiple lines," J.Vac.Sci.Technol. B21(4), Jul./Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

Joubert et al., "Nanometer scale linewidth control during etching of polysilicon gates in high-density plasmas," Microelectronic Engineering 69 (2003), pp. 350-357.

Oehrlein et al., "Pattern transfer into low dielectric materials by high-density plasma etching," Solid State Tech., May 2000, 8 pages.

"U.S. Appl. No. 11/543,515, filed Oct. 24, 2006, Ref. No. 2005-1173.00-US".

"Ex parte Cantell, unpublished decision of the Board of Patent Appeals and Interferences, Mar. 4, 2005".

"Sublithographic nanofabrication technology for nanocatalysts and DNA chips," J. Vac. Sci. Technol., Nov./Dec. 2003; pp. 2951-2955, Nov./Dec. 2003, Choi et al.

* cited by examiner

METHODS FOR FORMING ARRAYS OF SMALL, CLOSELY SPACED FEATURES

REFERENCE TO RELATED APPLICATIONS

This application is related to the following: U.S. patent application Ser. No. 10/932,993 (MICRON.293A) filed Sep. 1, 2004; U.S. patent application Ser. No. 10/934,778 (MICRON.294A) filed Sep. 2, 2004; U.S. patent application Ser. No. 10/931,771 (MICRON.295A) filed Aug. 31, 2004; U.S. patent application Ser. No. 10/934,317 (MICRON.296A) filed Sep. 2, 2004. Each of the above-mentioned references is hereby incorporated by reference in its entirety and hereby made part of this specification.

BACKGROUND OF THE INVENTION

1. Field of the Invention

The disclosed invention relates generally to integrated circuit fabrication, techniques for fabrication of computer memory, and masking techniques.

2. Description of the Related Art

As a consequence of many factors, including demand for increased portability, computing power, memory capacity and energy efficiency in modern electronics, integrated circuits are continuously being reduced in size. To facilitate this size reduction, research continues into ways of reducing the sizes of integrated circuits' constituent features. Examples of those constituent features include capacitors, electrical contacts, interconnecting lines, and other electrical devices. The trend of decreasing feature size is evident, for example, in memory circuits or devices such as dynamic random access memories (DRAMs), static random access memories (SRAMs), ferroelectric (FE) memories, electronically-erasable programmable read-only memories (EEPROMs), flash memories, etc.

Computer memory typically comprises millions of identical circuit elements, known as memory cells, arranged in a plurality of arrays with associated logic circuitry. Each memory cell traditionally stores one bit of information, although multi-level cell devices can store more than one bit per cell. In its most general form, a memory cell typically consists of two electrical devices: a storage capacitor and an access field effect transistor. Each memory cell is an addressable location that can store one bit (binary digit) of data. A bit can be written to a cell through the transistor and read by sensing charge on the storage electrode from the reference electrode side. One common type of computer memory that can benefit from higher density components is DRAM. By decreasing the sizes of constituent electrical devices, the conducting lines that connect them, and the conductive contacts carrying charge between them, the sizes of the memory devices incorporating these features can be decreased. Storage capacities and circuit speed can be increased by fitting more memory cells into the memory devices.

The demand for continual reduction in feature sizes places ever greater demands on techniques used to form the features. For example, photolithography is commonly used to pattern features on a substrate. The concept of pitch can be used to describe the size of these features. Pitch is the distance between identical points in two neighboring features. These features are typically defined by spaces between adjacent features, which spaces may be filled by a material, such as an insulator. As a result, pitch can be viewed as the sum of the width of a feature and of the width of the space separating that feature from a neighboring feature.

Certain photoresist materials only respond to certain wavelengths of light. One common range of wavelengths that can be used lies in the ultraviolet (UV) range. Because many photoresist materials respond selectively to particular wavelengths, photolithography techniques each have a minimum pitch below which that particular photolithographic technique cannot reliably form features. This minimum pitch is often determined by the wavelength of light that can be used with that technique. Thus, the minimum pitch of a photolithographic technique can limit feature size reduction.

Pitch multiplication (or pitch doubling) can extend the capabilities of photolithographic techniques to allow creation of more densely arranged features. Such a method is illustrated in FIGS. 1A-1F and described in U.S. Pat. No. 5,328,810, issued to Lowrey et al., the entire disclosure of which is incorporated herein by reference and made part of this specification. For convenience, the method will also be briefly outlined here.

With reference to FIG. 1A, photolithography is first used to form a pattern of lines 10 in a photoresist layer overlying a layer 20 of an expendable material and a substrate 30. The layers shown in FIG. 1 are all shown schematically in cross-section. As shown in FIG. 1B, the pattern is then transferred by an etch step (preferably anisotropic) to the layer 20, forming placeholders, or mandrels, 40. If the etch is anisotropic, the mandrels have approximately vertical sides, as shown. The photoresist lines 10 can be stripped and the mandrels 40 can be isotropically etched to increase the distance between neighboring mandrels 40, as shown in FIG. 1C. This isotropic etch (or shrink step) can alternatively be performed on the resist prior to transfer. A layer 50 of spacer material is subsequently deposited over the mandrels 40, as shown in FIG. 1D. Spacers 60, i.e., material extending or originally formed extending from sidewalls of another material, are then formed on the sides of the mandrels 40 by preferentially etching the spacer material from the horizontal surfaces 70 and 80 in a directional (or anisotropic) spacer etch. Such spacers are shown in FIG. 1E. The remaining mandrels 40 are then removed, leaving behind only the spacers 60 above substrate 30. The spacers 60 together act as a mask for patterning, as shown in FIG. 1F. Thus, where a given pitch formerly included a pattern defining one feature and one space, the same width now includes two features and two spaces defined by the spacers 60. As a result, the smallest feature size possible with a photolithographic technique is effectively decreased by this "pitch-multiplication" technique.

While the pitch is actually halved in the example above, this reduction in pitch is conventionally referred to as pitch "doubling," or, more generally, pitch "multiplication." That is, conventionally "multiplication" of pitch by a certain factor actually involves reducing the pitch by that factor. In fact, "pitch multiplication" increases the density of features by reducing pitch. Pitch thus has at least two meanings: the linear spacing between identical features in a repeating pattern; and the density or number of features per linear distance. The conventional terminology is retained herein.

The critical dimension (CD) of a mask scheme or circuit design is the scheme's minimum feature dimension, or the measurement of the smallest width of the smallest feature that exists in that design or scheme. Due to factors such as geometric complexity and different requirements for critical dimensions in different parts of an integrated circuit, typically not all features of the integrated circuit will be pitch multiplied. Furthermore, pitch multiplication entails many additional steps relative to conventional lithography; the additional steps can involve considerable additional expense. Pitch multiplication often provides less control over the resulting features than that provided by direct patterning without pitch multiplication, because the spacer pattern merely follows the outlines of the directly patterned features. Thus, pitch multiplication is typically thought useful only for regularly spaced lines, such as conductive lines for a memory array. On the other hand, typical micromasking techniques, such as isotropic shrink steps, can result in a reduction in feature size but no corresponding increase in feature density. There have also been challenges in transferring very fine patterns to underlying layers because existing techniques do not adequately maintain resolution and fidelity through the transfer. There is a need for methods that can allow for smaller and more efficient operative units on an integrated circuit; such methods will advantageously increase feature density and decrease chip size.

Thus, there is a need for a reduction in the size of integrated circuits and an increased operable density of the arrays of electrical devices on computer chips. Accordingly, a need exists for improved methods of forming small features; improved methods for increasing feature density; methods that will produce more efficient arrays; and techniques that will provide more compact arrays without harming feature resolution.

SUMMARY OF THE INVENTION

In some embodiments, the invention comprises a method of forming isolated features in an integrated circuit. The method can comprise providing a substrate overlaid by multiple layers of masking material and creating a first series of selectively definable lines in a first layer of masking material. The method can further comprise reducing the pitch of the first series of selectively definable lines using a spacer material to create a first arrangement of masking features having a smaller pitch than the first series of selectively definable lines. The first arrangement of masking features can comprise pitch-reduced masking lines separated by pitch-reduced spaces and can correspond to a first pattern. The method can further comprise creating a second series of selectively definable lines in a second layer of masking material, where the second series of selectively definable lines is not parallel to the first series of selectively definable lines. The method can further comprise reducing the pitch of the second series of selectively definable lines using a spacer material to create a second arrangement of masking features having a smaller pitch than the second series of selectively definable lines. The second arrangement of masking features can comprise pitch-reduced masking lines separated by pitch-reduced spaces and can correspond to a second pattern. The method can further comprise etching the substrate in a third pattern derived by superimposing the first and second patterns to create isolated features.

In some embodiments, the invention comprises a method for forming features in an array. The method can comprise reducing the pitch of a column of first photodefinable lines to form a column pattern. The method can also comprise reducing the pitch of a row of second photodefinable lines to form a row pattern that crosses the column pattern. The row pattern can have row lines and row spaces. The row lines can mask off unexposed portions of the underlying column pattern, and the row spaces can leave exposed portions of the underlying column pattern. The method can further comprise removing at least some of the exposed portions of the column pattern to define a combined mask layer.

In some embodiments, the invention comprises a mask pattern for an integrated circuit. The mask pattern can comprise a first series of elongate masking lines and a second series of elongate masking lines that intersects the first series of elongate masking lines. In the mask pattern, each series of lines can have a pitch that is smaller than the pitch achievable through photolithography.

In some embodiments, the invention comprises an arrangement of isolated features formed as part of an integrated circuit manufacturing process. The arrangement can have a first row of elongate features formed from spacer material and a second row of elongate features formed from spacer material. The elongate features in the second row can cross the elongate features in the first row such that each elongate feature in one row crosses multiple elongate features in the other row.

In some embodiments, the invention comprises an arrangement of isolated features in an integrated circuit. The arrangement can have regularly-spaced features having a first width of less than 60 nanometers and a first length of no more than 10 times the first width. Furthermore, the spaces between features can have a second width of less than 60 nanometers.

In some embodiments, the invention comprises a method of forming a feature array for an integrated circuit. The method can include forming a first, pitch-multiplied feature array in a first mask layer, the features being elongate with an axis of elongation. The first feature array can have a first pattern. The method can further include forming a second, pitch-multiplied feature array in a second mask layer, the second pitch-multiplied feature array having elongate features with an axis of elongation that is not parallel to the axis of the elongate features of the first feature array. The second feature array can have a second pattern. The method can further include consolidating the first and second patterns into a combined third pattern, the third pattern corresponding to an arrangement of features in a single vertical level of the integrated circuit.

In some embodiments, the invention comprises a system for processing information in electrical format. The system can include at least one electrical circuit. The system can further include densely-spaced features in a repeating pattern, formed in a layer of material in the electrical circuit. Each feature can have a first width of less than 60 nanometers and a first length of less than 10 times the first width. Furthermore, each feature can be spaced apart from adjacent features by less than 120 nanometers.

BRIEF DESCRIPTION OF THE DRAWINGS

The invention will be better understood from the Detailed Description of the Preferred Embodiments and from the appended drawings, which are meant to illustrate and not to limit the invention, and wherein:

FIG. 10A shows a schematic plan view of the surface. FIG. 10B shows a schematic cross-sectional side view taken along lines 10B-10B of FIG. 10A. FIG. 10C shows a schematic, cross-sectional side view taken along lines 10C-10C of FIG. 10B. FIG. 10D shows a schematic, cross-sectional side view taken along lines 10D-10D of FIG. 10B.

FIG. 11A shows a schematic plan view of the surface. FIG. 11B shows a schematic cross-sectional side view taken along lines 11B-11B of FIG. 11A. FIG. 11C shows a schematic, cross-sectional side view taken along lines 11C-11C of FIG. 11B. FIG. 11D shows a schematic, cross-sectional side view taken along lines 11D-11D of FIG. 11B.

FIG. 12A shows a schematic plan view of the surface. FIG. 12B shows a schematic cross-sectional side view taken along lines 12B-12B of FIG. 12A. FIG. 12C shows a schematic, cross-sectional side view taken along lines 12C-12C of FIG. 12B. FIG. 12D shows a schematic, cross-sectional side view taken along lines 12D-12D of FIG. 12B.

FIG. 13A shows a schematic plan view of the surface. FIG. 13B shows a schematic cross-sectional side view taken along lines 13B-13B of FIG. 13A. FIG. 13C shows a schematic, cross-sectional side view taken along lines 13C-13C of FIG. 13B. FIG. 13D shows a schematic, cross-sectional side view taken along lines 13D-13D of FIG. 13B.

FIG. 14A shows a schematic plan view of the surface. FIG. 14B shows a schematic cross-sectional side view taken along lines 14B-14B of FIG. 14A. FIG. 14C shows a schematic, cross-sectional side view taken along lines 14C-14C of FIG. 14B. FIG. 14D shows a schematic, cross-sectional side view taken along lines 14D-14D of FIG. 14B.

FIG. 15A shows a schematic plan view of the surface. FIG. 15B shows a schematic cross-sectional side view taken along lines 15B-15B of FIG. 15A. FIG. 15C shows a schematic, cross-sectional side view taken along lines 15C-15C of FIG. 15B. FIG. 15D shows a schematic, cross-sectional side view taken along lines 15D-15D of FIG. 15B.

FIG. 16A shows a schematic plan view of the surface. FIG. 16B shows a schematic cross-sectional side view taken along lines 16B-16B of FIG. 16A. FIG. 16C shows a schematic cross-sectional side view taken along lines 16C-16C of FIG. 16B. FIG. 16D shows a schematic, cross-sectional side view taken along lines 16D-16D of FIG. 16B.

FIG. 17A shows a schematic plan view of the surface. FIG. 17B shows a schematic cross-sectional side view taken along lines 17B-17B of FIG. 17A. FIG. 17C shows a schematic, cross-sectional side view taken along lines 17C-17C of FIG. 17B. FIG. 17D shows a schematic, cross-sectional side view taken along lines 17D-17D of FIG. 17B.

FIGS. 18-20 illustrate a process flow that can be used in conjunction with the structure of FIG. 17 to create a mask grid with small holes that are densely spaced in an advantageous manner.

FIG. 18A shows a schematic plan view of the surface. FIG. 18B shows a schematic cross-sectional side view taken along lines 18B-18B of FIG. 18A. FIG. 18C shows a schematic, cross-sectional side view taken along lines 18C-18C of FIGS. 18A and 18B. FIG. 18D shows a schematic, cross-sectional side view taken along lines 18D-18D of FIGS. 18A and 18B. FIG. 18E shows a schematic, cross-sectional side view taken along line 18E-18E of FIG. 18A.

FIG. 19A shows a schematic plan view of the surface. FIG. 19B shows a schematic cross-sectional side view taken along lines 19B-19B of FIG. 19A. FIG. 19D shows a schematic, cross-sectional side view taken along lines 19D-19D of FIG. 19B.

FIGS. 20A-20D show the structure of FIG. 19 after overlying layers have been stripped to leave a pattern of holes in the lower temporary or mask (e.g., amorphous carbon) layer. FIG. 20A shows a schematic plan view of the surface. FIG. 20B shows a schematic cross-sectional side view taken along lines 20B-20B of FIG. 20A. FIG. 20C shows a schematic, cross-sectional side view taken along lines 20C-20C of FIG. 20A. FIG. 20D shows a schematic, cross-sectional side view taken along lines 20D-20D of FIG. 20A.

FIGS. 22-25 illustrate a process flow that can be used in conjunction with the structure of FIG. 17 to create small mask pillars that are densely packed in an advantageous manner.

FIG. 22A shows a schematic plan view of the surface. FIG. 22B shows a schematic cross-sectional side view taken along lines 22B-22B of FIG. 22A. FIG. 22C shows a schematic, cross-sectional side view taken along lines 22C-22C of FIGS. 22A and 22B. FIG. 22D shows a schematic, cross-sectional side view taken along lines 22D-22D of FIGS. 22A and 22B. FIG. 22E shows a schematic, cross-sectional side view taken along line 22E-22E of FIG. 22A.

FIGS. 23A-23D show the structure of FIG. 22 after a selective etch, (e.g., a silicon dioxide etch) has etched down portions of exposed materials in FIG. 22 to expose portions of an underlying mask or temporary layer. In the illustrated embodiment, the underlying temporary layer is amorphous carbon. The selective etch has not removed islands of one of the stripe materials (e.g., silicon) that remain in place over the temporary layer. FIG. 23A shows a schematic plan view of the surface. FIG. 23B shows a schematic cross-sectional side view taken along lines 23B-23B of FIG. 23A.

FIGS. 26-27 illustrate an alternative process flow that can be used in conjunction with the structure of FIG. 17 to create small mask pillars, posts or islands that are densely and/or evenly spaced in an advantageous manner.

FIG. 26A shows a schematic plan view of the surface. FIG. 26B shows a schematic cross-sectional side view taken along lines 26B-26B of FIG. 26A. FIG. 26C shows a schematic, cross-sectional side view taken along lines 26C-26C of FIG. 26B. FIG. 26D shows a schematic, cross-sectional side view taken along lines 26D-26D of FIG. 26B.

FIG. 27A shows a schematic plan view of the surface. FIG. 27B shows a schematic cross-sectional side view taken along lines 27B-27B of FIG. 27A. FIG. 27C shows a schematic, cross-sectional side view taken along lines 27C-27C of FIG. 27B. FIG. 27D shows a schematic, cross-sectional side view taken along lines 27D-27D of FIG. 27B.

FIG. 30*b* illustrates a cross section of FIG. 30*a* in one dimension, and FIG. 30*c* illustrates a cross section of FIG. 30*a* in an approximately perpendicular dimension.

FIGS. 32A-33B are SEMs of an array of small, dense pillars or posts in accordance with the disclosed embodiments.

DETAILED DESCRIPTION OF THE PREFERRED EMBODIMENT

Figure 1A:
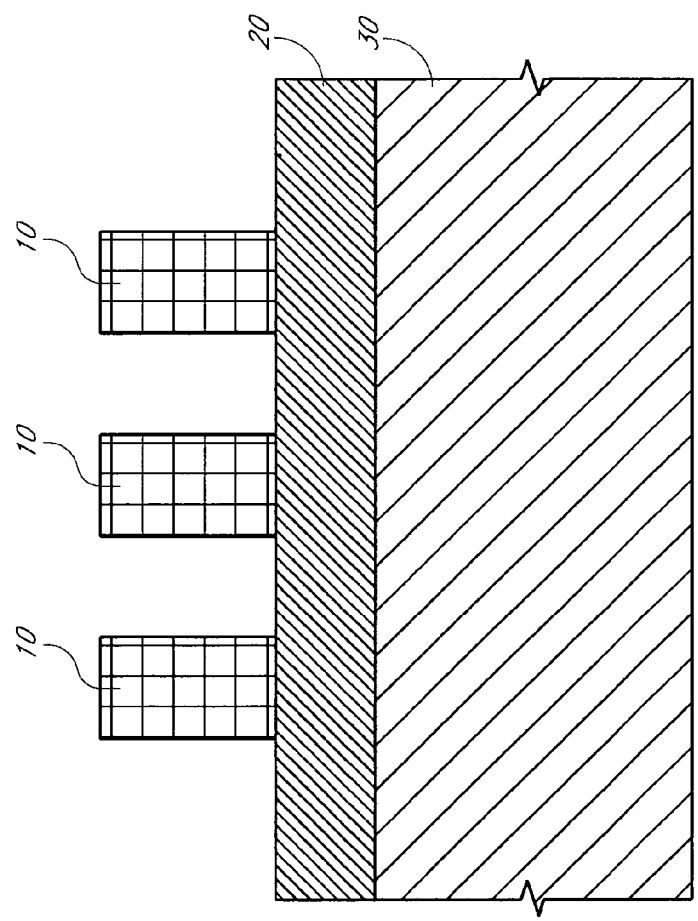
FIGS. 1A-1F are schematic, cross-sectional side views of mask lines, formed in accordance with a prior art pitch-multiplication method as described above.
Figure 1B:
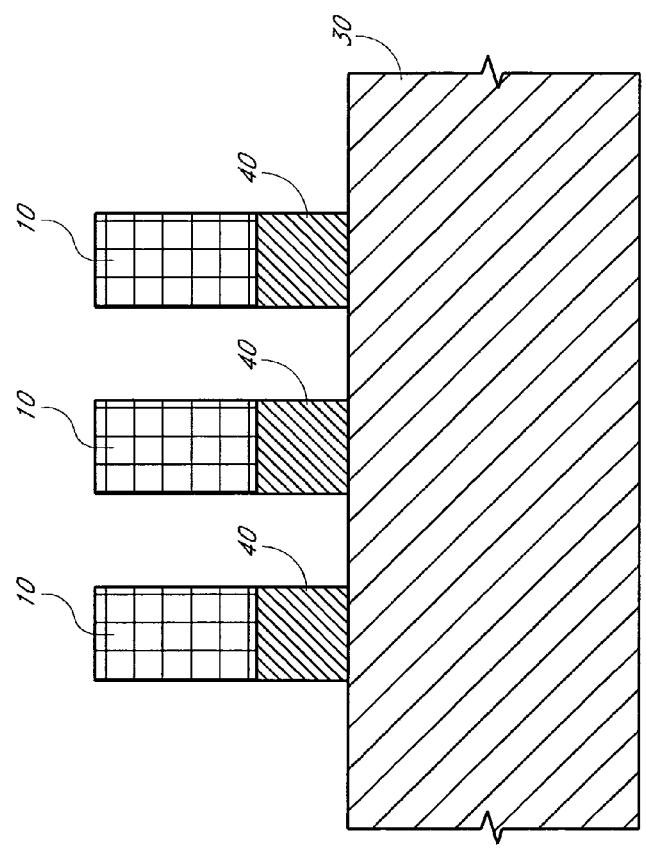
Figure 1C:
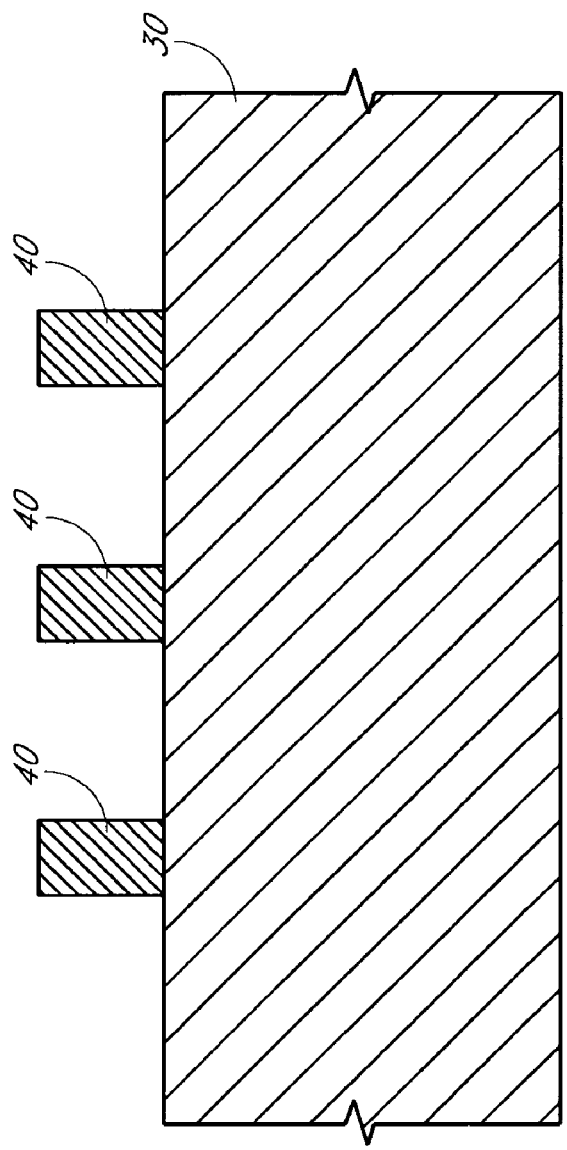
Figure 1D:
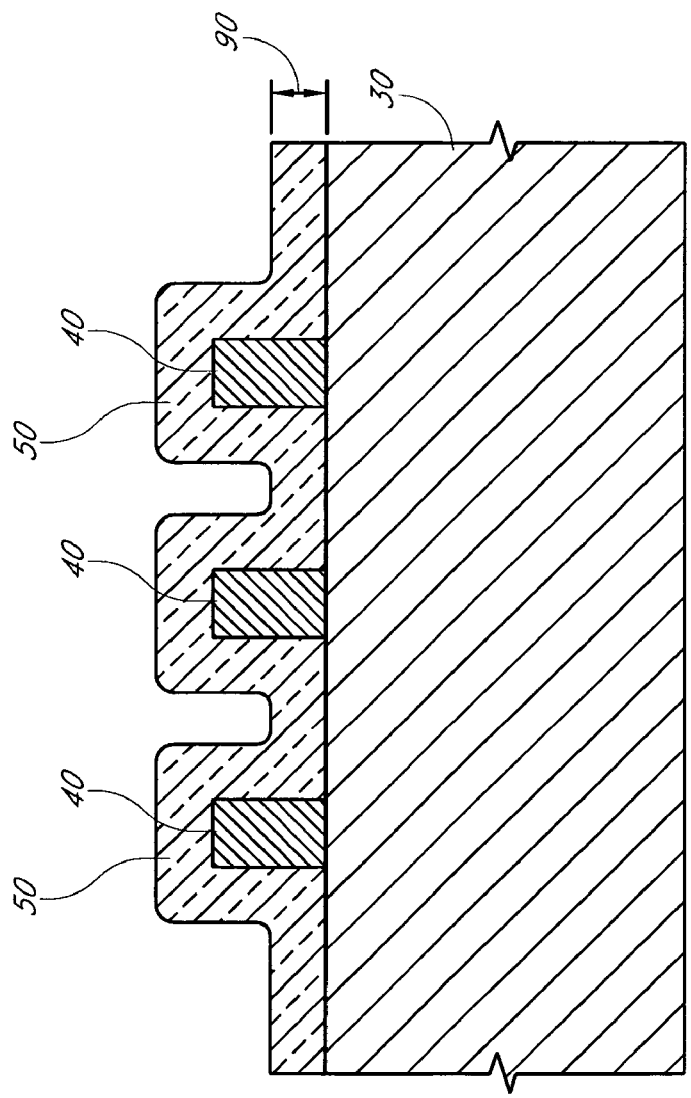
Figure 1E:
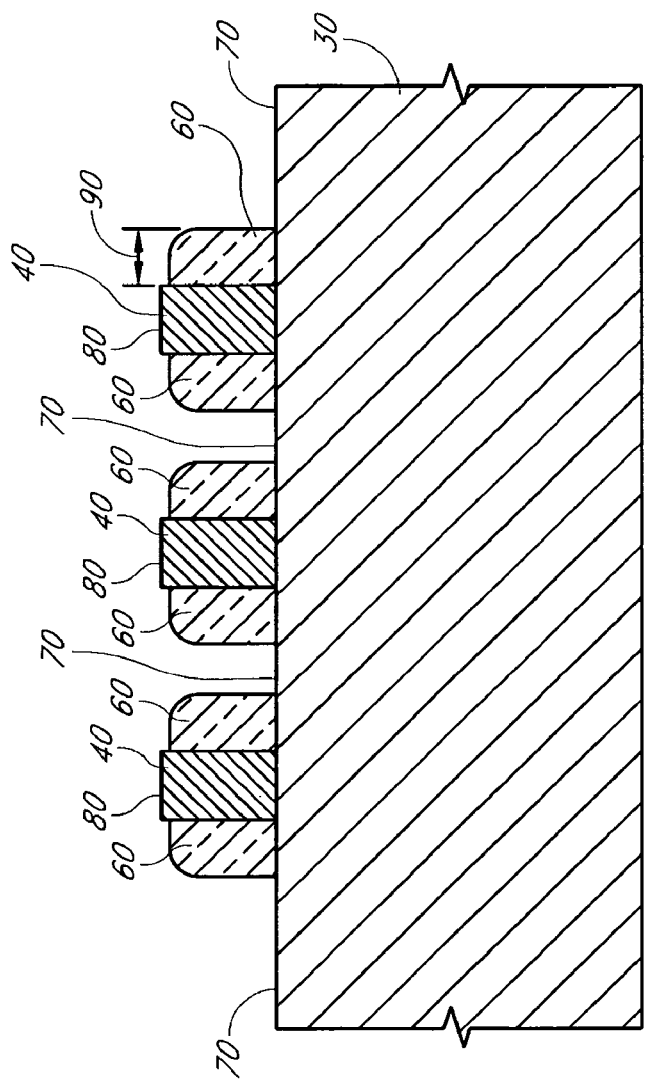
Figure 1F:
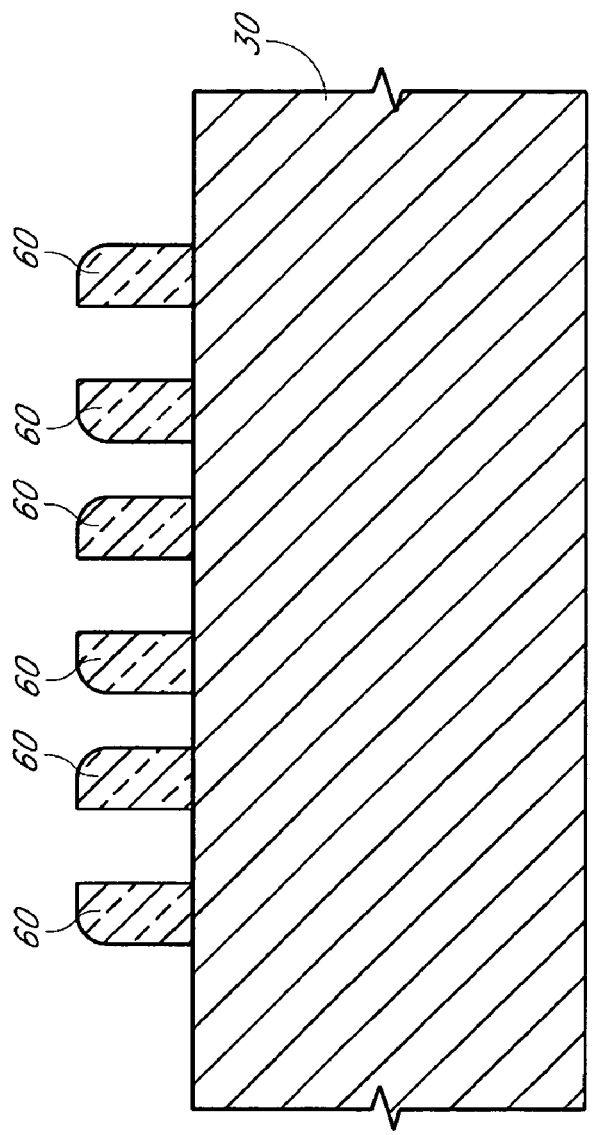
Figure 2:
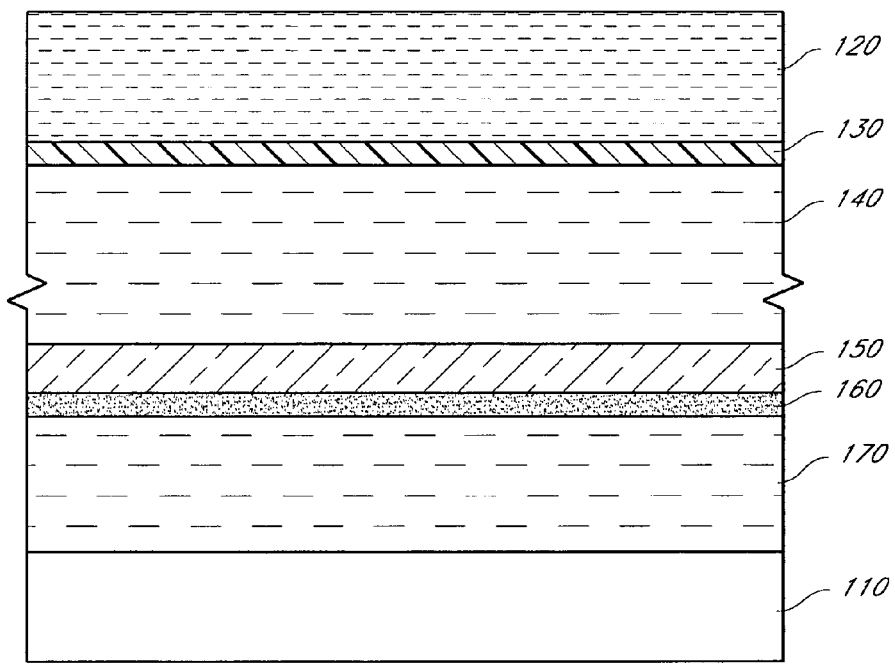
FIG. 2 is a schematic, cross-sectional side view of masking and substrate layers used to form an integrated circuit.

With reference to FIG. 2, a partially formed integrated circuit 100 is provided. A substrate 110 is provided below various masking layers 120-170. The layers 120-170 can be etched to form masks for patterning underlying layers or substrate 110. These masks can be used to form various features, as discussed below. The features can comprise portions of any of the following: one or multiple transistors, diodes, capacitors, conductive lines, gates, sources, drains, or contacts to any of the above. These components can comprise portions of DRAM or flash memory arrays, NOR logic arrays, NAND logic arrays, etc. In some embodiments, the features are formed from a substrate material that comprises a semi-conducting material. For example, the semi-conducting material can be silicon, silicon-germanium compounds, or III-V materials.

As used in this specification, the term "substrate" can refer not only to the substrate layer 110, but also to any layer that underlies another layer. The term "substrate" can also describe a layer or layers that have features or structures formed within them as a result of a semiconductor process (e.g., etching, doping, depositing, etc.) controlled by overlying masking layers.

As used in this specification, the term "pattern" can refer to an array or series of shapes that would be visible on a surface if viewed from above. A pattern can refer to the ensemble of shapes that correspond to a cross-section or shadow of features formed in one or multiple layers. The pattern is generally not the features themselves, but rather the design corresponding to the sizes and arrangement of the features. A pattern can be defined by a combination of patterns derived from multiple overlying or side by side layers. A pattern can originate in one layer, such as a photodefinable layer, and then be transferred to another layer, such as a temporary layer or a hard mask layer. The pattern is said to be transferred to lower layers even if feature sizes and spacings are altered (e.g., by the feature shrink step noted above). In contrast, a new pattern can be defined by pitch multiplication, whereby two or more features in the second pattern replace one feature of the first pattern.

A pattern in one layer can be derived from one or more patterns in another previous or overlying layer. A pattern can be said to be derived from another pattern even if the features in the resulting layer do not exactly resemble those features which gave rise to the original pattern, but rather the underlying pattern generally follows the outline of the overlying pattern with minor deviations in dimensions. The term "to pattern" can also be used as a verb and means to create or form a pattern.

An arrangement of features formed in a particular layer can give rise to a pattern. An array can also give rise to a pattern. An array is a collection of electrical components or features, formed in a repeating configuration, that can span multiple layers of an integrated circuit. As described above, multiple cells can form a memory array for a DRAM or NAND flash memory circuit, for example, or a logic array.

The materials for the layers 120-170 overlying the substrate 110 are preferably chosen based upon consideration of the chemistry and process conditions for the various pattern forming and pattern transferring steps discussed herein. Because the layers between a topmost selectively definable layer 120—which preferably is definable by a lithographic process—and the substrate 110 will preferably function to transfer a pattern derived from the selectively definable layer 120 to the substrate 110, the layers between the selectively definable layer 120 and the substrate 110 are preferably chosen so that they can be selectively etched relative to other exposed materials. A material is considered selectively, or preferentially, etched when the etch rate for that material is at least about two times greater, preferably about ten times greater and, most preferably, at least about forty times greater than that for surrounding materials.

In the illustrated embodiment of FIG. 2, the selectively definable layer 120 overlies a first hard mask, or etch stop, layer 130, which overlies a first temporary layer 140, which overlies a second temporary layer 150, which overlies a second hard mask, or etch stop, layer 160, which overlies a third temporary layer 170 to be processed (e.g., etched) through a mask, which overlies the substrate layer 110. In the illustrated embodiments, the third temporary layer 170 will serve as the ultimate mask through which etching (or other processing) will be performed. In some embodiments, amorphous carbon is a preferred material for the third temporary layer because so many other materials-silicon, silicon oxide, silicon nitride, etc.—can be selectively etched without significantly harming the carbon layer. For the illustrated embodiments, the substrate 110 may comprise an interlevel dielectric (ILD) layer through which contacts are to be formed.

In common methods of transferring patterns, both the mask and the underlying substrate are exposed to an etchant, which preferentially etches away the substrate material. The etchants, however, can also wear away the mask materials, albeit at a slower rate. Thus, over the course of transferring a pattern, the mask can be worn away by the etchant before the pattern transfer is complete. These difficulties are exacerbated where the substrate 110 comprises multiple different materials to be etched. In such cases, additional mask layers (not shown) may be used to prevent the mask pattern from being worn away before the pattern transfer is complete.

Because the various layers are chosen based upon the requirements of chemistry and process conditions, one or more of the layers can be omitted in some embodiments. In the illustrated embodiments, hard mask layers 130 and 160 advantageously play a protective role, protecting underlying layers from unwanted degradation during etching of overlying layers. Similarly, for a particularly simple substrate 110, various other layers, such as the second hard mask layer 160 itself, may be omitted and overlying mask layers may be sufficient for the desired pattern transfer. Higher numbers of mask layers are advantageous for transferring patterns to difficult to etch substrates, such as a substrate comprising multiple materials or multiple layers of materials, or for forming small and high aspect ratio features.

With reference to FIG. 2, the selectively definable layer 120 is preferably formed of a photoresist, including any photoresist known in the art. For example, the photoresist can be any photoresist compatible with 13.7 nanometer (nm), 157 nm, 193 nm, 248 nm or 365 nm wavelength systems, 193 nm wavelength immersion systems or electron beam lithographic systems. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the layer 120 and any subsequent resist layers can be formed of a resist that can be patterned by nano-imprint lithography, e.g., by using a mold or mechanical force to pattern the resist.

Photoresist is typically patterned by being exposed to radiation through a reticle and then developed. In the case of negative photoresist, radiation, e.g., light, is focused on parts of the photoresist that are to be retained, e.g., on the areas where the lines—such as lines 124 (see FIG. 3)—are to be formed. Typically, the radiation activates a photosensitive compound, e.g., a photo-induced acid generator (PAG), which decreases the solubility of the photoresist, e.g., by causing it to polymerize. Preferred embodiments may be applied using any definable material, including positive or negative photoresist. A preferred reticle used in testing of some embodiments is T37Z 46/47reticle.

The material for the first hard mask layer 130 preferably comprises an inorganic material, and exemplary materials include silicon dioxide ($SiO_2$), silicon, or a dielectric anti-reflective coating (DARC), such as a silicon-rich silicon oxynitride. In the illustrated embodiment, the first hard mask layer 130 is a dielectric anti-reflective coating (DARC). Thus, hard mask layer 130 can serve both as an intermediate hard mask and to reduce reflections during lithography. Using DARC material for the first hard mask layer 130 can be particularly advantageous for forming patterns having pitches near the resolution limits of a photolithographic technique. The DARC can enhance resolution by minimizing light reflections, thus increasing the precision with which photolithography can define the edges of a pattern. Optionally, an organic bottom anti-reflective coating (BARC) (not shown) can similarly be used in addition to or in place of the first hard mask layer 130 to control light reflections.

The first temporary layer 140 is preferably formed of amorphous carbon, which offers very high etch selectivity relative to the preferred hard mask materials. More preferably, the amorphous carbon is a form of transparent carbon that is highly transparent to light and which offers further improvements for photo alignment by being transparent to wavelengths of light used for such alignment. Deposition techniques for forming a highly transparent carbon can be found in A. Helmbold, D. Meissner, Thin Solid Films, 283 (1996) 196-203, the entire disclosure of which is incorporated herein by reference and made part of this specification.

The second temporary layer 150 is preferably formed of amorphous silicon. The benefits of using amorphous silicon will become apparent in the context of the various etching and pattern transfer steps described below. Amorphous silicon can be selectively etched while other adjacent materials (such as oxide layers) remain intact.

The second hard mask, or etch stop layer 160 preferably comprises silicon dioxide ($SiO_2$), silicon, or a dielectric anti-reflective coating (DARC), such as a silicon-rich silicon oxynitride, or aluminum oxide ($Al_2O_3$). In the illustrated embodiment, the first hard mask layer 160 is a DARC.

The third temporary layer 170 is preferably formed of amorphous carbon, which has excellent etch selectivity relative to many materials. Benefits of amorphous carbon are further discussed above with respect to the first temporary layer 140.

The substrate can be a silicon wafer used for formation of integrated circuits. Various substrate materials can be used.

In addition to selecting appropriate materials for the various layers, the thicknesses of the layers 120-170 are preferably chosen depending upon compatibility with the etch chemistries and process conditions described herein. For example, when transferring a pattern from an overlying layer to an underlying layer by selectively etching the underlying layer, materials from both layers are removed to some degree. Thus, the upper layer is preferably thick enough so that it is not worn away over the course of the pattern transfer. The hard mask layers are advantageously thin so that their transfer or removal can occur quickly, exposing surrounding materials to less wear.

In the illustrated embodiment, the selectively definable layer 120 (e.g., photoresist) is a photodefinable layer preferably between about 100-250 nm thick and, more preferably, between about 130-200 nm thick. The first hard mask layer 130 (e.g., $SiO_2$ or DARC) is preferably between about 10-30 nm thick and, more preferably, between about 15-25 nm thick. The first temporary layer 140 (e.g., amorphous carbon) is preferably between about 100-200 nm thick and, more preferably, between about 120-150 nm thick. The second temporary layer 150 (e.g., amorphous silicon) is preferably between about 30-50 nm thick and, more preferably, between about 35-45 nm thick. The second hard mask layer 160 (e.g., $SiO_2$ or DARC) is preferably between about 10-30 nm thick and, more preferably, about 15 nm thick. The third temporary layer 170 (e.g., amorphous carbon) is preferably between about 100-300 nm thick and, more preferably, between about 150-250 nm thick.

The various layers discussed herein can be formed by various methods known to those of skill in the art. For example, various vapor deposition processes, such as chemical vapor deposition, can be used to form the various mask layers under the resist. Preferably, a low temperature chemical vapor deposition process is used to deposit the hard mask layers or any other materials, e.g., spacer material, over carbon. Such low temperature deposition processes advantageously prevent chemical or physical disruption of the underlying amorphous carbon layer. Spin-on-coating processes can be used to form photodefinable layers. In addition, amorphous carbon layers can be formed by chemical vapor deposition using a hydrocarbon compound, or mixtures of such compounds, as carbon precursors. Exemplary precursors include propylene, propyne, propane, butane, butylene, butadiene and acetylene. A suitable method for forming amorphous carbon layers is described in U.S. Pat. No. 6,573,030 B1, issued to Fairbairn et al. on Jun. 3, 2003, the entire disclosure of which is incorporated herein by reference and made part of this specification. In addition, the amorphous carbon may be doped. A suitable method for forming doped amorphous carbon is described in U.S. patent application Ser. No. 10/652,174 to Yin et al., the entire disclosure of which is incorporated herein by reference and made part of this specification.

First Phase

In a first phase of methods in accordance with the preferred embodiments and with reference to FIGS. 2-10, a pattern of spacers is formed by pitch multiplication and used to create an underlying striped structure (see FIG. 10) for subsequent method steps. One example of an etch sequence for this phase is the following: 1) deposition of multiple layers; 2) photolithographic patterning of a first layer; 3) shrinking of features; 4) extension of pattern into underlying layers; 5) removal of remaining portions of overlying layers; 6) blanket deposition of spacer material; 7) spacer etch; 8) removal of spacer mandrels; 9) extension of spacer pattern into underlying material; 10) blanket deposition of a filler material; 11) removal of spacers; and 12) planarization.

Figure 3:
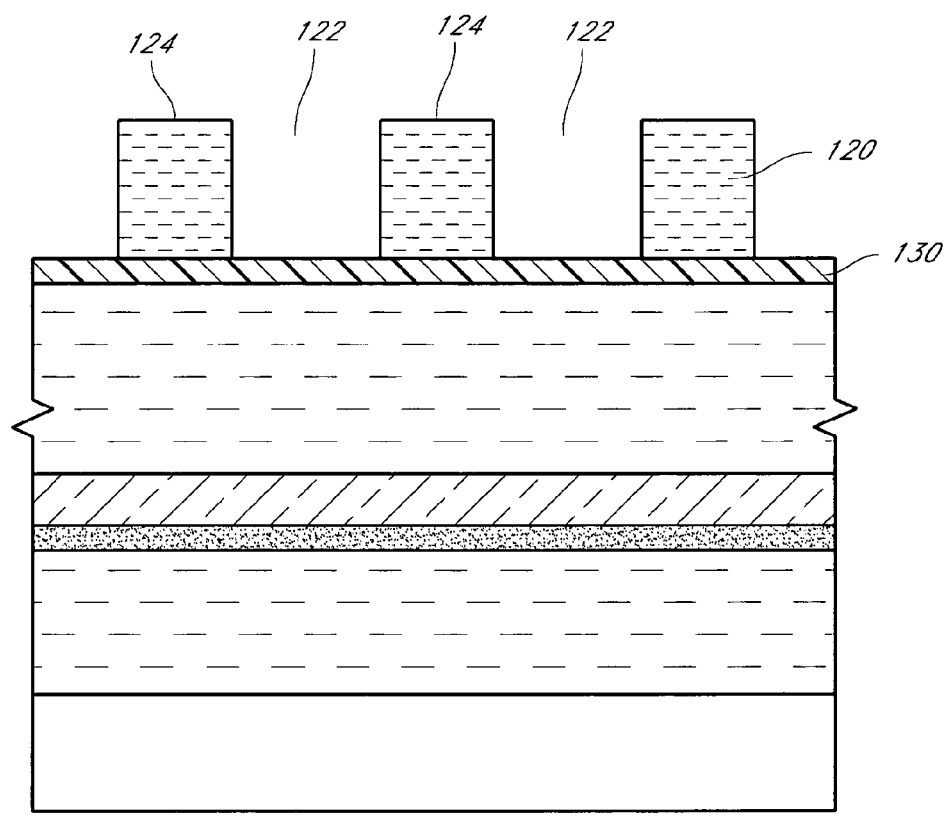
FIG. 3 shows the structure of FIG. 2 after photolithographic patterning of a first resist layer.

With reference to FIG. 3, a pattern comprising gaps or spaces 122 delimited by definable material features 124 is formed in the definable layer 120. The spaces 122 can be formed by, e.g., photolithography, in which the selectively definable layer 120 is exposed to radiation through a reticle and then developed. After being developed, the remaining definable material, photoresist in the illustrated embodiment, forms mask features such as the illustrated lines 124 (shown in cross-section).

The pitch of the lines 124 is equal to the sum of the width of a line 124 and the width of a neighboring space 122. To minimize the critical dimensions of features formed using this pattern of lines 124 and spaces 122, the pitch is preferably at or near the limits of the photolithographic technique used to pattern the definable layer 120. For example, for photolithography utilizing 248 nm light, the pitch of the lines 124 can be about 200 nm. Thus, the pitch may be at the minimum pitch of the photolithographic technique and the spacer pattern discussed below can advantageously have a pitch below the minimum pitch of the photolithographic technique.

As illustrated by FIG. 3, a preliminary step can comprise creating a series of photoresist lines 124. Thus, photolithography can be used to form a plurality of lines in a mask material. Conventional photolithography can form lines having a pitch no smaller than that definable by photons. However, subsequent pitch multiplication can form lines having a pitch that is smaller than that definable by conventional photolithography.

Figure 4:
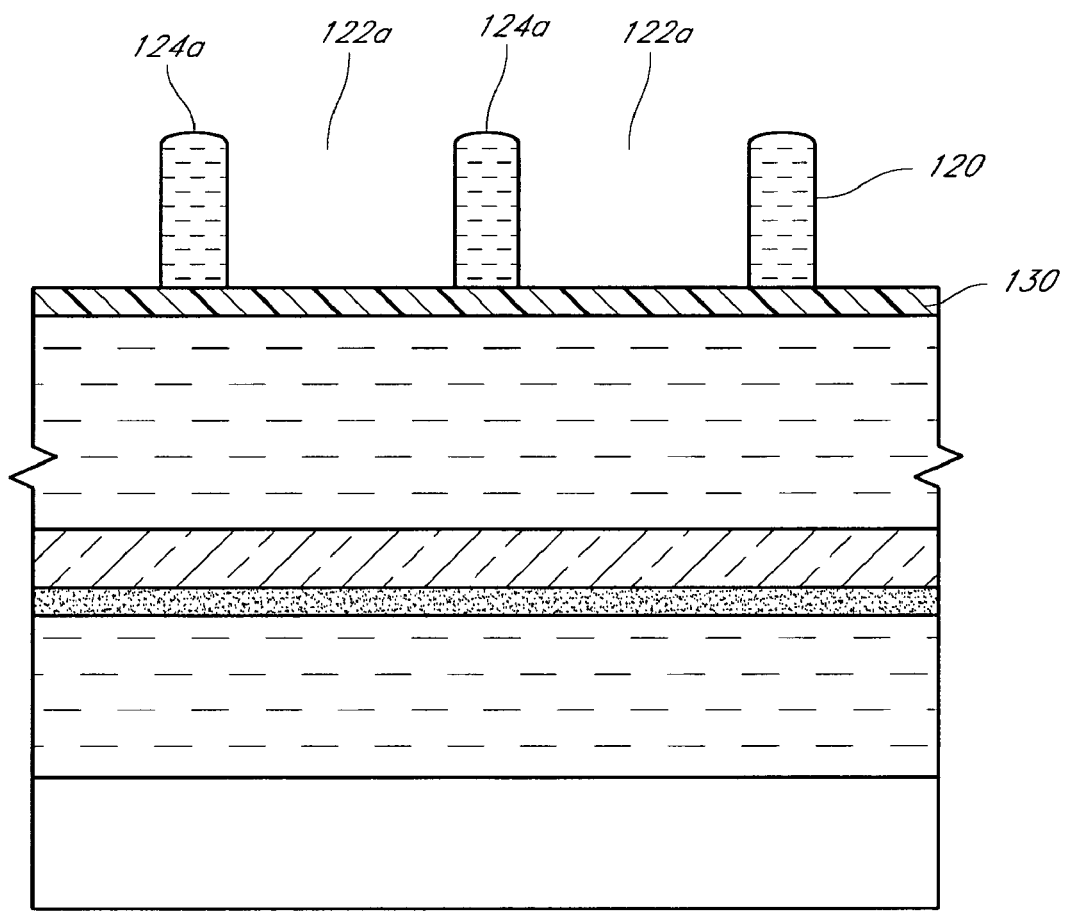
FIG. 4 shows the structure of FIG. 3 after an etch has reduced the size of the features in the pattern of FIG. 3.
Figure 6:
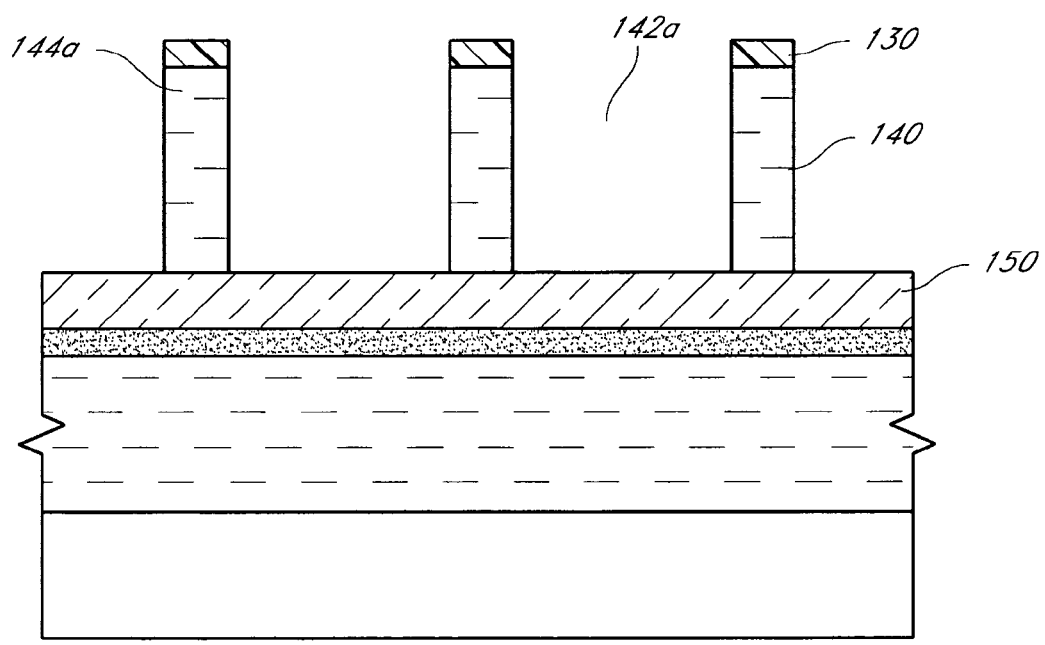
FIG. 6 shows the structure of FIG. 5 after overlying layers have been stripped.

FIG. 4 shows the structure of FIG. 3 after the lines 124 have been shrunk by an isotropic etch to create modified lines 124a. The spaces 122 can optionally be widened or narrowed to a desired dimension. For example, as illustrated in FIG. 6, the spaces 122 have been widened by etching the photoresist lines 124, to form modified spaces 122a and modified lines 124a. The photoresist lines 124 are preferably reduced in size using an isotropic etch, such as a sulfur oxide plasma, e.g., a plasma comprising $SO_2$, $O_2$, $N_2$ and Ar, or any other suitable plasma. Two other plasmas that can be used, for example, are an $HBr/O_2$ plasma or a $Cl_2/O_2$ plasma. The isotropic etch degrades the exposed surfaces from all directions. Thus, the corners of lines 124a have been depicted as slightly rounded in FIG. 4. The extent of the etch is preferably selected so that the widths of the lines 124a are substantially equal to the desired spacing between the later-formed spacers 182, as will be appreciated from the discussion of FIGS. 7-8. Advantageously, this etch allows the lines 124a to be narrower than would otherwise be possible using the photolithographic technique used to pattern the photodefinable layer 120. That is, if the lines 124 are at or near the resolution limit of the photolithographic technique, this etch can reduce their size even further, taking them below that resolution limit. In addition, the etch can smooth the edges of the lines 124a, thus improving the uniformity of those lines.

In some embodiments, the spaces 122a between the lines 124a can be narrowed by expanding the lines 124 to a desired size. For example, additional material (not shown) can be deposited over the lines 124, or the lines 124 can be chemically reacted to form a material (not shown) having a larger volume to increase their size.

Figure 7:
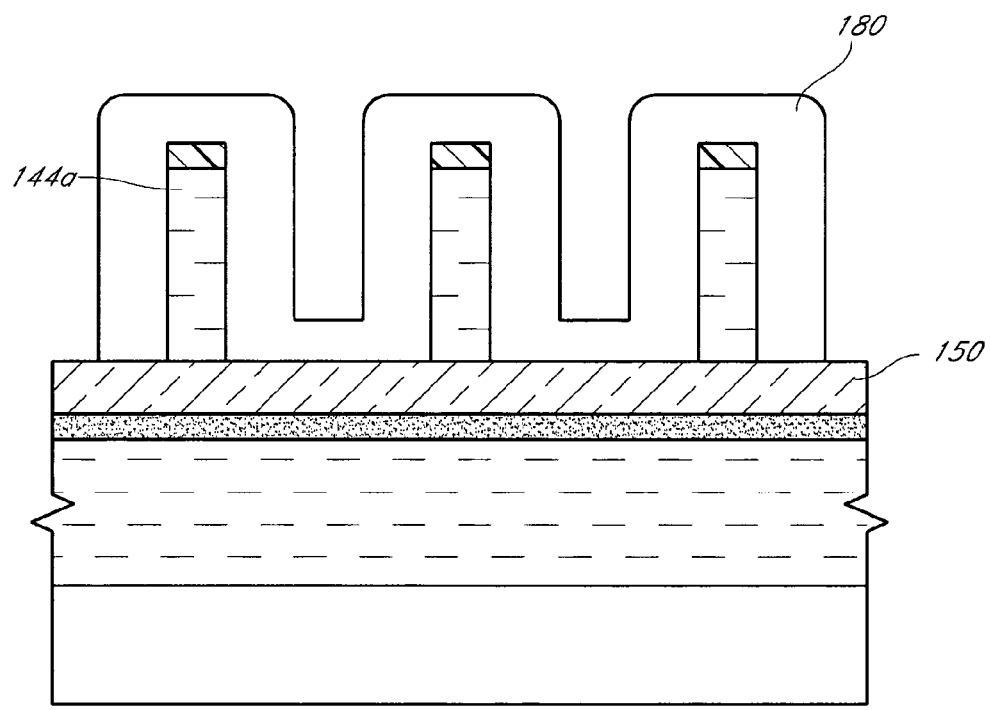
FIG. 7 shows the structure of FIG. 6 after blanket deposition of a spacer material.

In the illustrated embodiment, the modified lines 124a define the dimensions of placeholders or mandrels along which a pattern of spacers 182 (FIG. 8) will be formed after transfer of the pattern to an underlying layer (FIGS. 5 and 6) and blanket deposition of a spacer material 180 (FIG. 7). In alternative embodiments, if the deposition and etch of spacer material is compatible with the definable layer 120, the temporary layer 140 can be omitted and the spacer material can be deposited directly on the photo-defined lines 124 or the thinner lines 124a.

In other alternative embodiments, the pattern of the lines 124 can be transferred to underlying layers without first being trimmed or having their width's reduced as described above. In such embodiments, a pattern corresponding to that of lines 124 can be formed in the temporary layer 140 and the features of that pattern can be reduced in width with a shrink step.

Figure 5:
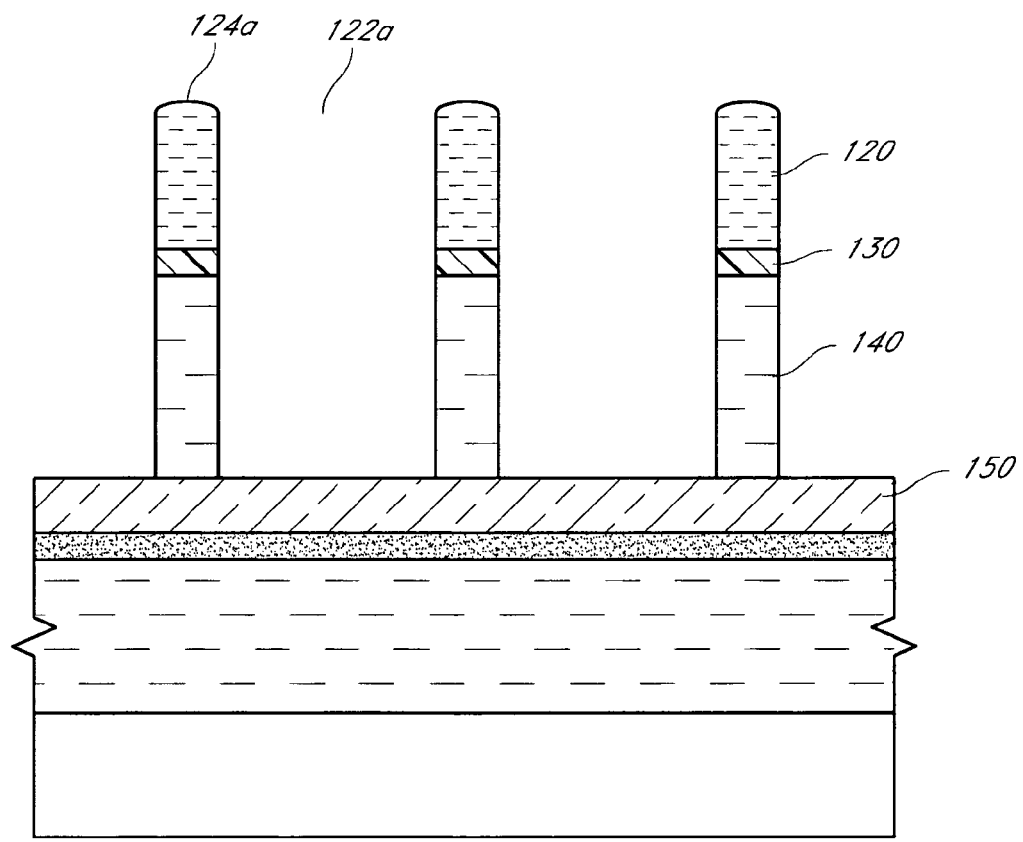
FIG. 5 shows a schematic, cross-sectional side view of masking and substrate layers used to form an integrated circuit after the pattern of FIG. 4 has been extended into underlying layers.

As shown in FIG. 5, after modification of line width (FIG. 4), the pattern in the photodefinable layer 120 is preferably transferred to the first temporary layer 140 to allow for later deposition of a layer 180 of spacer material (FIG. 7). The temporary layer 140 is preferably formed of a material that can withstand the process conditions for spacer material deposition and etch, discussed below. In particular, the material forming the temporary layer 140 preferably has a higher heat resistance than photoresist and is preferably selected such that it can be selectively removed relative to the material for the spacers 182 (FIG. 8) and the underlying layer 150. As noted above, the layer 140 is preferably formed of amorphous carbon.

As shown in FIG. 5, the pattern of lines 124a and spaces 122a in FIG. 4 can be extended into, or transferred to underlying layers. This pattern extension can be accomplished by selectively etching the materials that form layers 130 and 140, while lines 124a form a protective mask that prevents the etchant from removing the material located underneath lines 124a.

To transfer the pattern into the hard mask layer 130, an anisotropic etch can be used, such as an etch using a fluorocarbon plasma. A wet (isotropic) etch may also be suitable if the hard mask layer 130 is thin. Preferred fluorocarbon plasma etch chemistries include $CF_4$, $CFH_3$, $CF_2H_2$ and $CF_3H$ for etching the preferred DARC material.

To transfer the pattern into the first temporary layer 140, an $SO_2$-containing plasma, e.g., a plasma containing $SO_2$, $O_2$ and Ar, is preferably used. Advantageously, the $SO_2$-containing plasma can etch carbon of the preferred temporary layer 140 at a rate greater than 20 times and, more preferably, greater than 40 times the rate that the hard mask layer 130 is etched. A suitable $SO_2$-containing plasma is described in U.S. patent application Ser. No. 10/931,772 to Abatchev et al., filed Aug. 31, 2004, entitled Critical Dimension Control, (Atty. docket No. MICRON.286A; Micron Ref. No. 2003-1348), the entire disclosure of which is incorporated herein by reference and made part of this specification. Although FIG. 5 shows lines 124a intact after the pattern has been extended into the first temporary layer 140, the $SO_2$-containing plasma can simultaneously etch the temporary layer 140 and also remove the remaining portion of definable layer 120.

As shown in FIG. 6, once the line pattern originally formed in the layer 120 has been extended down into the layer 140, the remaining portions of the layer 120 can be stripped away using a selective etch. Alternatively, as noted above, the remaining portions of 120 can be etched away during an amorphous carbon etch step such as the step that extends the pattern down into the layer 140. Thus, the line pattern originally formed in the definable layer 120 has been transferred to the hard mask and temporary layers 130 and 140. The transferred pattern is approximately the same as the line pattern originally formed in layer 120; the transferred pattern has lines 144a and spaces 142a that generally correspond to lines 124a and spaces 122a, respectively. In the illustrated embodiment, portions of the hard mask layer 130 remain in place as protective caps on the lines 144a. These portions of the layer 130 can act as etch stops in subsequent steps.

In the illustrated embodiment, a pattern is formed in an overlying layer and later transferred to an underlying layer. In FIG. 5, the illustrated walls of the features formed in layers 130 and 140 are vertical, where these layers have been etched. In order to achieve vertical sidewalls in this step and in other steps described herein, directional or anisotropic etches can be used.

Variations in etching processes can alter the precision with which a pattern in an overlying layer corresponds to a pattern created in an underlying layer. Although pattern transfer from layer to layer is generally illustrated schematically to be a precise process, with vertical walls, such precision may be difficult to achieve in practice. Thus, pattern transfer is intended to encompass general correspondence between underlying and overlying patterns. Similarly, pattern transfer is meant to encompass modification of the features originally defining the pattern—for example by enlarging or shrinking those features—where such modification does not change the pitch.

As shown in FIG. 7, a layer 180 of spacer material is preferably blanket deposited so that it conforms to the exposed surfaces, including the second temporary layer 150 and the lines 144a. As shown, portions of the hard mask layer 130 can be left in place—to subsequently act as CMP etch stops—on top of lines 144a when the layer 180 of spacer material is deposited. Alternatively, the hard mask portions can be removed with a selective etch before spacer deposition. The spacer material can be any material that can act as a mask for transferring a pattern to underlying layers, or that otherwise can allow processing of underlying structures through the mask being formed. The spacer material preferably: 1) can be deposited with good step coverage; 2) can be deposited at a temperature compatible with the temporary layer 140 and underlying layers; and 3) can be selectively etched relative to the temporary layer 140 and any layer directly underlying the temporary layer 140. Preferred materials include silicon oxides and nitrides. The spacer material is preferably deposited by chemical vapor deposition or atomic layer deposition. The layer 180 is preferably deposited to a thickness of between about 20-60 nm and, more preferably, about 20-50 nm. Preferably, the step coverage is about 80% or greater and, more preferably, about 90% or greater.

Figure 8:
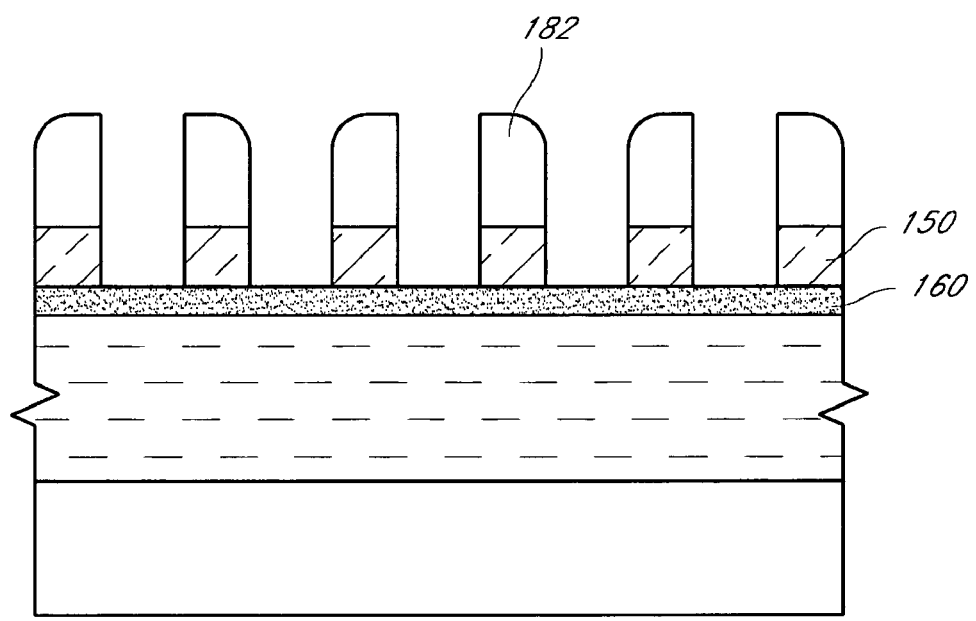
FIG. 8 shows the structure of FIG. 7 after a spacer etch and subsequent etch, leaving a pattern of free-standing spacers that has been extended into an underlying layer.

FIG. 8 shows the structure of FIG. 7 after a spacer etch and subsequent etch, leaving a pattern of free-standing spacers that has been extended into an underlying layer. The spacer etch can comprise an anisotropic etch to remove spacer material from horizontal surfaces. The spacer etch can be performed using a fluorocarbon plasma. The spacer etch can also be performed using HBr/Cl plasma for a silicon spacer material. (Note that preferred embodiments use silicon oxide spacers, however). After a spacer etch is performed, it can leave behind a pattern of elongate spacers having effectively reduced pitch relative to the lines.

After the spacer etch, the remaining portions of hard mask layer 130 (if still present) and the temporary layer 140 are next removed to leave freestanding spacers 182. The remaining portions (in the form of lines 144a) of the first temporary layer 140 are selectively removed, preferably using a sulfur-containing plasma etch such as an etch using $SO_2$. In this way, features of one pattern are removed to leave behind another pattern formed by the spacers.

Thus, in some embodiments, pitch-reduction has been performed using a spacer material to create masking features. The masking features formed in this way can have a smaller pitch than the photoresist lines and can comprise pitch-reduced masking lines separated by pitch-reduced spaces; pitch multiplication has been accomplished. In the illustrated embodiment, the pitch of the pattern formed by spacers 182 is roughly half that of the pattern formed by photoresist lines 124a and spaces 122a (FIGS. 3-5), where the pitch was originally determined by photolithography. Preferably, a spacer pattern having a pitch of about 100 nm can be formed.

With further reference to FIG. 8, the pattern formed by the spacers 182 can be extended into the underlying second temporary layer 150. The extension can be accomplished with a selective etch chemistry. For example, if the spacers 182 are formed from silicon dioxide and the underlying layer 150 is formed from amorphous silicon, an etch can remove the latter while leaving the former largely intact. A preferred etch includes a physical component and preferably can also include a chemical component and can be, e.g., a reactive ion etch (RIE), such as an HBr/Cl$_2$ etch. Such an etch can be performed, for example, using a LAM TCP9400 (available commercially from LAM Research Corporation of Fremont, Calif.) flowing about 0-50 sccm Cl$_2$ and about 0-200 sccm HBr at about 7-60 mTorr pressure with about 300-1000 W top power and about 50-250 W bottom power.

Figure 9:
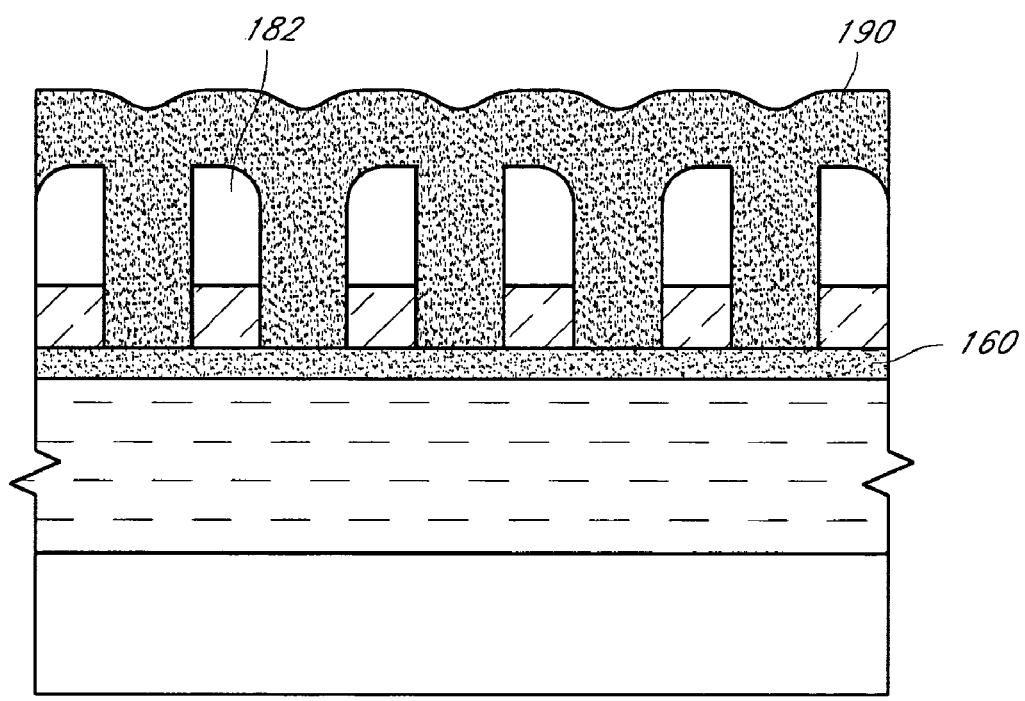
FIG. 9 shows the structure of FIG. 8 after blanket deposition of a filler material.

FIG. 9 shows the structure of FIG. 8 after blanket deposition of a filler material 190. The filler material 190 is advantageously formed from silicon dioxide (SiO$_2$). In some preferred embodiments, the spacers 182 and the filler material 190 are formed from the same or similar materials, as will be better understood from the discussion of FIGS. 17-20, 22-23, and 26-27 below. Thus, the spacers 182 and the filler material 190 can both be formed from silicon dioxide. One preferred process for depositing the filler material 190 (i.e., silicon dioxide) is Applied Materials' Producer® HARP™ system. (HARP stands for "High Aspect Ratio Process.")

In an alternative embodiment, the spacers 182 can be removed before the filler material 190 is deposited. A wet etch can be used to remove the spacers if the hard mask layer 160 is formed from a DARC material. Removal of the spacers 182 can allow good coverage by the filler material 190.

FIGS. 10-20, 22-23, and 26-27 each illustrate at least four corresponding views, lettered A-D as follows: 10A-10D, 11A-11D, etc. The views designated with an "A" consistently show a top or plan view, where hatching has been included for convenience. The views B-C consistently show cross sections of the same structure depicted in the corresponding figure A. Furthermore, those views designated with a "B" consistently show the structure in the same orientation as other views designated with a "B." The orientations are also similar for "C" designations, and likewise for "D" designations.

FIGS. 10A-10D show the structure of FIG. 9 after removal of the spacers 182 and a portion of the filler material 190, through, for example, a chemical mechanical polishing (CMP) process. A dry etch or a plasma etch can also be used for planarization. If a CMP process is used, a thin etch stop layer is preferably added between the hard mask layer 160 and the temporary layer 150. The etch stop layer can be formed from Si$_3$N$_4$, for example.

Figure 10A:
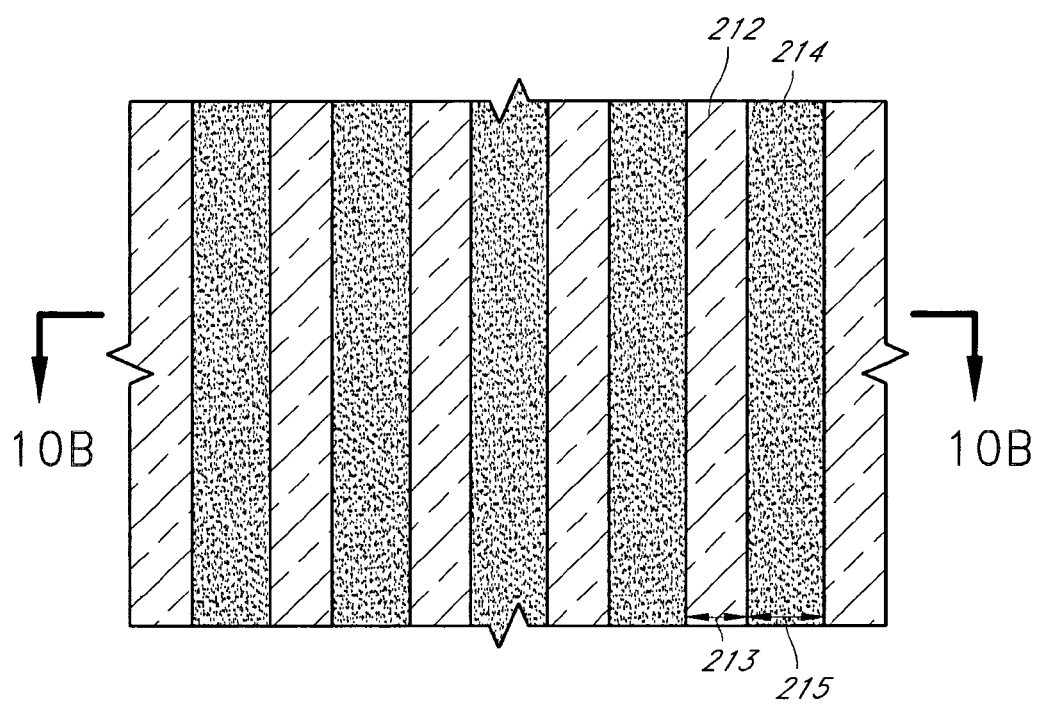
FIGS. 10A-10D show the structure of FIG. 9 after a CMP process or dry etch has removed the spacers and excess filler material.

FIG. 10A shows a schematic plan view of the surface after the planarization. The surface exhibits a striped pattern with alternating stripes of the filler material 212, which is amorphous silicon, for example, and the stripes 214, which can be silicon dioxide, for example. The stripes 212 of amorphous silicon have been formed in the second temporary layer 150 and the stripes 214 of silicon dioxide are the remaining portions of the filler material 190 that fill the spaces between the stripes 212. For convenience, the surface in FIG. 10A is depicted with cross-hatching to show the material that comprises the striped structures. The stripes 212 preferably have widths 213 in a range of approximately 30-70 nm. The stripes 214 preferably have widths 215 in a range of approximately 30-70 nm. More preferably, the stripes 212 and 214 each have widths 213 and 215, respectively, of approximately 50 nm. In the latter case, the pattern formed by the stripes has a pitch of approximately 100 nm.

Figure 10B:
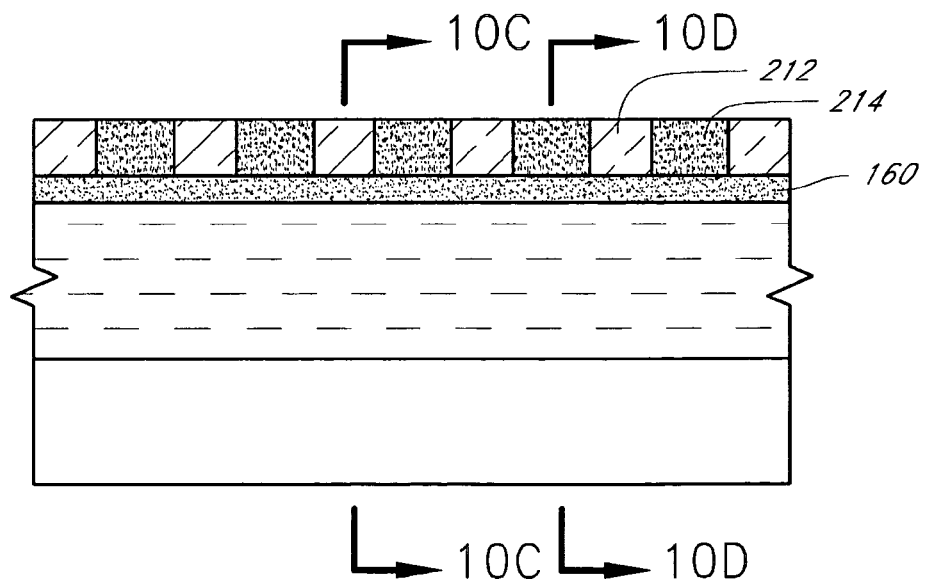

FIG. 10B shows a schematic cross-sectional side view taken along lines 10B-10B of FIG. 10A. This view reveals that the two sets of stripes are formed on the same "level." For convenience in this application, the term "level" is used to designate a portion of the integrated circuit that is generally located in a thick plane that is parallel to and equidistant from the plane of the surface of the substrate 110. Thus, the layer 160 is located at a different level from that of layer 170, but the stripes 212 and the stripes 214 are located at the same level. In contrast, the term "layer" is generally used to refer to a portion of the integrated circuit formed from the same material and deposited together.

Figure 10C:
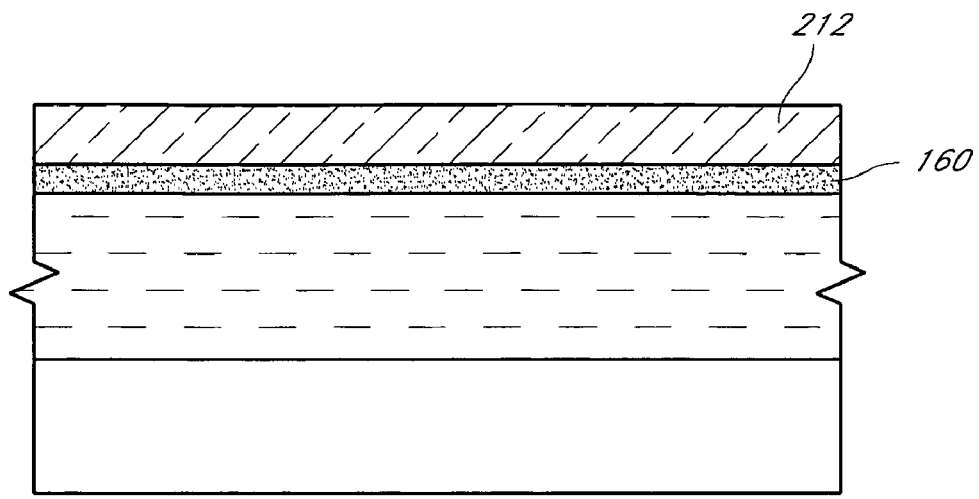
Figure 10D:
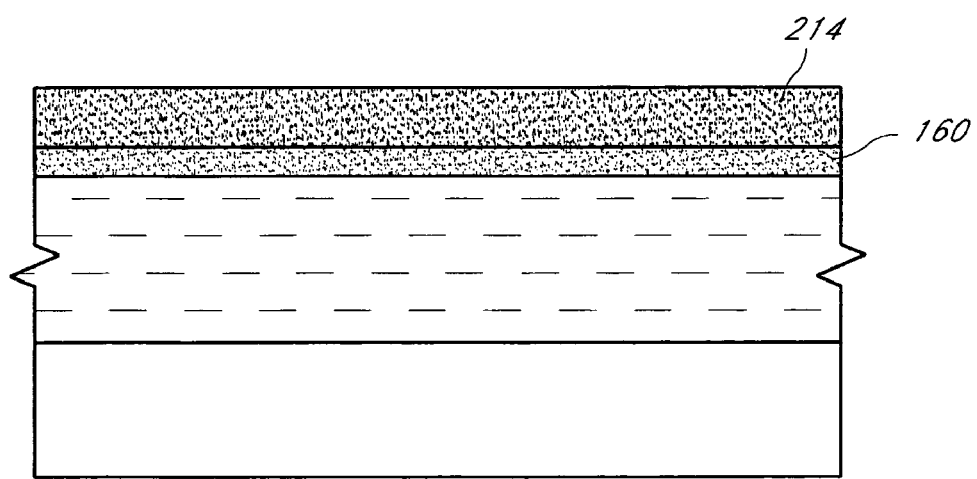

FIG. 10C shows a schematic, cross-sectional side view taken along lines 10C-10C of FIG. 10B. FIG. 10D shows a schematic, cross-sectional side view taken along lines 10D-10D of FIG. 10B.

In a first phase of methods described and illustrated above with reference to FIGS. 2-10, a pattern of spacers has been formed by pitch multiplication and used to create an underlying striped structure or "first pattern" derived from and pitch multiplied relative to the pattern of the first resist mask.

Second Phase

In a second phase of methods in accordance with preferred embodiments and with reference to FIGS. 11-17, a second pattern of spacers is formed by pitch multiplication and used to create an overlying striped structure (see FIG. 17) that crosses the underlying striped structure of FIG. 10. One example of an etch sequence for this phase is the following: 1) deposition of multiple layers; 2) photolithographic patterning of an overlying layer; 3) shrinking of features; 4) extension of pattern into underlying layers; 5) removal of remaining portions of overlying layers; 6) blanket deposition of spacer material; 7) spacer etch; 8) removal of spacer mandrels.

FIGS. 11A-11D show the structure of FIG. 10 after deposition of multiple new masking layers, 320-340. The pattern having the stripes 212 and the stripes 214 now underlies multiple new layers of material. As with the layers 120-170, layers 320-340 can also be etched to form masks for patterning underlying layer(s) of substrate 110. These masks can be used to form various features, as discussed below. The features can comprise portions of one or multiple integrated circuit components.

Figure 11A:
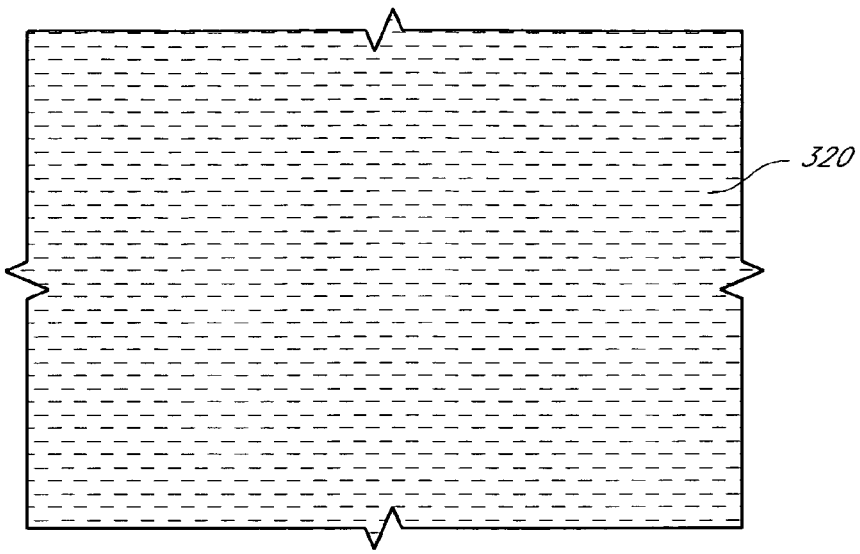
FIGS. 11A-11D show the structure of FIG. 10 after deposition of multiple new layers.
Figure 11B:
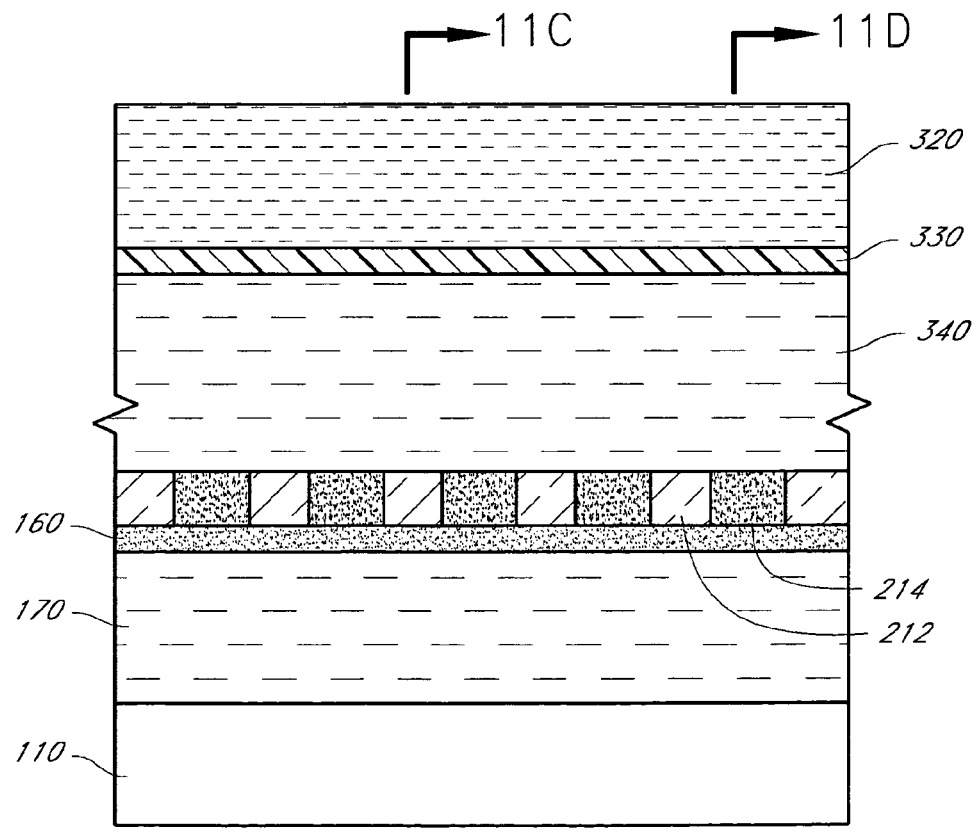
Figure 11C:
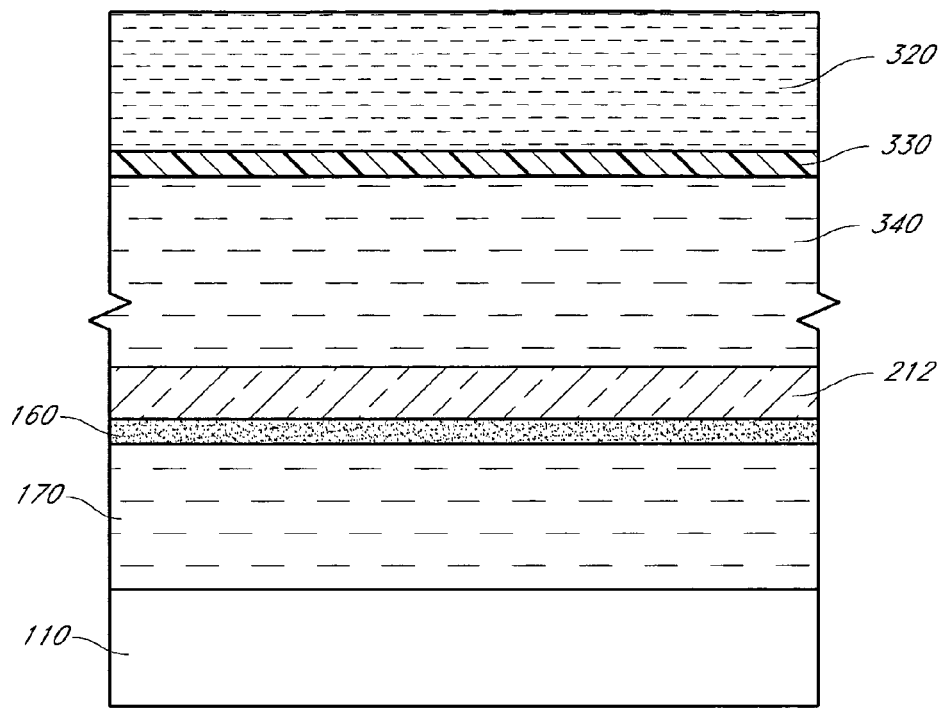
Figure 11D:
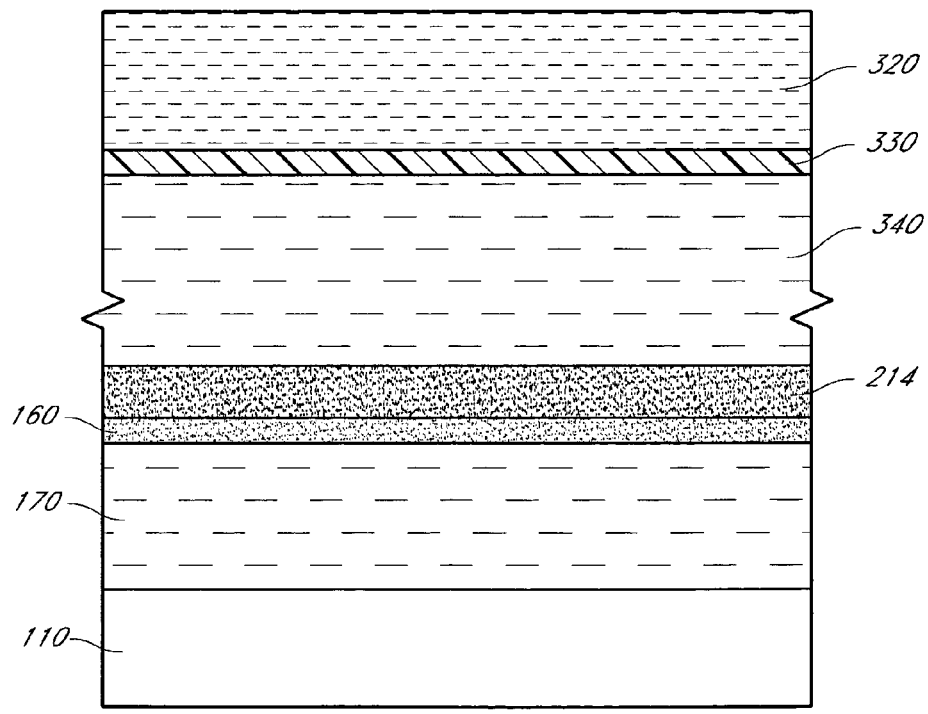

FIG. 11A shows a schematic plan view of the surface. FIG. 11B shows a schematic cross-sectional side view taken along lines 11B-11B of FIG. 11A. FIG. 11C shows a schematic, cross-sectional side view taken along lines 11C-11C of FIG. 11B. FIG. 11D shows a schematic, cross-sectional side view taken along lines 11D-11D of FIG. 11B.

With reference to FIGS. 11A-11D, masking layer 320 preferably has similar properties to those described above with respect to layer 120.

With reference to FIGS. 11B-11D, layer 330 preferably has similar properties to those described above with respect to layer 130.

With reference to FIGS. 11B-11D, the fourth temporary layer 340 preferably has similar properties to those described above with respect to the layer 140.

As with the materials for the layers 120-170, the materials for layers 320-340 overlying the substrate 110 are preferably chosen based upon consideration of the chemistry and process conditions for the various pattern forming and pattern transferring steps discussed herein. Such layers are also preferably chosen so that they can be selectively etched relative to other exposed materials.

In the illustrated embodiment of FIGS. 11A-11D, the second selectively definable layer 320 overlies a third hard mask, or etch stop, layer 330, which overlies a fourth temporary layer 340, which overlies the level having the stripes 212 and 214. Underlying levels 160 and 170, as well as substrate 110, remain intact. As described above with respect to the layers depicted in FIG. 2, one or more of the layers 320-340 can be omitted in some embodiments.

With reference to FIGS. 11A-11D, the second selectively definable layer 320 is preferably formed of a photoresist, including any photoresist known in the art. All the preferred properties and alternatives described above with reference to the layer 120 also apply to the layer 320.

The third hard mask layer 330 preferably comprises an inorganic material, and in the illustrated embodiment, the layer 330 is a DARC. All the preferred properties and alternatives described above with reference to the layer 130 also apply to the layer 330.

The fourth temporary layer 340 is preferably formed of amorphous carbon. All the preferred properties and alternatives described above with reference to the layer 140 also apply to the layer 340. The layer 340 is formed from amorphous carbon in some embodiments. Because it is sometime difficult to achieve good step coverage of amorphous carbon deposition, the underlying striped surface has been planarized (see FIG. 10).

As with the layers 120-170, the thicknesses of the layers 320-340 are preferably chosen depending upon compatibility with the etch chemistries and process conditions described herein. Thus, as described above, thicknesses must allow for appropriate pattern transfer, and the hard mask layer 330 is advantageously thin so that its transfer or removal can occur quickly, exposing surrounding materials to less wear.

In the illustrated embodiment, the second selectively definable layer 320 is a photodefinable layer preferably between about 100-250 nm thick and, more preferably, between about 130-200 nm thick. The third hard mask layer 330 is preferably between about 10-30 nm thick and, more preferably, between about 15-25 nm thick. The fourth temporary layer 340 is preferably between about 130-200 nm thick and, more preferably, between about 140-160 nm thick.

Furthermore, the layers 320, 330, and 340 can be formed by various methods known to those of skill in the art. For example, the methods described above for forming layers 120, 130, and 140 can be used to form layers 320, 330, and 340, respectively.

FIGS. 12A-12D illustrate a pattern formed in the layer 320, having lines 324 interspersed with spaces 322. The preferred properties of and methods for forming the lines 124 described above in FIG. 3 et seq. also apply to lines 324, however, the lines 324 are not parallel to the lines 124. This can be seen—even though the lines 124 have been removed—by observing that the stripes 212 and the stripes 214 are not parallel to the lines 324. Thus, because the stripes 212 and 214 are elongate in the same elongate dimension of the lines 124, the lines 124 and the lines 324 are not parallel.

Because the lines 324 are not parallel to the stripes 212 and 214, the illustrated method can be said to call for applying a crossing pattern of photoresist over an underlying pattern. Thus, one pattern "crosses" a second pattern when an elongate dimension of the first pattern is not aligned with or parallel to an elongate dimension of the second pattern. The elongate dimension of the lines 124 is aligned with the elongate dimension of the stripes 212 and 214, but the elongate dimension of the stripes 212 and 214 crosses the elongate dimension of the lines 324. Thus, the lines 124 can be described as aligned with the stripes 212 and 214, and the stripes 212 and 214 can be described as crossing the lines 324. In the illustrated embodiments, the lines 324 not only cross, they cross perpendicularly the stripes 212 and 214. However, the term "cross" is intended to include all non-parallel angles, not just a 90 degree angle. Thus, though the exemplary features and/or holes formed by the illustrated methods have a generally rectangular footprint (see, e.g., FIGS. 21A, 25A, and 27A), other footprints such as skewed quadrangle or diamond-shaped footprints are also contemplated.

Figure 12A:
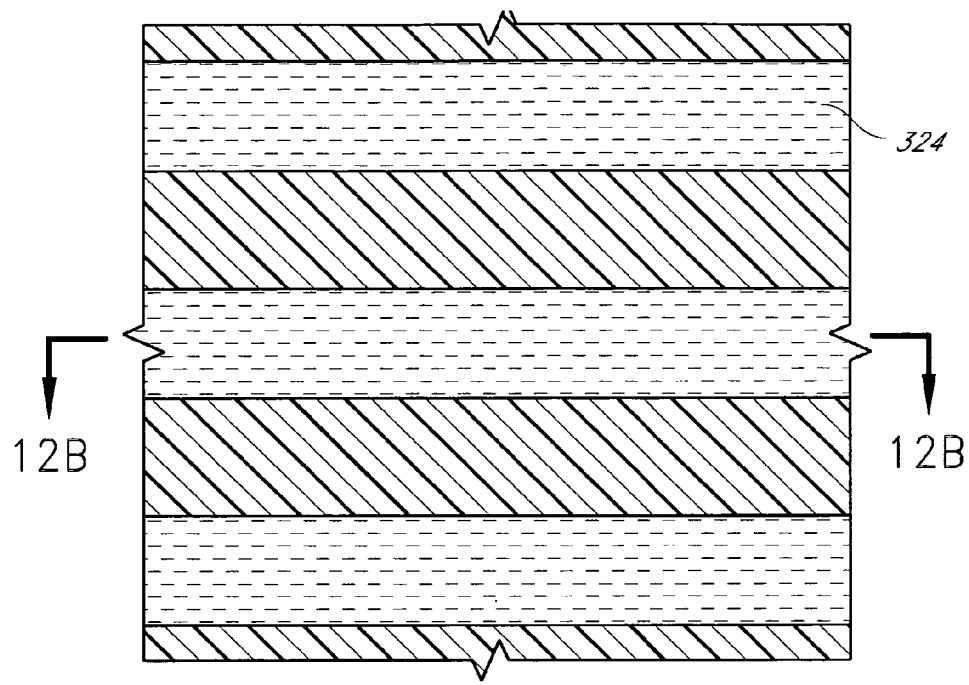
FIGS. 12A-12D show the structure of FIG. 11 after photolithographic patterning of a second resist layer.
Figure 12B:
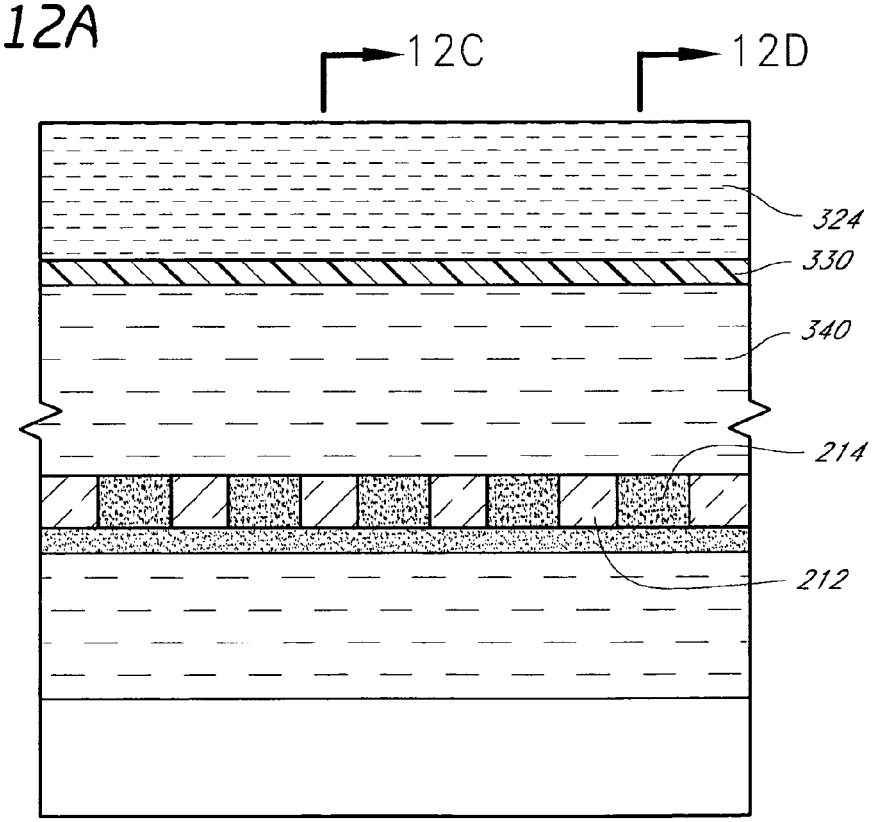
Figure 12C:
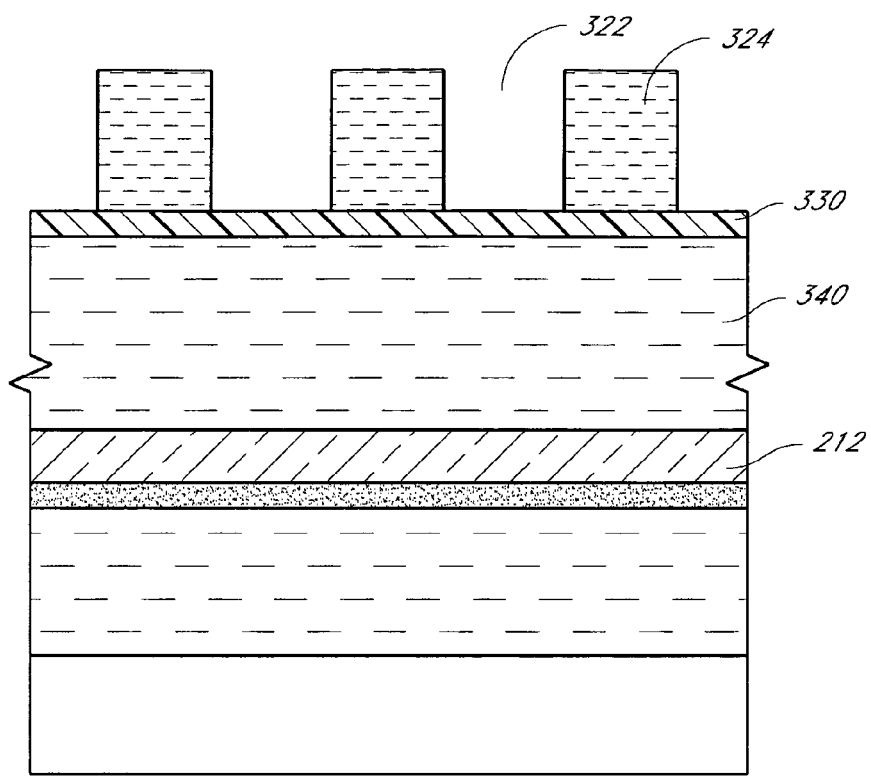
Figure 12D:
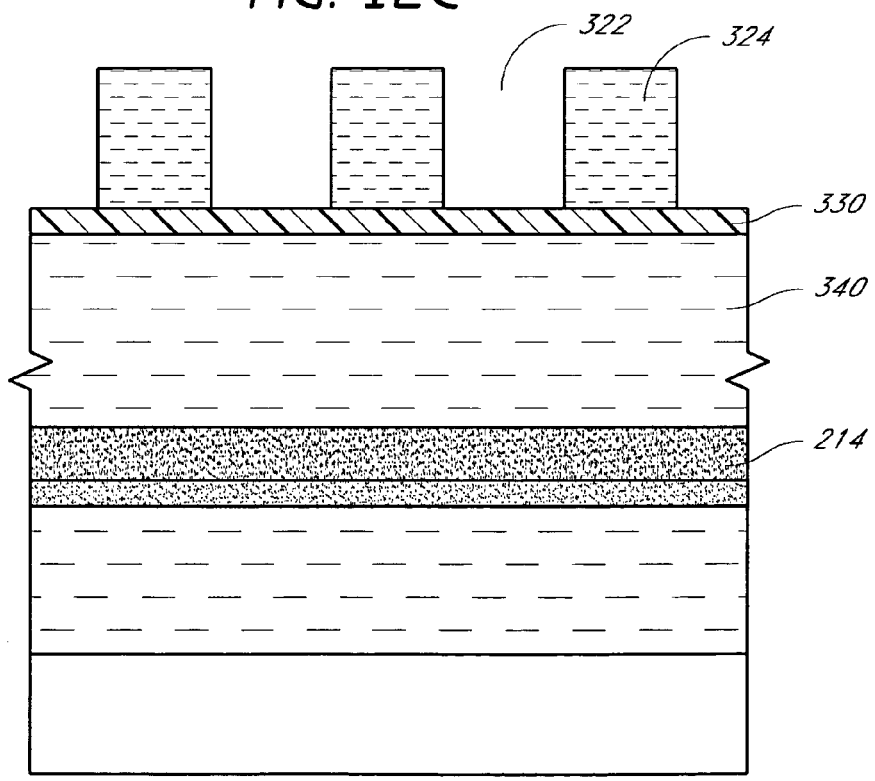

With reference to FIGS. 12A-12D, a pattern comprising spaces 322 delimited by definable material features 324 is formed in the second definable layer 320 in a similar way to what was described above with respect to lines 124 and depicted in FIG. 3. Thus, FIGS. 12A-12D show the structure of FIG. 11 after photolithographic patterning of an overlying resist layer. FIG. 12A shows a schematic plan view of the surface. FIG. 12B shows a schematic cross-sectional side view taken along lines 12B-12B of FIG. 12A. FIG. 12C shows a schematic, cross-sectional side view taken along lines 12C-12C of FIG. 12B. FIG. 12D shows a schematic, cross-sectional side view taken along the lines 12D-12D of FIG. 12B.

As with the pattern depicted in FIG. 3, the pattern created by the series of photoresist lines 324 has been formed through conventional photolithography. As with the earlier described pattern, the shrink step can be accomplished to make the lines 324 thinner and spacer formation can be accomplished using the modified lines 324a as mandrels, or the pattern can be transferred to an underlying layer before the shrink step is accomplished. In the illustrated embodiment described below, however, the shrink step is performed on photoresist lines 324, the pattern is then transferred to an underlying layer, and portions of the underlying layer form spacer mandrels.

Figure 13A:
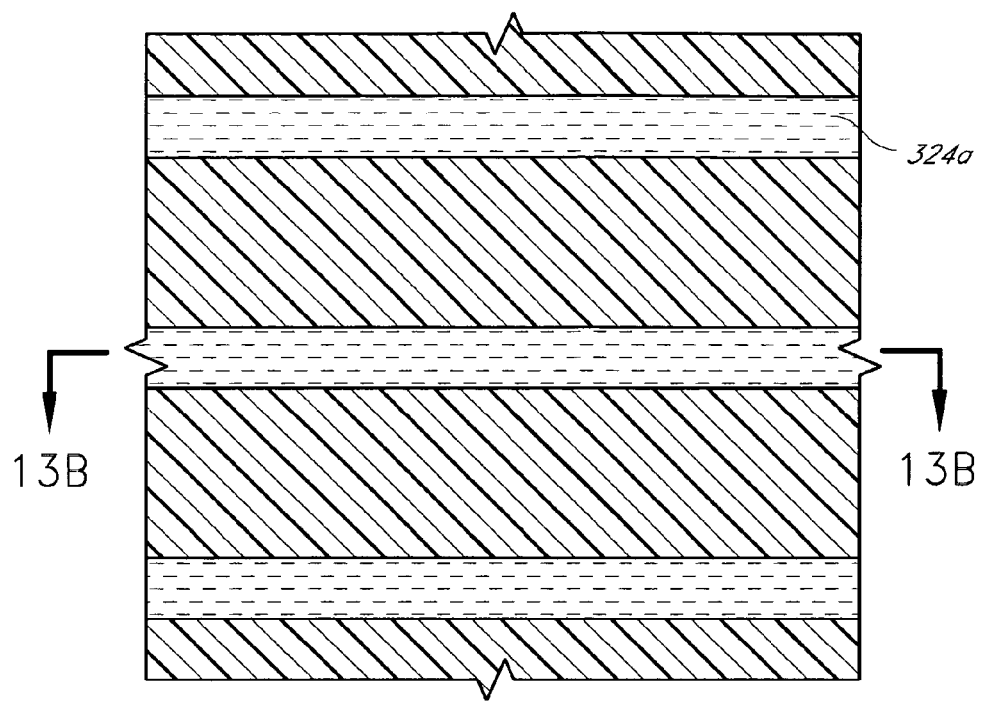
FIGS. 13A-13D show the structure of FIG. 12 after an etch has reduced the size of the features in the pattern of FIG. 12.
Figure 13B:
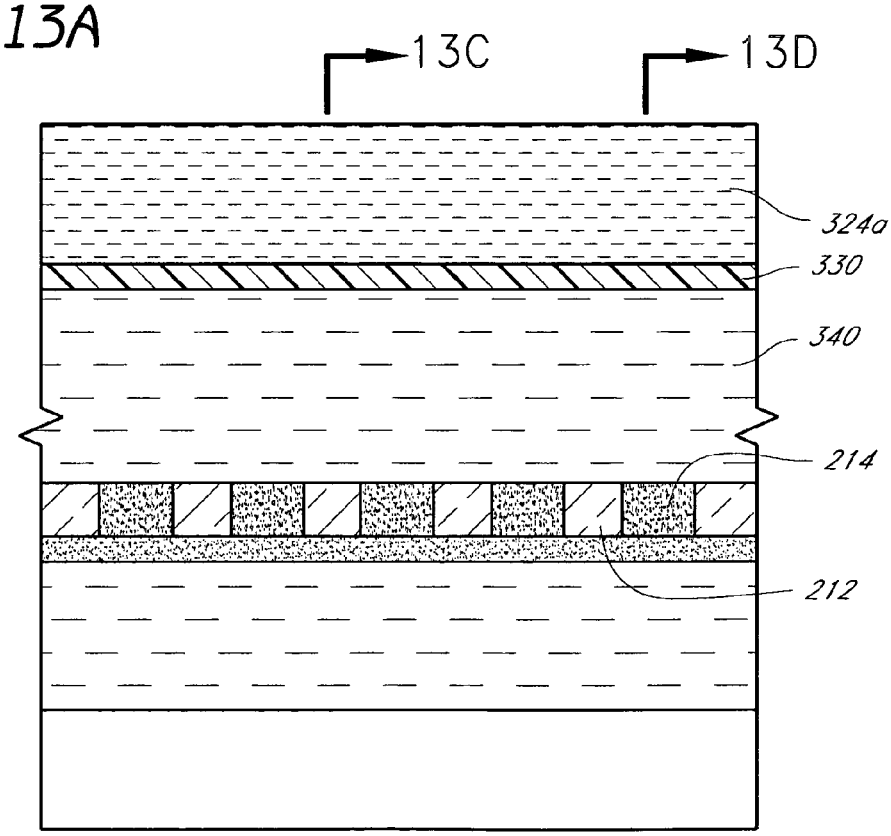
Figure 13C:
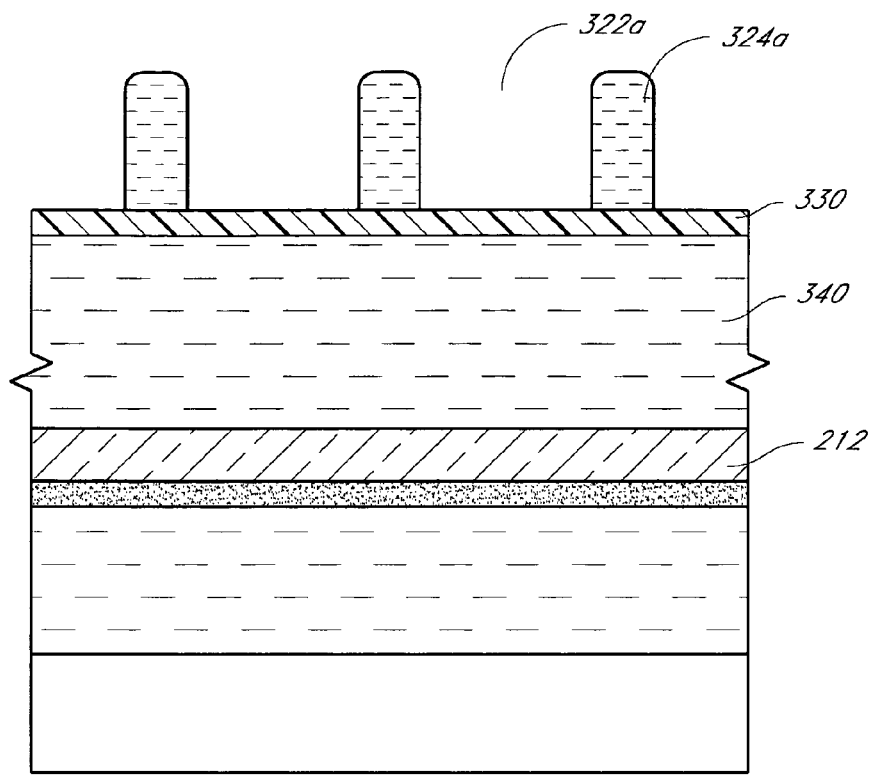
Figure 13D:
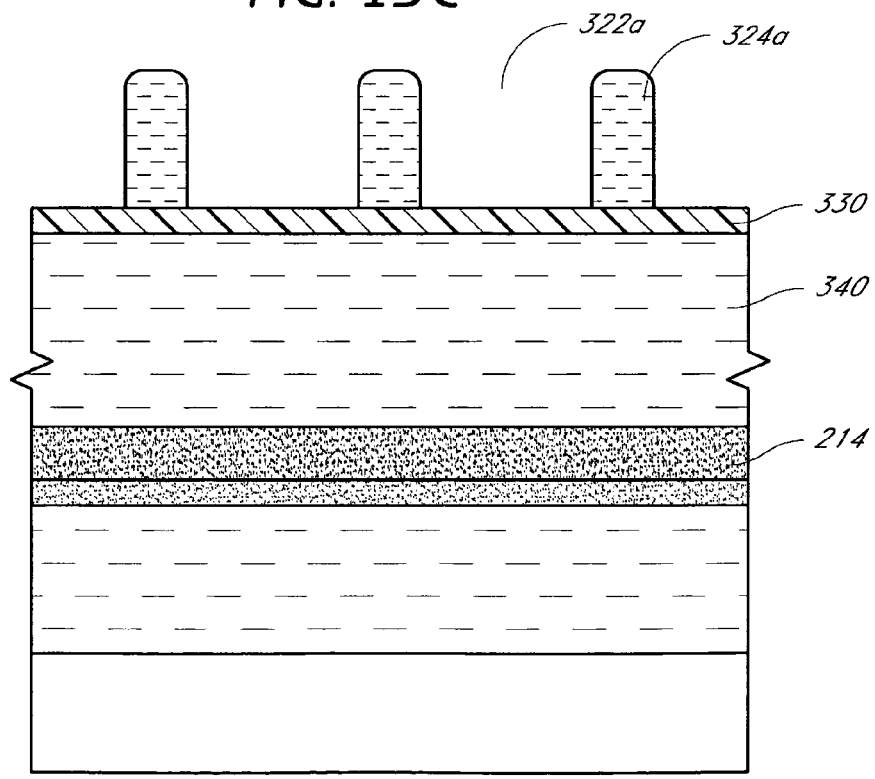

FIGS. 13A-13D show the structure of FIG. 12 after the lines 324 have been shrunk, by an isotropic etch, for example, to create modified lines 324a. The shrink step also widens the spaces 322 to form modified spaces 322a. FIG. 13A shows a schematic plan view of the surface. FIG. 13B shows a schematic cross-sectional side view taken along lines 13B-13B of FIG. 13A. FIG. 13C shows a schematic, cross-sectional side view taken along lines 13C-13C of FIG. 13B. FIG. 13D shows a schematic, cross-sectional side view taken along lines 13D-13D of FIG. 13B.

The structure of FIGS. 13A-13D preferably shares many characteristics of the features described in conjunction with FIG. 4. Similar methods to achieve that structure can also be used; preferred etch materials and methods, and desirable configurations are described above. For example, the photoresist lines 324 are preferably reduced in size using an isotropic etch, such as a sulfur oxide plasma, e.g., a plasma comprising $SO_2$, $O_2$, $N_2$ and Ar, or any other suitable plasma. Two other plasmas that can be used, for example, are an $HBr/O_2$ plasma or a $Cl_2/O_2$ plasma.

As with the lines 124a, the modified lines 324a define the dimensions of the placeholders or mandrels along which a pattern of spacers will be formed. The alternatives described above also apply here. For example, in alternative embodiments, the pattern of the lines 324 can be transferred to underlying layers without first being trimmed or having their width's reduced as described above. In such embodiments, a pattern corresponding to that of lines 324 can be formed in the temporary layer 340 and the features of that pattern can be reduced in width with a shrink step. In other alternative embodiments, if the deposition and etching of spacer material is compatible with the definable layer 320, the temporary layer 340 can be omitted and the spacer material can be deposited directly on the photo-defined lines 324 or the thinner lines 324a.

In the illustrated embodiment, lines 324a create a mask for placeholders or mandrels that will later be formed in the underlying layer 340, along which a pattern of spacers 382 (FIG. 17) will be formed after blanket deposition of a spacer material 380 (FIG. 16).

Figure 14A:
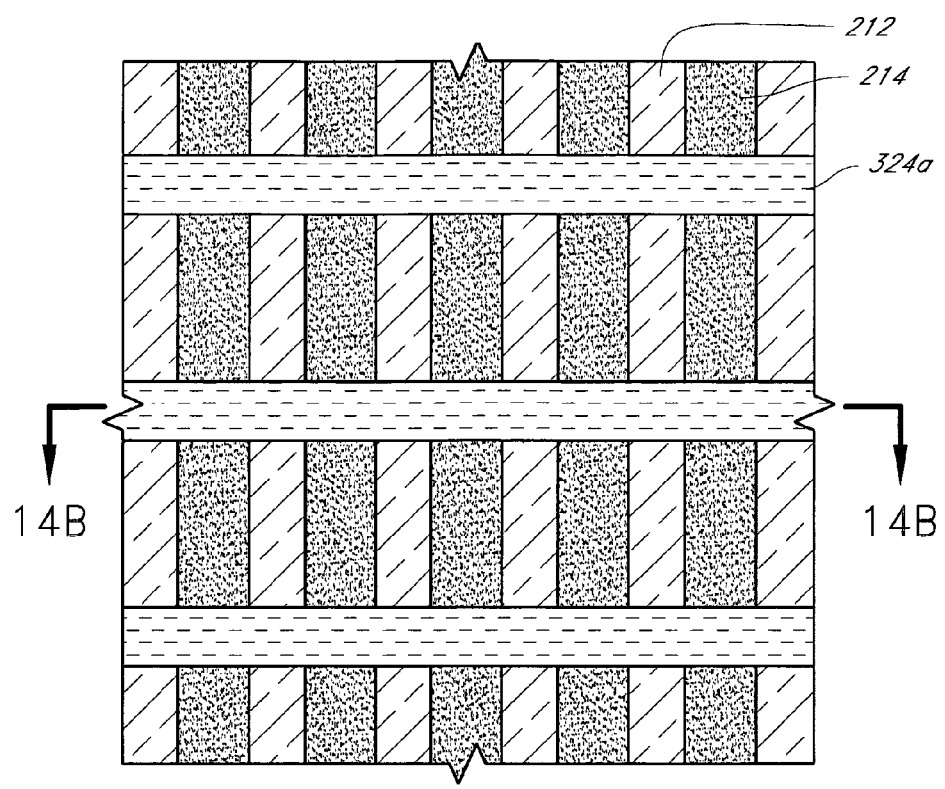
FIGS. 14A-14D show the structure of FIG. 13 after the pattern of the features of FIGS. 13A-13D has been extended into underlying layers to partially expose the crossing underlying pattern.
Figure 14B:
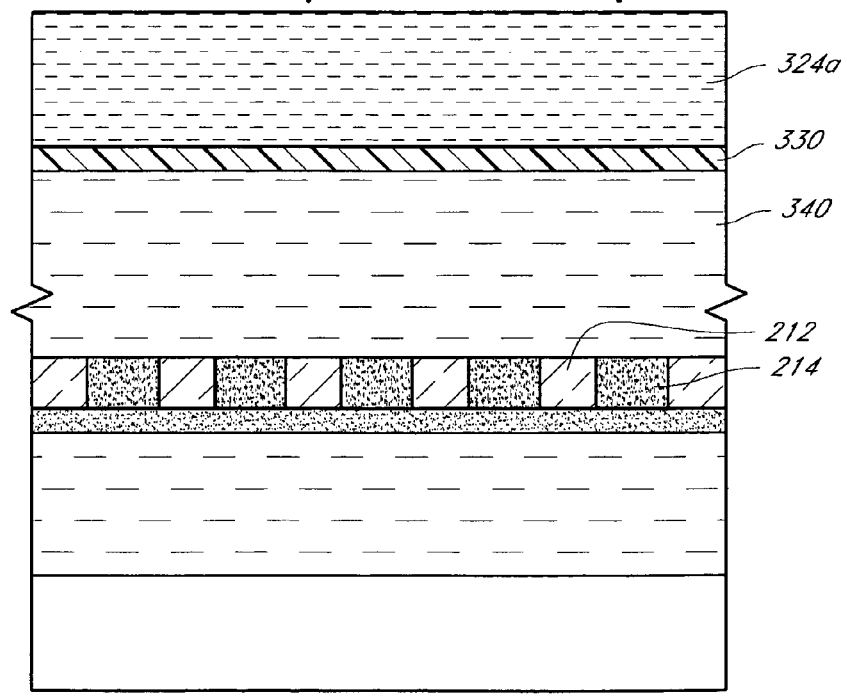
Figure 14C:
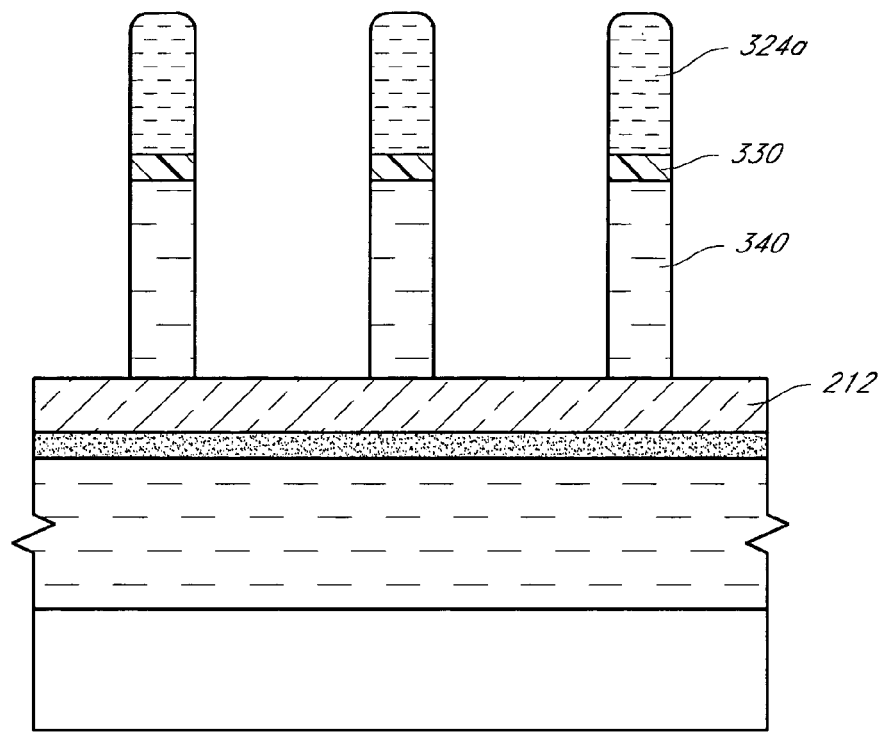
Figure 14D:
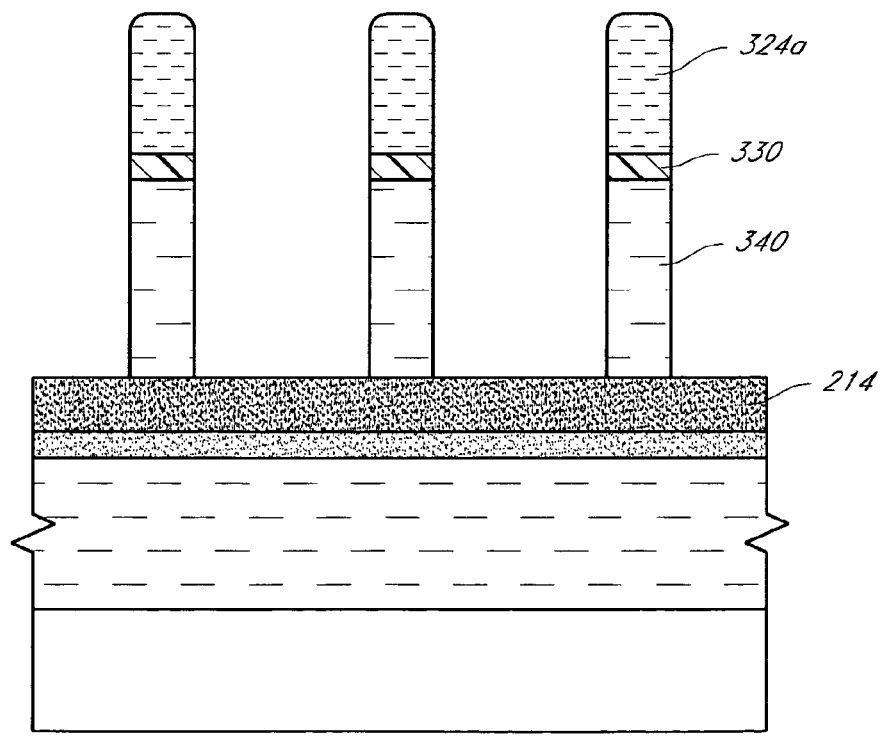

FIGS. 14A-14D illustrate how the pattern in the photodefinable layer 320 can be extended into the fourth temporary layer 340. FIG. 14A shows a schematic plan view of the surface. FIG. 14B shows a schematic cross-sectional side view taken along lines 14B-14B of FIG. 14A. FIG. 14C shows a schematic, cross-sectional side view taken along lines 14C-14C of FIG. 14B. FIG. 14D shows a schematic, cross-sectional side view taken along lines 14-14D of FIG. 14B.

The fourth temporary layer 340 preferably has the advantageous properties described above for the second temporary layer 140 such as high heat resistance. As shown in FIGS. 14A-14D, the pattern of lines 324a and spaces 322a in FIGS. 13A-13D can be extended into or transferred to underlying layers in a similar way to the way the pattern of lines 124a and spaces 122a was transferred to underlying layers, using, for example, a selective etch to transfer the pattern into the hard mask layer 330 and an $SO_2$-containing anisotropic plasma etch to transfer the pattern into the fourth temporary layer 340. Preferred and alternative etch chemistries are described above.

As illustrated in FIG. 14A, the described etch steps remove the portions of the layers 330 and 340 that are not masked by the lines 324a, thus leaving portions of the stripes 212 and 214 exposed. The surfaces visible in FIG. 14A have been hatched to reveal the underlying materials of the structure depicted, and to show how the lines 324a cross the stripes 212 and 214.

Figure 15A:
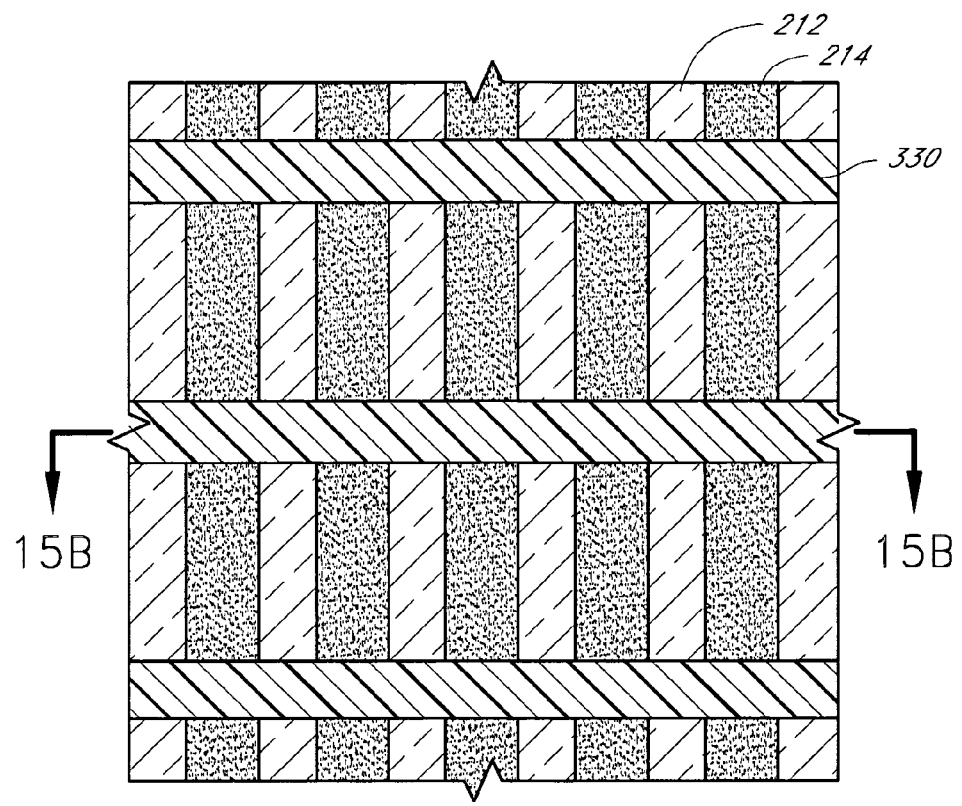
FIGS. 15A-15D show the structure of FIG. 14 after overlying layers have been stripped.
Figure 15B:
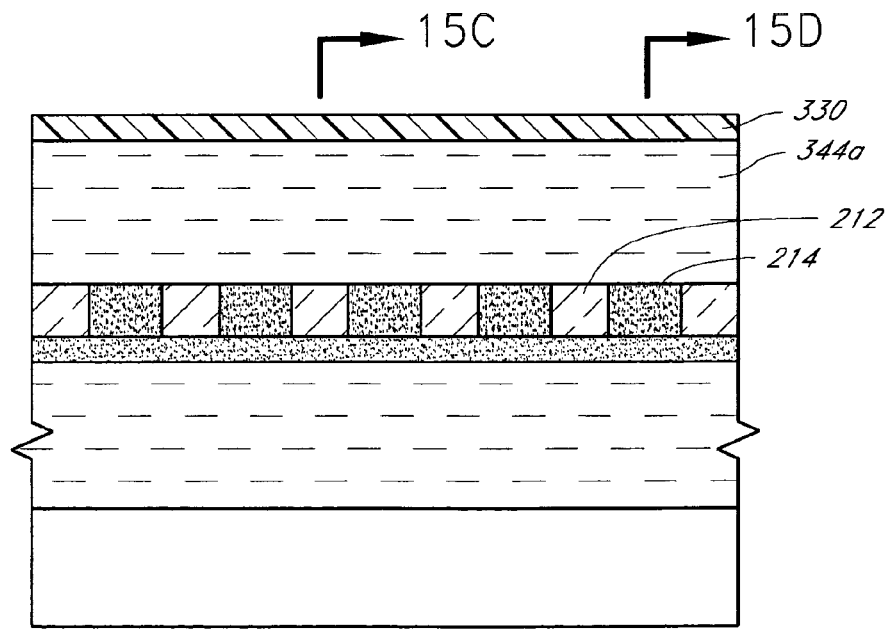
Figure 15C:
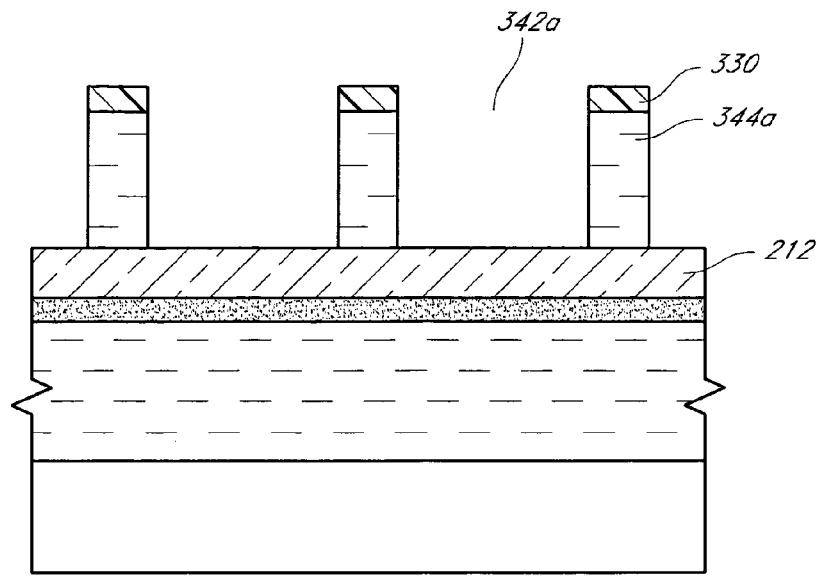
Figure 15D:
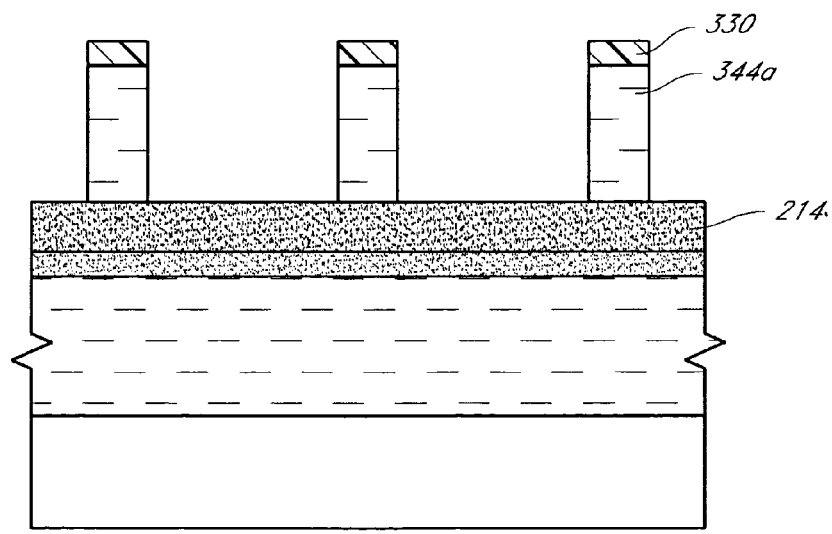

FIGS. 15A-15D show the structure of FIG. 14 after the remaining portions of the overlying layers 320 and 330 have been stripped. Such a process is described above and illustrated in FIGS. 5-6. FIG. 15A shows a schematic plan view of the surface. FIG. 15B shows a schematic cross-sectional side view taken along lines 15B-15B of FIG. 15A. FIG. 15C shows a schematic, cross-sectional side view taken along lines 15C-15C of FIG. 15B. FIG. 15D shows a schematic, cross-sectional side view taken along lines 15D-15D of FIG. 15B. As illustrated by FIGS. 15C-15D, lines 344 and spaces 342 exhibit the same crossing pattern previously apparent in overlying layers (see lines 144a and spaces 142a, for example).

As shown in FIG. 15, once the line pattern originally formed in the definable layer 320 has been extended down into the layer 340, the remaining portions of the definable layer 320 can be stripped away using a selective etch. Alternatively, the remaining portions of layer 320 can be etched away during the carbon etch step that extends the pattern down into the layer 340. Thus, the line pattern originally formed in layer 320 has been transferred to the layers 330 and 340. The transferred pattern is approximately the same as the line pattern originally formed in layer 320; the transferred pattern has lines 344a and spaces 342a that generally correspond to lines 324a and spaces 322a, respectively. In the illustrated embodiment, portions of the hard mask layer 330 remain in place as protective caps on the lines 344a. The lines 344a will serve as mandrels for the subsequently formed spacers.

Figure 16A:
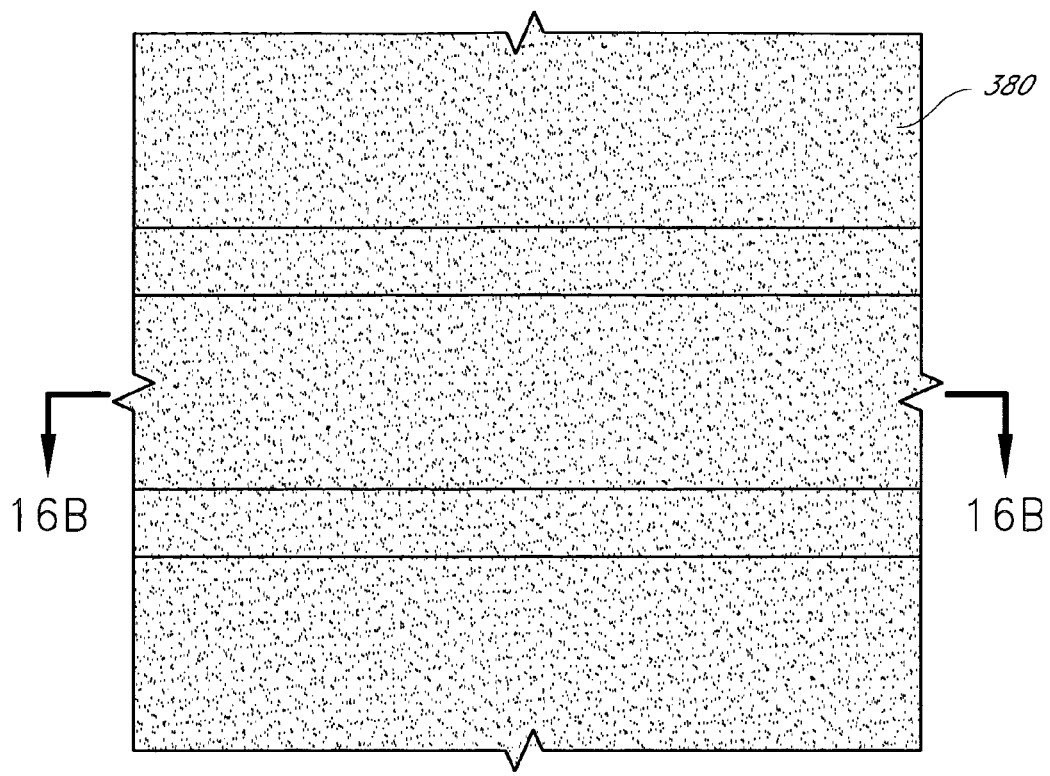
FIGS. 16A-16D show the structure of FIG. 15 after blanket deposition of a spacer material.
Figure 16B:
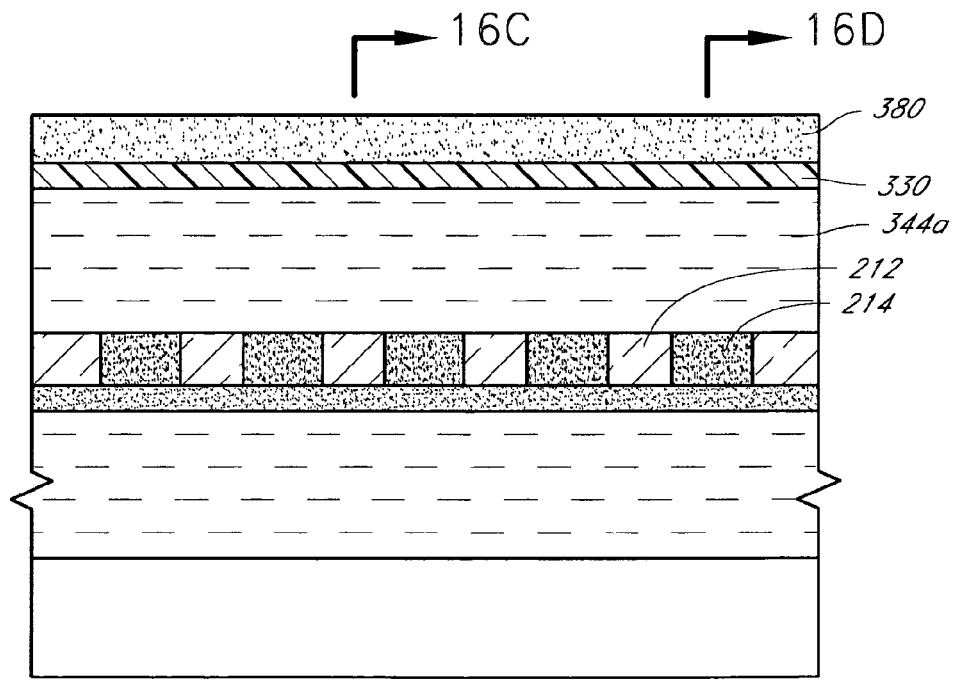
Figure 16C:
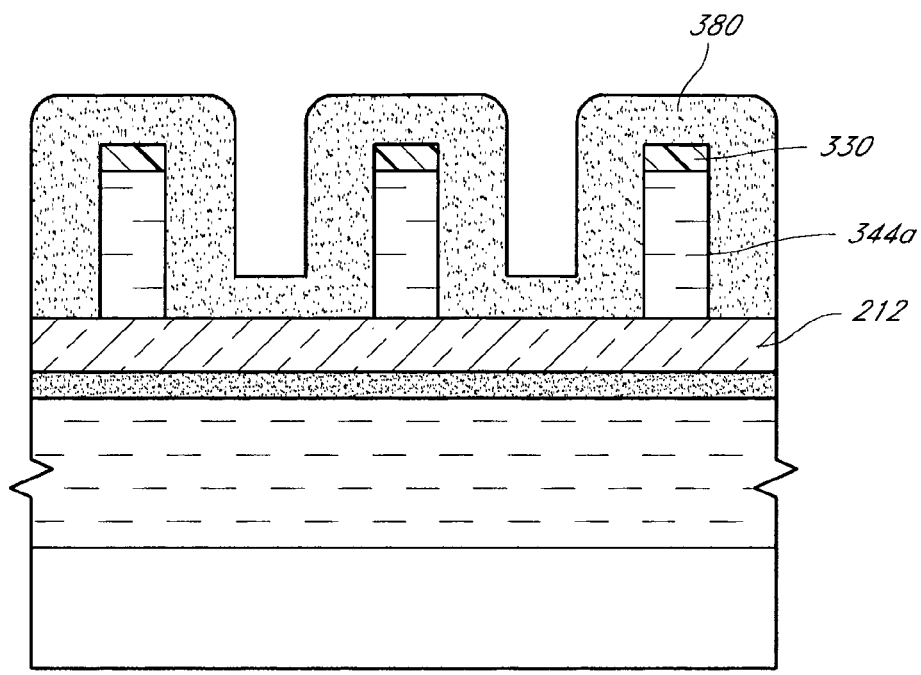
Figure 16D:
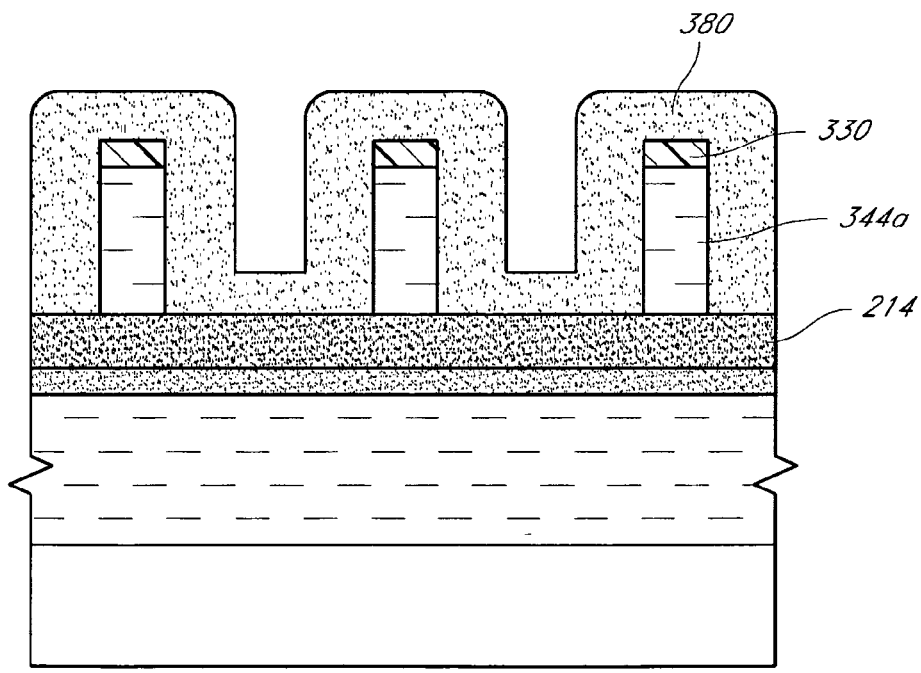

FIGS. 16A-16D show the structure of FIG. 15 after blanket deposition of a spacer material 380 over the mandrels 344a. FIG. 16A shows a schematic plan view of the surface. FIG. 16B shows a schematic cross-sectional side view taken along lines 16B-16B of FIG. 16A. FIG. 16C shows a schematic, cross-sectional side view taken along lines 16C-16C of FIG. 16B. FIG. 16D shows a schematic, cross-sectional side view taken along lines 16D-16D of FIG. 16B.

The layer 380 of spacer material preferably resembles the layer 180 of spacer material described above, in material, in thickness, in coverage, and in mode of deposition. In the illustrated embodiment, portions of the hard mask layer 330 have been left in place, although alternative embodiments do not leave such portions in place. If the portions of the hard mask layer 330 are removed before spacer deposition, a selective etch can be used to remove them. Note that the material of the layer 380 can be different from the materials of the layer 180, provided that each layer can be selectively etched with respect to other surrounding layers as described herein. Silicon dioxide is a preferred spacer material.

Figure 17A:
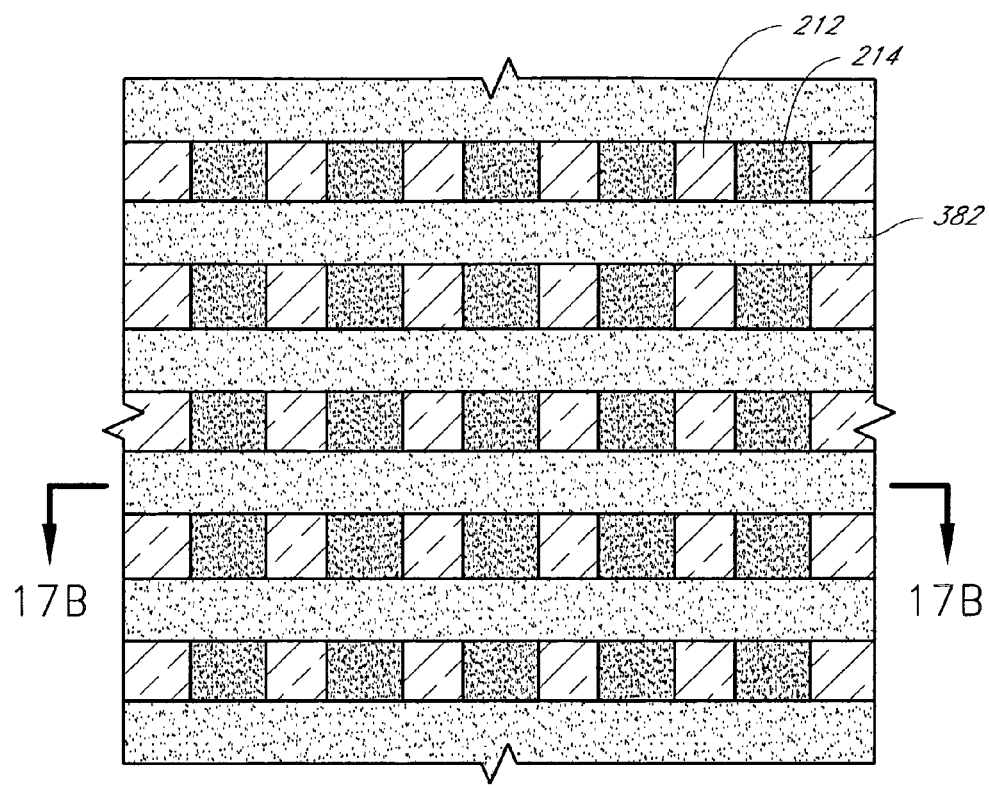
FIGS. 17A-17D show the structure of FIG. 16 after a spacer etch and subsequent etch (that has removed the mandrels), leaving a pattern of free-standing spacers that are orthogonal to the underlying pattern.
Figure 17B:
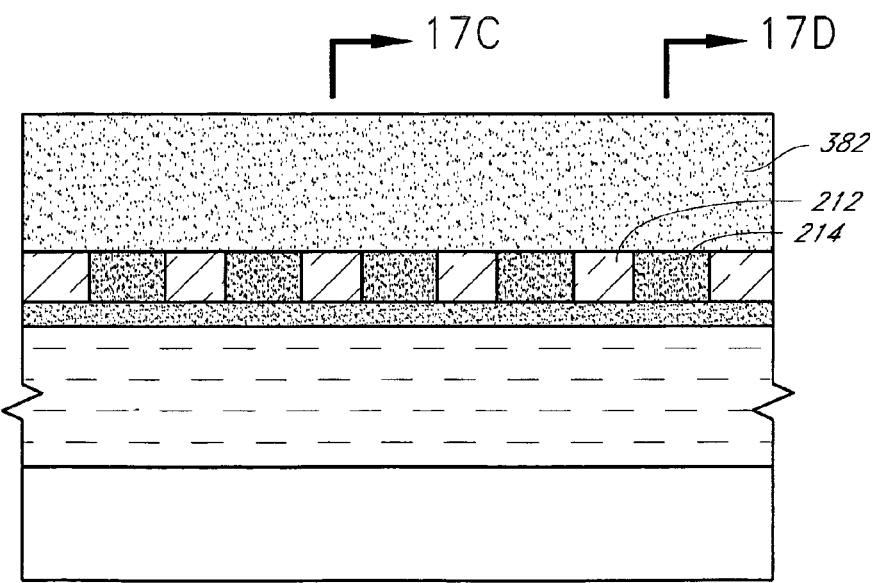
Figure 17C:
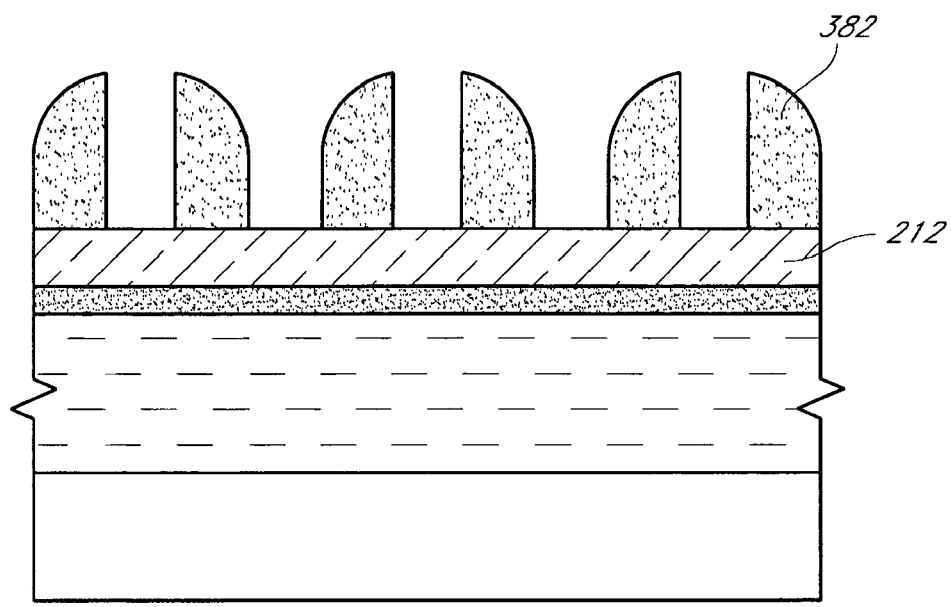
Figure 17D:
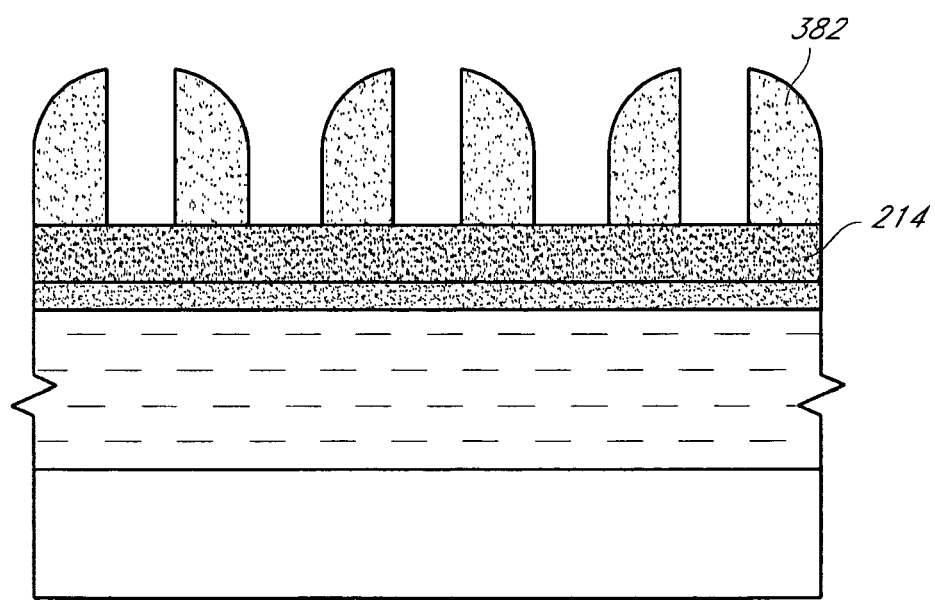

FIGS. 17A-17D show the structure of FIG. 16 after a spacer etch and subsequent etch, leaving a pattern of freestanding spacers. FIG. 17A shows a schematic plan view of the surface. FIG. 17B shows a schematic cross-sectional side view taken along lines 17B-17B of FIG. 17A. FIG. 17C shows a schematic, cross-sectional side view taken along lines 17C-17C of FIG. 17B. FIG. 17D shows a schematic, cross-sectional side view taken along lines 17D-17D of FIG. 17B.

A preferred spacer etch and alternatives are described above with respect to FIGS. 7-8. For example, the spacer etch can be performed using fluorocarbon plasma. As with spacer etch described above, the result is preferably a pattern of elongate spacers having effectively reduced pitch relative to the lines 344a. After the spacer etch, the remaining portions of hard mask layer 330 (if still present) and the fourth temporary layer 340 are next removed to leave freestanding spacers 382. In this way, features of one pattern are removed to leave behind another pattern formed by the spacers 382.

With the elongate spacers 382 in place, crossing the underlying mask lines 212 and 214, a second pitch reduction process has been performed in a crossing dimension—that is, a dimension that is not parallel to the lines 212 and 214. In the illustrated embodiment, the pitch of the pattern formed by spacers 382 is roughly half that of the pattern formed by photoresist lines 344 and spaces 342. Advantageously, the pattern of spacers 382 has a pitch of about 140 nm or less. Preferably, the pattern of spacers 382 has a pitch of about 100 nm or less.

In a second phase of methods described and illustrated above with reference to FIGS. 11-17, a second pattern of spacers has been formed by pitch multiplication and used to create an overlying pattern of lines that crosses the underlying pattern of lines illustrated in FIG. 10.

Third Phase

In a third phase of methods in accordance with preferred embodiments and with reference to FIGS. 18-20, the crossing striped structures depicted in FIG. 17 are used to create a grid of material having small holes that can occur at regular intervals in two dimensions (see FIG. 19-20). One example of an etch sequence for this phase is the following: 1) removal of portions of several exposed layers made from a common material (such as silicon dioxide), while leaving intact one of the materials (such as amorphous silicon) of exposed portions of the underlying stripe materials; 2) extension of two overlying patterns (such as an oxide spacer pattern and a crossing, amorphous silicon strip pattern) into an underlying mask or temporary layer (such as amorphous carbon); and 3) removal of overlying layers to leave a single underlying layer having holes.

Figure 18A:
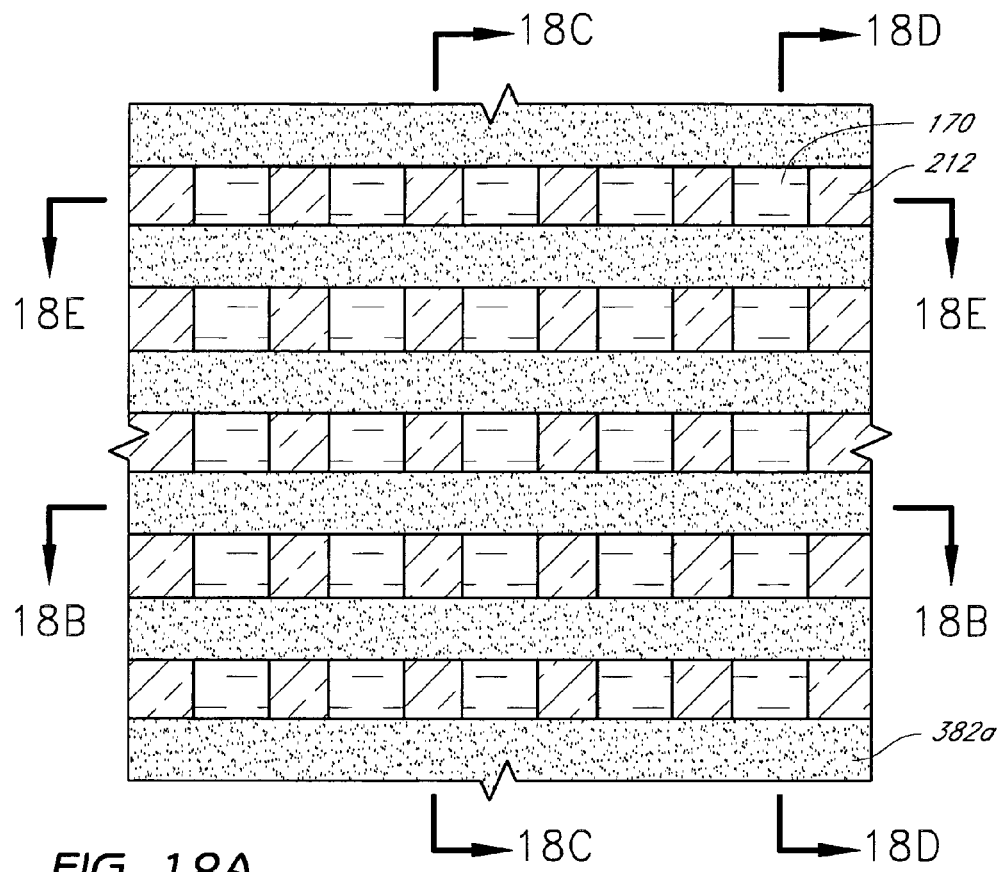
FIGS. 18A-18E show the structure of FIG. 17 after an etch (e.g., a silicon dioxide etch) has removed portions of several exposed layers, while leaving intact one of the stripe materials of exposed portions of the underlying pattern.
Figure 18B:
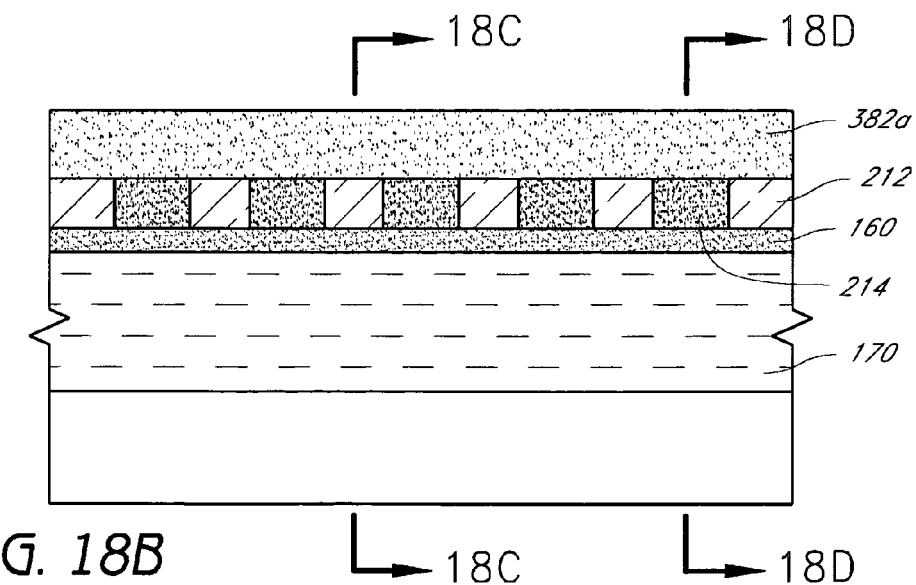
Figure 18C:
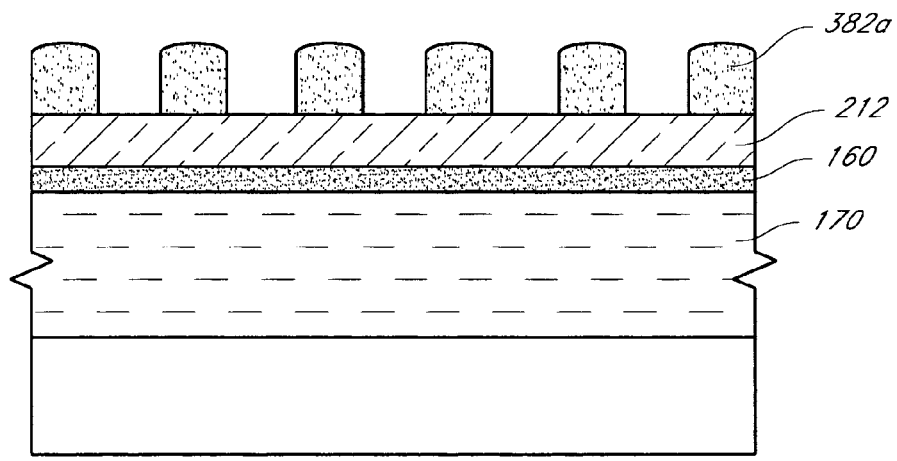
Figure 18D:
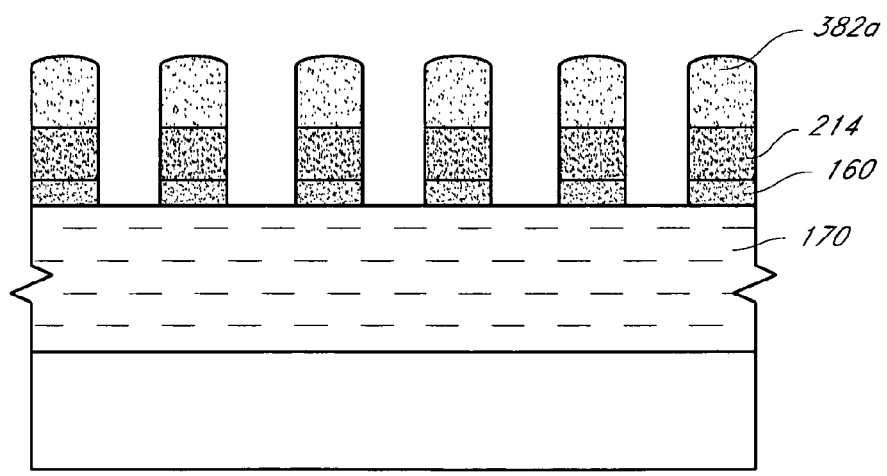
Figure 18E:
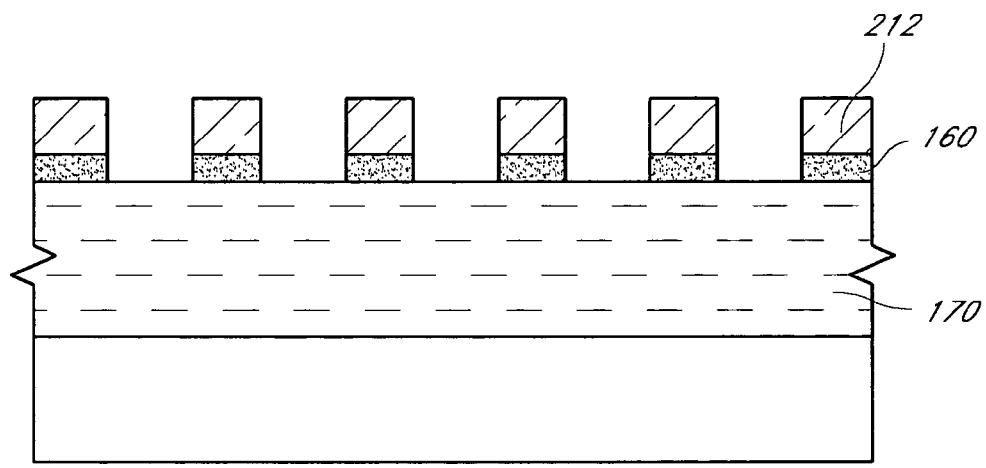

FIGS. 18A-18E show the structure of FIG. 17 after exposed portions of several layers, including the spacers 382 and the stripe 214, have been selectively etched while the stripe 212 has been left largely intact. In a preferred embodiment, the stripe 212 is formed from amorphous silicon and the spacers and the stripe 214 are formed from silicon dioxide, so the etch is a silicon dioxide etch—that is, it etches silicon dioxide selectively with respect to the amorphous silicon that is also exposed. One etch that can be used is a fluorocarbon etch. FIG. 18A shows a schematic plan view of the surface. FIG. 18B shows a schematic cross-sectional side view taken along lines 18B-18B of FIG. 18A. FIG. 18C shows a schematic, cross-sectional side view taken along lines 18C-18C of FIGS. 18A and 18B. FIG. 18D shows a schematic, cross-sectional side view taken along lines 18D-18D of FIGS. 18A and 18B. FIG. 18E shows a schematic, cross-sectional side view taken along line 18E-18E of FIG. 18A.

As revealed by these figures, the exposed portions of the stripes 214 have been left largely intact by the etch step, while exposed portions of the stripes 214, the spacers 382, and the layer 160 have all been etched. Thus, in some embodiments, portions of three different silicon oxide layers are etched by the same etch chemistry. This etch of materials from multiple layers occurs in the illustrated embodiment, as the spacers 382, the stripes 214 and the second hard mask layer 160 each can be formed from silicon dioxide. The materials of these three separate layers have been depicted using stipple of varying weights so that the three layers can be distinguished in the drawings. In some embodiments, each of the three layers can be formed from another common material. As used in this specification, a "common material" can refer to materials that are similar enough in composition to allow each to be etched together, while maintaining selectivity with respect to surrounding materials. Examples of materials that can thus be considered common for this purpose are the various forms of silicon oxide, such as TEOS, BPSG, LSO, $SiO_2$, C-doped oxide, F-doped oxide, porous oxide, SOD, etc. Most preferably, each of these layers is formed using the same composition methods and from the same material (for example, each can be formed from LSO). In other embodiments, the second hard mask layer 160 is formed from a DARC material, as noted above.

The etch step has removed the exposed portions of the stripes 214 first because the stripes 214 are not as thick as the spacers 382. Thus, while the etch has partially removed portions of the spacers 382, creating modified spacers 382a, it has penetrated completely the exposed portions of the stripes 214 and the layer 160. Alternatively, if the layer 160 is formed from a different substance than the spacers 382 and the stripes 214, a separate selective etch can be used to penetrate down through the layer 160 to the third temporary layer 170.

Figure 19A:
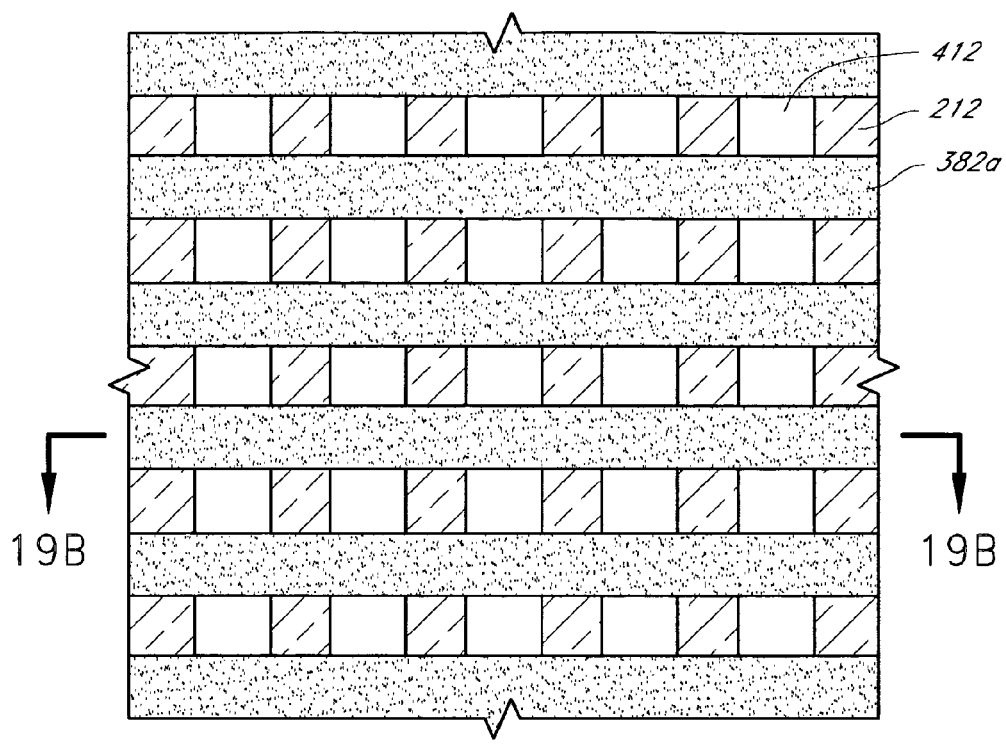
FIGS. 19A-19D show the structure of FIG. 18 after extending the pattern of two overlying layers into an underlying mask or temporary layer, forming holes in the underlying layer. In the illustrated embodiment, the underlying temporary layer is amorphous carbon.
Figure 19B:
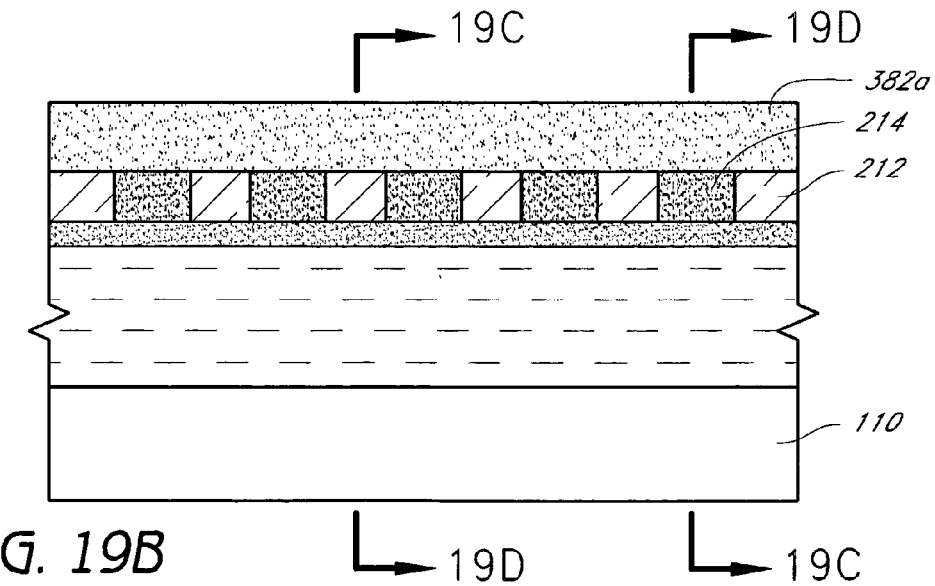
Figure 19C:
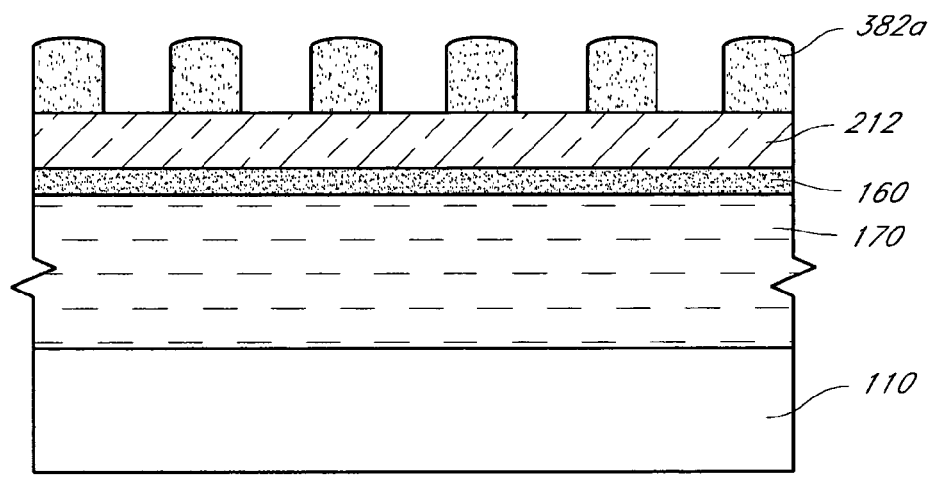
Figure 19D:
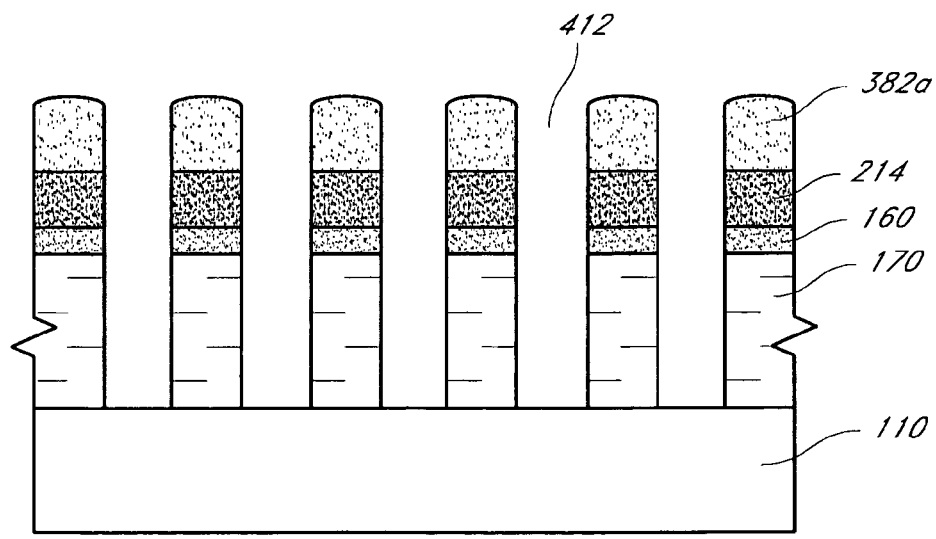

FIGS. 19A-19D show the structure of FIG. 18 after an etch into exposed portions of the third temporary layer 170, which is preferably amorphous carbon. FIG. 19A shows a schematic plan view of the surface. FIG. 19B shows a schematic cross-sectional side view taken along lines 19B-19B of FIG. 19A. FIG. 19C shows a schematic, cross-sectional side view taken along lines 19C-19C of FIG. 19B. FIG. 19D shows a schematic, cross-sectional side view taken along lines 19D-19D of FIG. 19B.

Because of the protective grid formed above the layer 170 by the spacers 382a that cross the stripes 212, the etch removes the material of the underlying layer 170 only in the unprotected areas to form small, densely and/or evenly-spaced holes 412 in the layer 170. FIG. 20C shows the holes in cross section, and reveals how the holes preferably extend all the way down through the layer 170 to the layer 110. As discussed above, the layer 170 can be termed a "substrate" layer, even though the layer 110 can be referred to as a substrate as well.

After this etch step, the layer 170 exhibits features that were present in two distinct overlying patterns. Thus, the perspective of FIGS. 19A and 20A illustrate how the pattern formed by pitch multiplication in FIGS. 2-10 and the (crossing) pattern formed by pitch multiplication in FIGS. 11-17 can be combined to form a pattern derived from both overlying patterns.

Figure 20A:
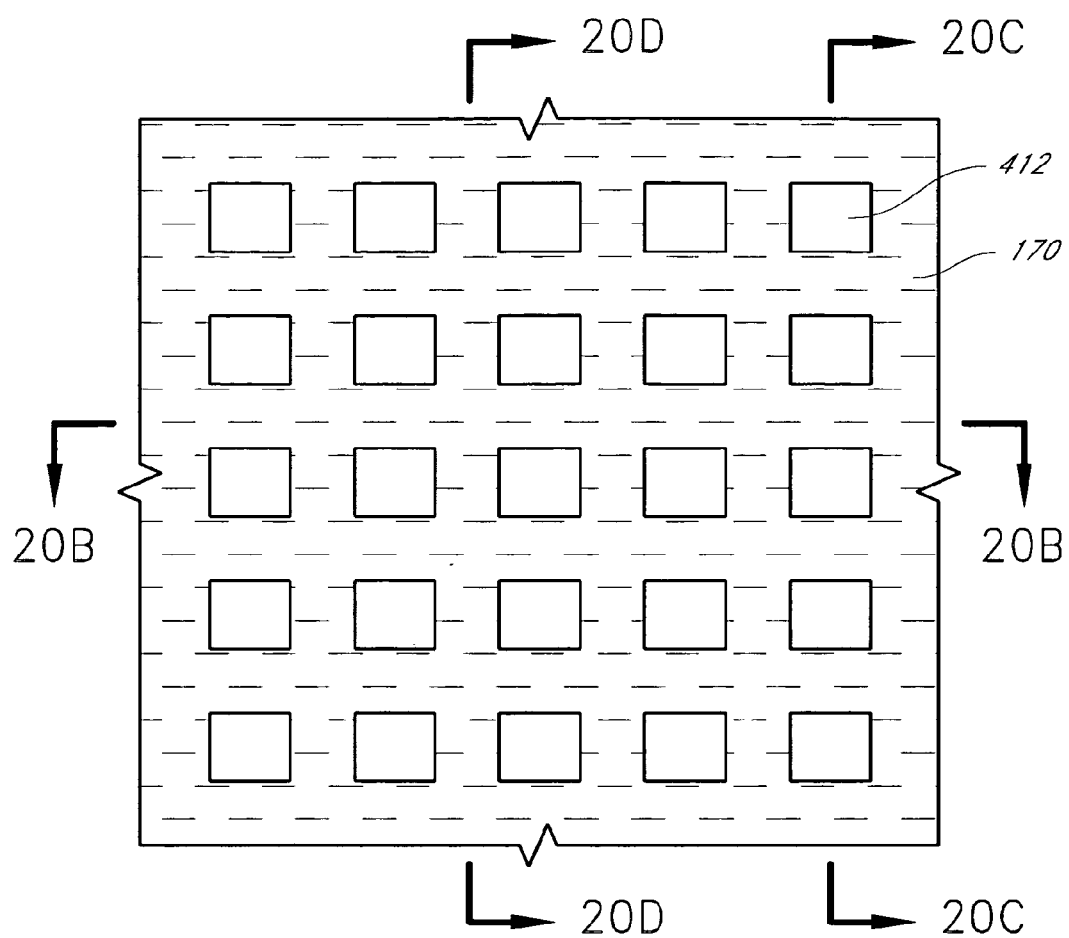
Figure 20B:
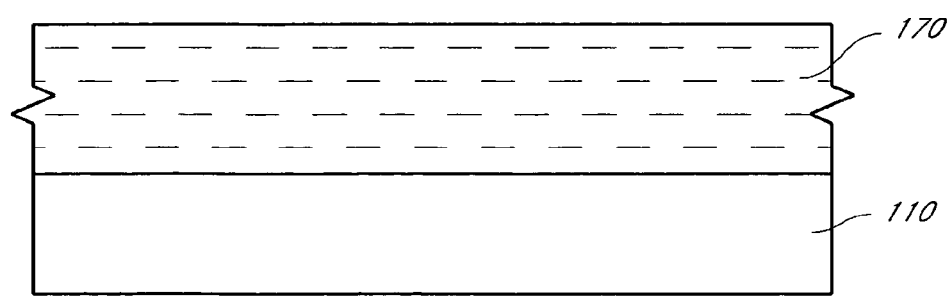
Figure 20C:
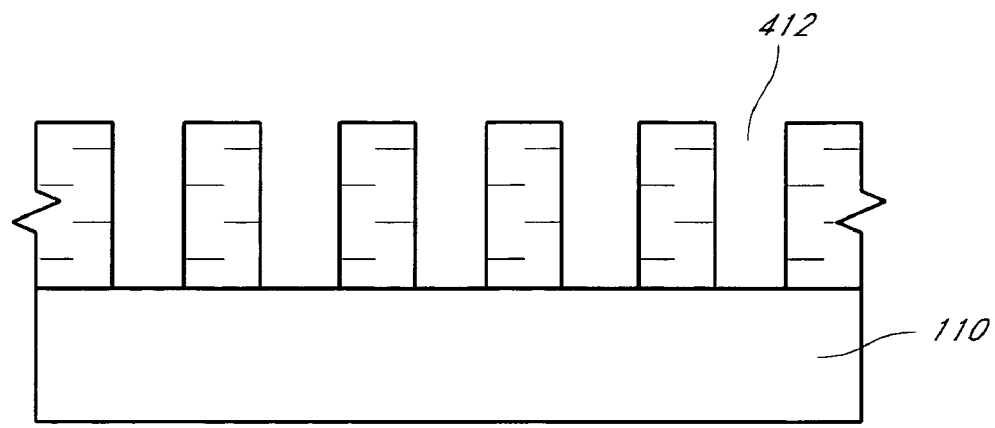
FIG. 20C shows a schematic, cross-sectional side view taken along lines 19C-19C of FIG. 19B.
Figure 20D:
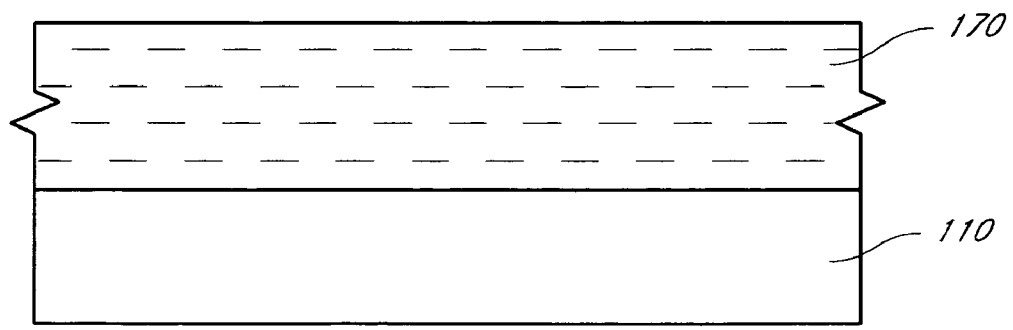

FIGS. 20A-20D show the structure of FIG. 19 after overlying layers have been stripped to reveal the pattern of holes 412 in the third temporary layer 170. FIG. 20A shows a schematic plan view of the surface. FIG. 20B shows a schematic cross-sectional side view taken along lines 20B-20B of FIG. 20A. FIG. 20C shows a schematic, cross-sectional side view taken along lines 20C-20C of FIG. 20A. FIG. 20D shows a schematic, cross-sectional side view taken along lines 20D-20D of FIG. 20A.

One or multiple etch steps can be used to remove the remaining portions of the overlying layers to achieve the structure illustrated in FIGS. 20A-20C. For example, an etch can be used to remove modified spacers 382a, and separate etch steps can be used to remove the remaining portions of the silicon oxide stripes 214, the amorphous silicon stripes 212, and the second hard mask layer 160. Alternatively, a single etch step can remove all of the above layers at once with a CMP process, a sputter etch, a dry etch, a reactive ion etch, or any chemistry or process that removes everything but the materials of the layers 170 and 110. In the illustrated embodiment, the layer 160 has been completely removed in FIG. 20, leaving a carbon grid sitting atop the layer 110. In some embodiments, the remaining portions of overlying layers will be consumed during the etch of a substrate, so that no separate steps are required to remove these layers.

In this embodiment, the features in the carbon grid are holes having a slightly rectangular footprint. In some embodiments, the footprint of the feature is square—that is, the length and width of the features are approximately the same. Preferably, the features have a first width of less than approximately 60 nanometers and a first length of no more than 10 times the first width. Thus, preferred embodiments form features that are isolated, rather than continuous lines. Pitch multiplication of a pattern in one dimension can result in pitch multiplied lines, but pitch multiplication of crossing patterns can result in small, dense, isolated features. The features having a length that is not many times longer than the feature's width are thus different from lines, which may have a length thousands of times their width, for example. Preferred embodiments have features with a less-elongate footprint, instead having a more square-shaped footprint.

The features preferably are spaced apart at intervals of less than approximately 60 nm. In one advantageous embodiment, the isolated features each have a rectangular footprint with dimensions of approximately 50 nm by approximately 60 nm. In another advantageous embodiment, the isolated features each have a square footprint with dimensions of approximately 50 nm by approximately 50 nm.

Figure 21A:
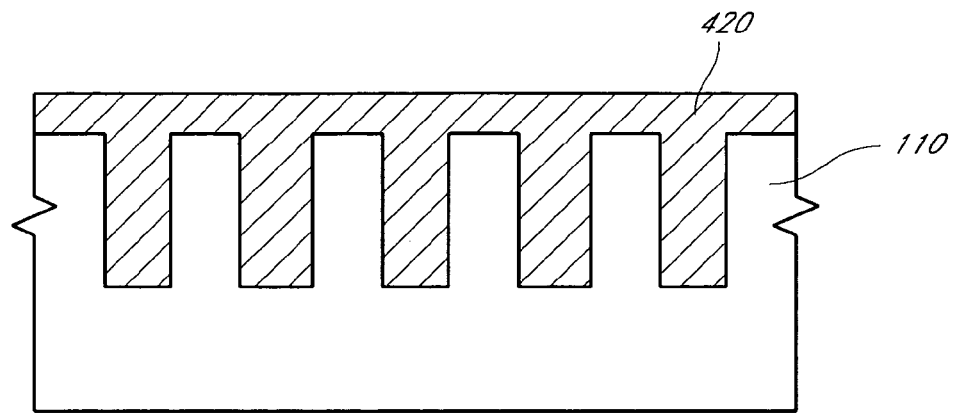
FIG. 21A shows the structure of FIG. 20C after the pattern of holes in the third temporary layer has been extended into the substrate, the third temporary layer has been removed, and the holes have been filled with conductive material.

FIG. 21A shows the structure of FIG. 20C after the pattern of holes 412 in the third temporary layer 170 has been extended into the substrate 110, the third temporary layer 170 has been removed, and the holes have been filled with a conductive material 420. The conductive material 420 preferably substantially fills the holes in the substrate and overflows to form a continuous overflow layer, as illustrated. The conductive material 420 can be any electrically conducting or semi-conducting material. In a preferred embodiment, the conductive material 420 is doped polysilicon. In some embodiments, the conductive material 420 can be a conductive metal such as tungsten, copper, or aluminum. The conductive material 420 often includes multiple sublayers. For example, a titanium adhesion layer, a metal nitride barrier layer, and a metal filler layer can all be used in combination.

Figure 21B:
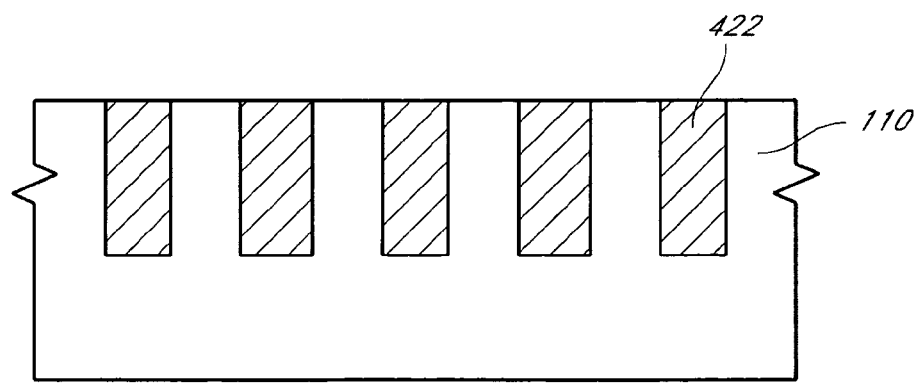
FIG. 21B shows the structure of FIG. 21A after the overflow conductive material has been etched away.

FIG. 21B shows the structure of FIG. 21A after the overflow conductive material has been etched. Preferably, the overflow material is removed using a CMP process. In some embodiments, a hard mask layer (not shown) can be deposited between the third temporary layer 170 and the substrate 110 to act as a CMP stop. Some embodiments can use an RIE or a sputter etch to remove the overflow material.

After the continuous overflow layer of conductive material 420 has been removed, portions of the conductive material form isolated contacts 422 that are densely and/or regularly spaced. Preferred contacts have a pitch width of less than 150 nm. More preferably, such contacts 422 have a pitch width of approximately 100 nm or less. In preferred embodiments, the illustrated substrate grid—that has been patterned from the carbon grid of the layer 170—provides insulation that separates the contacts 422 from each other. In some embodiments the holes 412 can be used to pattern or form other isolated features, such as posts for stud capacitors, trench capacitors, and/or posts for transistors.

In some embodiments, the holes can be used to pattern features formed from a semiconductor. These features can be formed by selective epitaxy in the mask holes, which can expose portions of a single-crystal silicon layer below the mask layer. The features can comprise vertical surround gate transistors that connect a source region (not shown) in an underlying level to a drain that is part of the isolated feature. Thus, the hole can have within it, or the feature can act as, a channel connecting a source region to a drain.

In the illustrated embodiment, the contacts 422 are formed in the extension of holes 412 into the substrate 110, as described above. As is apparent from the details set forth above, the dimensions of each contact 422 are advantageously determined partly by the resolution of a spacer pattern formed using the spacers 182 and partly by the resolution of a spacer pattern formed using the spacers 382. In some embodiments, the contacts have a symmetrical, square footprint. In some embodiments, the contacts are shaped to correspond to the features they are designed to contact.

In some alternative embodiments, the modified layer 170 (the carbon grid with holes that overlies the substrate 110) can be filled directly with conductive material before the holes 412 have been extended into the underlying substrate layer 110. In this embodiment, the hard mask layer 160 can remain in place to act as a CMP stop. A CMP process can be used to good effect because the hard mask layer 160 can function as a mechanical CMP stop which contains the same pattern of regular holes that is also present in the underlying modified temporary layer 170. In some embodiments, this etch stop barrier can be used twice: once to stop a CMP etch (used to remove the remaining portions of modified spacers 382a, the silicon oxide stripes 214, the amorphous silicon stripes 212, and the second hard mask layer 160); and once to stop an etch of overflow conductive material that has filled the holes in the temporary layer 170.

Once the carbon grid has been filled with conductive material, the carbon grid of the modified layer 170 can be removed to leave freestanding conductive contacts 422. The spaces between contacts can then be filled with an insulating material such as oxide (not shown). In some embodiments, the pattern of modified layer 170 is first extended into the substrate layer 110 (such as an ILD), and contacts are formed at the lower level.

In some embodiments, the holes 412—whether extended into the substrate 110 or in an overlying layer—are configured to receive an electrically conductive material such as metal. Furthermore, when used in formation of an integrated circuit, the holes 412 are preferably positioned to allow formation of an electrically conductive contact that connects underlying features such as transistor source regions with other components (for example, bit lines) in an overlying level.

In some embodiments, the contacts 422 can have different configurations. For example, the features may have corners that are less sharply-defined than those of the illustrated contacts 422. Furthermore, the proportions, shape, spacing, height, width, and contours of the contacts 422 may vary from the illustration in FIG. 22.

In certain embodiments, the contacts 422 are polysilicon plugs. In advantageous embodiments, the contacts 422 connect elements of memory arrays; however, such contacts can connect portions of any electrical device or component to any other electrical device or component.

In a third phase of methods described and illustrated above with reference to FIGS. 18-21, the crossing striped structures depicted in FIG. 17 were used to create a grid of mask material having small, densely arranged holes that occur at regular intervals in two dimensions. The mask holes, or holes etched into an underlying layer through the mask, can then be filled with material to create small, densely spaced features in the grid, as depicted in FIG. 21. The skilled artisan will readily appreciate other applications for employing the mask with a dense pattern of holes.

As illustrated in FIG. 17, masks with different patterns in distinct layers can both shield the underlying layers or substrate. FIGS. 18-21 show one way that the two patterns can operate together or be consolidated to effectively form a combined pattern or mask from two superimposed patterns. Subsequent figures show further examples of pattern consolidation, which can be especially beneficial when the two patterns have crossing features or patterns.

Fourth Phase

In a fourth phase, alternative to the third phase of methods in accordance with preferred embodiments and with reference to FIGS. 22-28, the crossing striped structures depicted in FIG. 17 are used to create small, densely arranged mask features (such as free-standing pillars or posts) that occur at regular intervals in two dimensions. In particular, FIGS. 17 and 22-25 show one approach to making such isolated mask features. Note that FIGS. 17 and 26-28 show another approach to making isolated mask features that is an alternative to the third and fourth phases.

FIGS. 22-25 illustrate a process flow that can be used in conjunction with the structure of FIG. 17 to create pillars that are small and densely and/or evenly spaced in an advantageous manner. One example of an etch sequence for this phase is the following: 1) removal of exposed portions of one of the stripe materials (such as amorphous silicon); while leaving intact the other exposed materials (such as silicon dioxide); 2) removal of spacers, the other stripe material, and exposed portions of the hardmask layer (this can be accomplished in a single etch step if all three are formed from the same material); and 3) extension of the resulting pattern (i.e., mask of amorphous silicon islands) into the underlying layer to form freestanding mask pillars or posts.

Figure 22A:
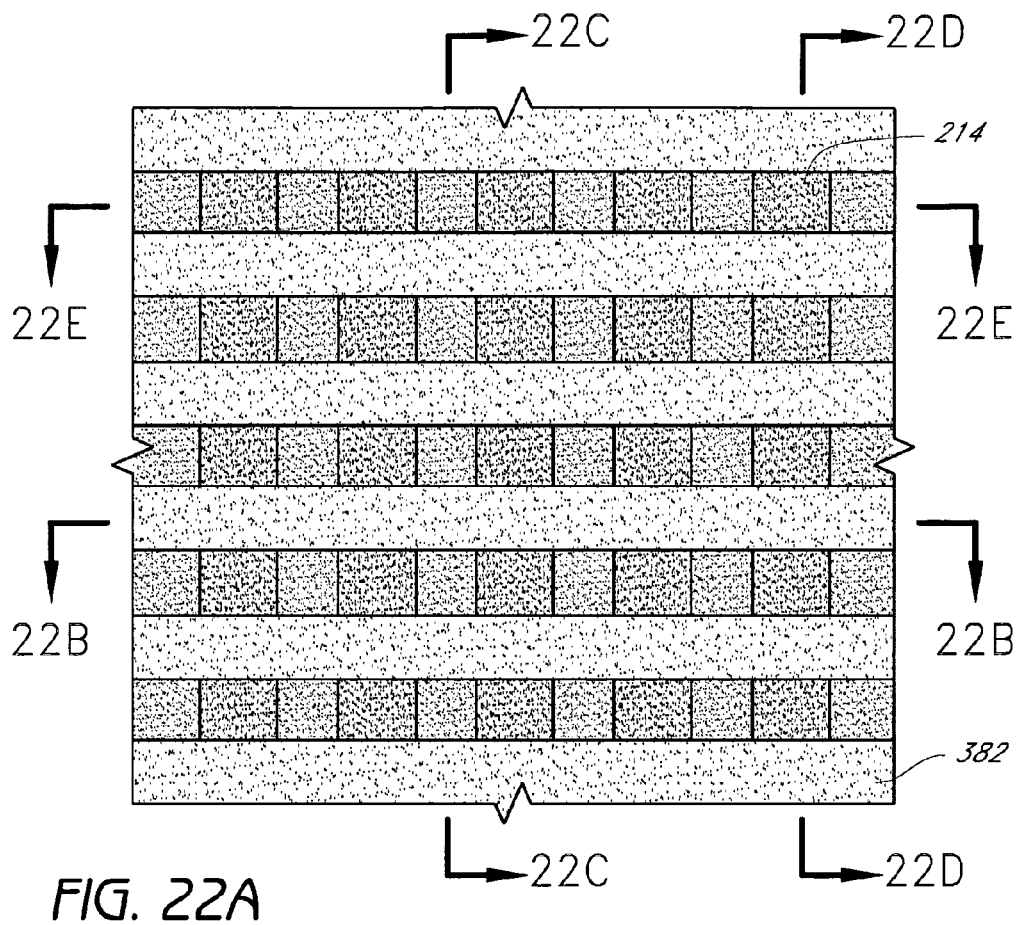
FIGS. 22A-22E show the structure of FIG. 17 after an etch (e.g., an amorphous silicon etch) to remove one of the stripe materials of exposed portions of the underlying pattern.
Figure 22B:
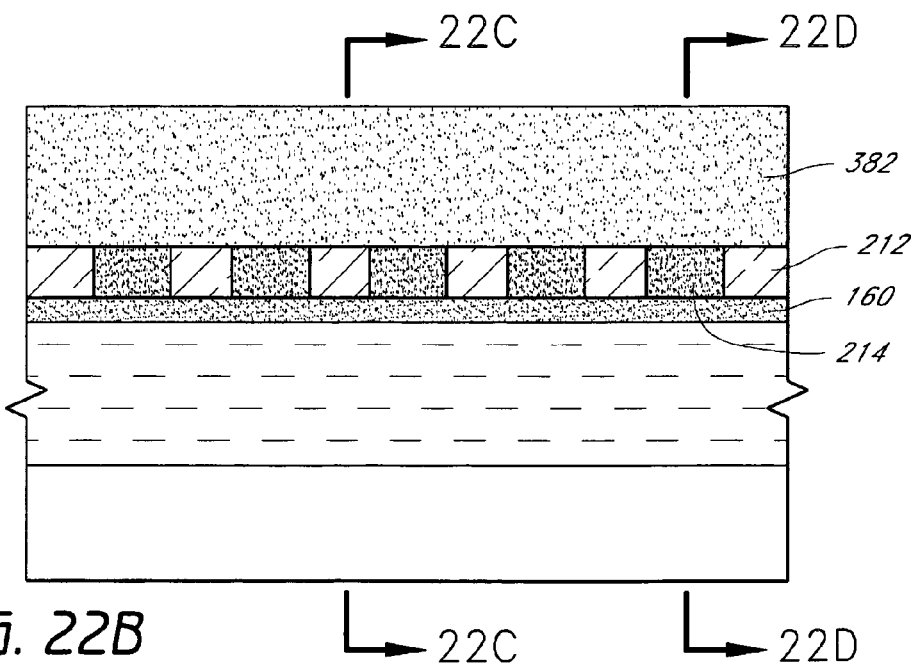
Figure 22C:
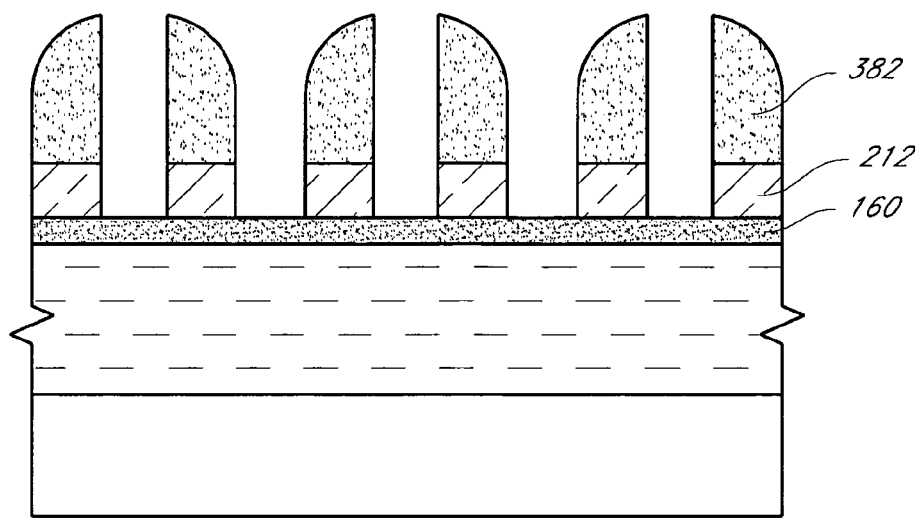
Figure 22D:
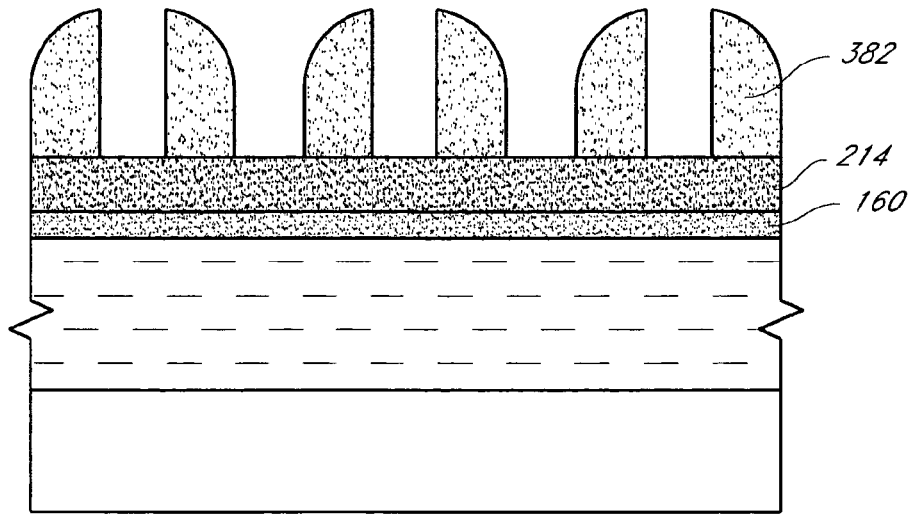
Figure 22E:
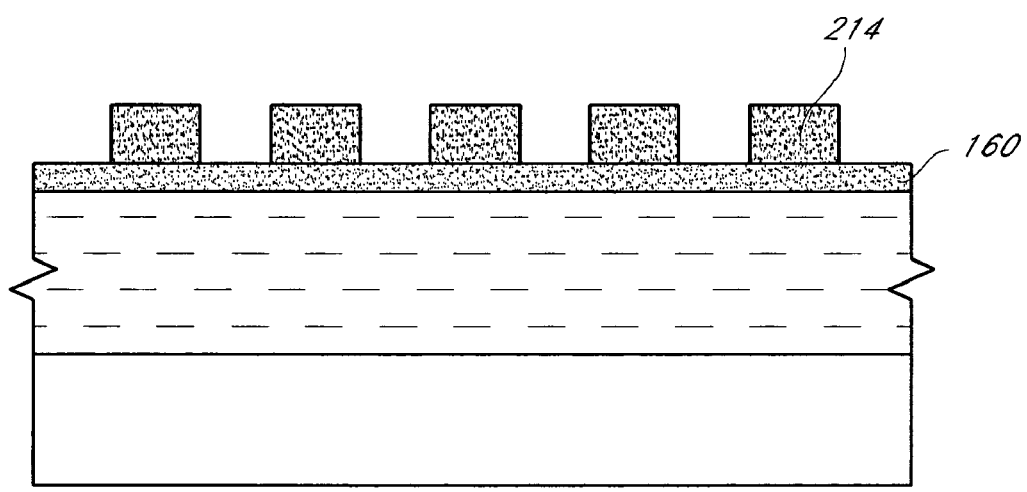

FIGS. 22A-22D show the structure of FIG. 17 after the exposed portions of the stripes 212 have been removed, leaving a three-tiered surface exposed (portions of the spacers 382, the stripes 214, and the layer 160 are all exposed). FIG. 22A shows a schematic plan view of the surface. FIG. 22B shows a schematic cross-sectional side view taken along lines 22B-22B of FIG. 22A. FIG. 22C shows a schematic, cross-sectional side view taken along lines 22C-22C of FIG. 22B. FIG. 22D shows a schematic, cross-sectional side view taken along lines 22D-22D of FIG. 22B.

An HBr/$Cl_2$ etch material can be used to selectively remove exposed portions of the stripes 212, if they are formed from amorphous silicon, for example.

FIG. 22A illustrates that in some embodiments, portions of three different silicon oxide layers can be exposed; the spacers 382, the stripes 214, and the second hard mask layer 160 each can be formed from silicon dioxide. The materials of these separate layers have been depicted using stipple of varying weights so that the three layers (160, 214, and 382) can be distinguished in the drawings. In other embodiments, the second hard mask layer 160 is formed from a DARC material, as noted above.

Figure 23A:
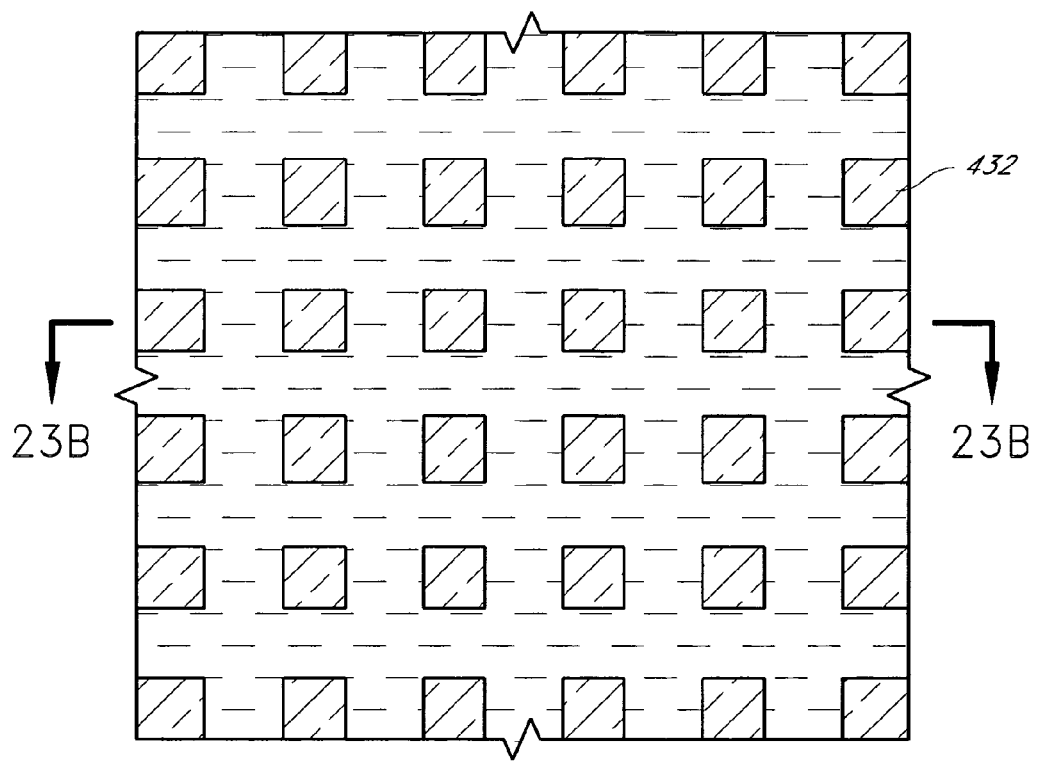
Figure 23B:
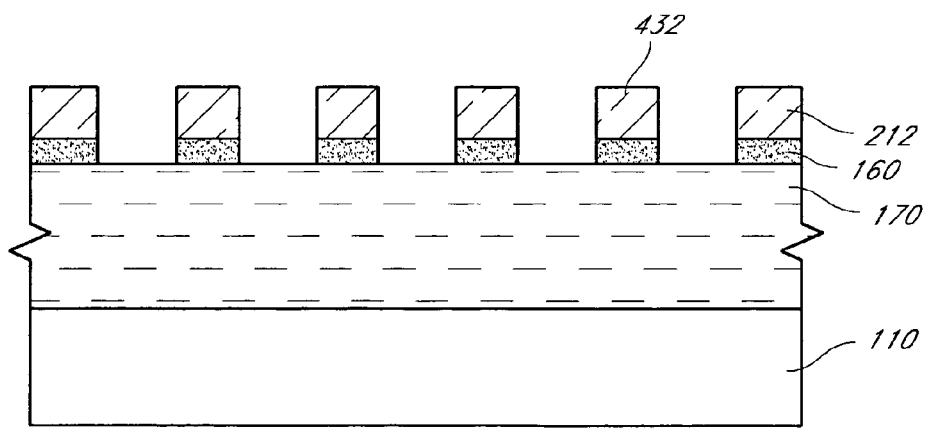

FIGS. 23A-23B show the structure of FIG. 22 after a selective etch has removed all portions of the various oxide features depicted in FIG. 22A that are not masked by the newly exposed islands or caps (formed, for example, from amorphous silicon). This etch step exposes portions of an underlying layer (formed, for example, from amorphous carbon). FIG. 23A shows a schematic plan view of the surface. FIG. 23B shows a schematic cross-sectional side view taken along lines 23B-23B of FIG. 23A.

If each is formed from the same material, such as silicon dioxide in a preferred embodiment, the spacers 382, the remaining portions of the stripes 214, and the non-protected portions of the hard mask layer 160 can all be removed in a single etch step. Alternatively, separate etch steps can be used to remove each of these materials. For example, in one etch step, the spacers 382 can be selectively removed relative to the material of the caps 432 that are formed from silicon, for example. Newly exposed portions of the stripes 214 can then be removed once the spacers 382 no longer protect those portions. Then portions of the hard mask layer that are not protected by the amorphous silicon islands or caps 432 can be removed.

Figure 24A:
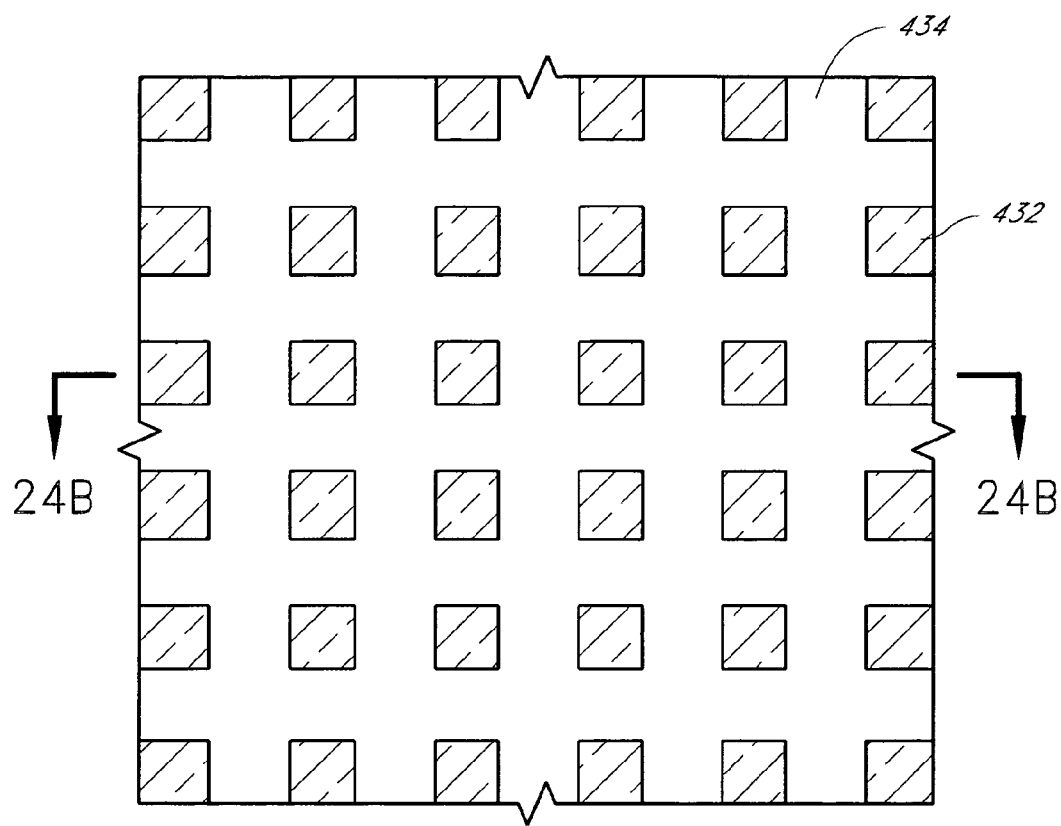
FIGS. 24A-24B show the structure of FIG. 23 after etching the exposed portions of the underlying temporary layer. The island pattern has thus been extended into the underlying material, leaving standing pillars or posts protected by silicon caps.
Figure 24B:
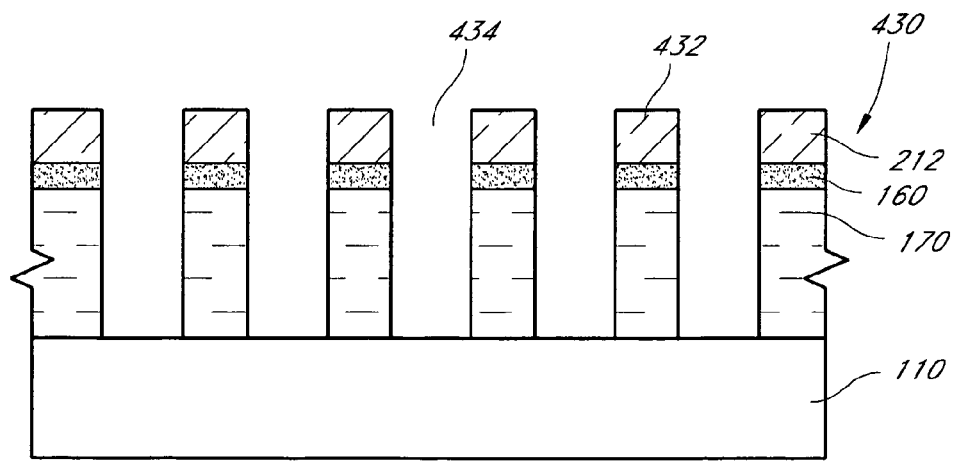

FIGS. 24A-24B show the structure of FIG. 23 after anisotropic etch steps have extended the island pattern of FIG. 23 into an underlying layer, leaving standing pillars 430 protected by amorphous silicon caps 432. FIG. 24A shows a schematic plan view of the surface. FIG. 24B shows a schematic cross-sectional side view taken along lines 24B-24B of FIG. 24A.

The etch steps have removed the portions of the third temporary layer 170 (preferably formed from amorphous carbon) that is not masked by the amorphous silicon caps 432. The amorphous silicon caps 432 comprise the remaining portions of the stripes 212, which were formed from the second temporary layer 150. The caps 432 protect the column of material that is located underneath the caps 432. Thus, the caps 432 form a pattern of small, protective masking islands that can be densely and/or evenly-spaced, made possible by the overlying crossing patterns that have defined the non-island portions of the structure. The caps 432 and the resulting pillars 430 can be densely and/or evenly spaced. FIG. 24B shows the pillars 430 in cross section, and reveals how the pillars are surrounded by spaces 434 in each dimension that preferably extend all the way down through the modified layer 170 to the layer 110. From this point, the pattern present in the modified layer 170 can be further extended into the substrate 110 by extending the spaces 434 down into the substrate 110. That is, the modified layer 170 can be used as a mask to form pillars or islands in the substrate 110.

Figure 25A:
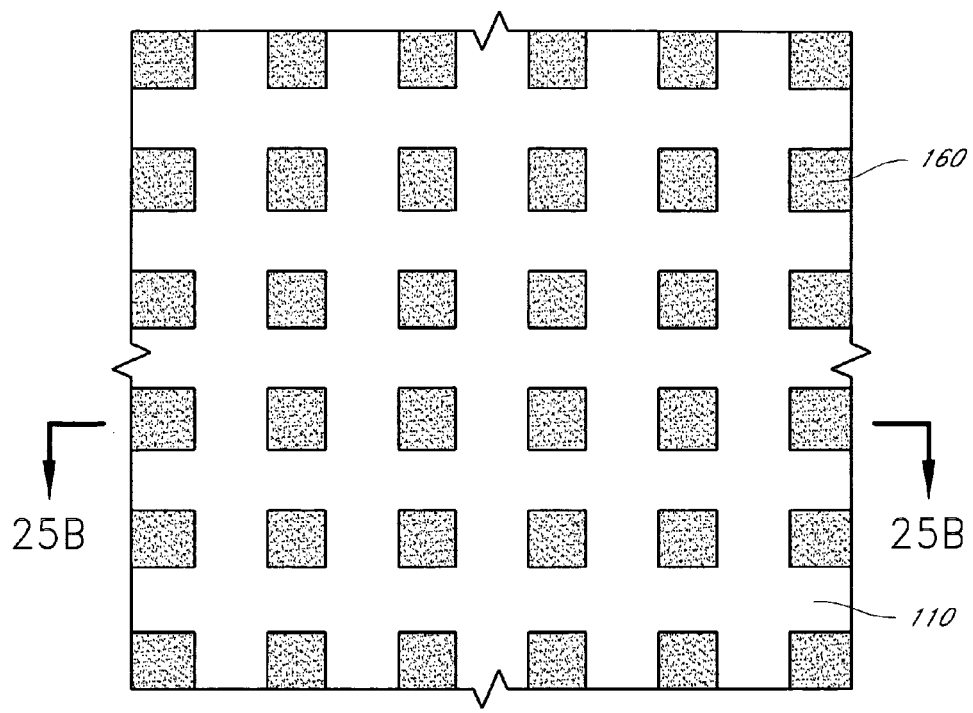
FIGS. 25A-25B show the structure of FIG. 24 after a silicon etch has removed the silicon caps from the pillars or posts. The pillars can be used as a mask for an underlying material.
Figure 25B:

FIGS. 25A-25B show the structure of FIG. 24 after an amorphous silicon etch has removed the amorphous silicon caps 432 from the pillars 430 to form modified mask pillars 430a. Alternatively, a CMP process can be used to remove the amorphous silicon caps 432.

In some embodiments, the pillars or posts are formed from a semiconducting material. Preferably, carbon pillars are used as a mask to etch silicon pillars in an underlying semiconducting substrate. In an alternative embodiment, the carbon layer 170 can be omitted and the holes can be formed directly in the substrate 110, which can be a silicon wafer or a blanket epitaxial layer. As described above, semiconducting pillars can comprise vertical surround gate transistors that connect a source region in an underlying level to a drain in the upper portion of the pillar. Thus, the pillar or post can have within it, or act as, a channel connecting a source region below to a drain above.

In a fourth, alternative phase of methods in accordance with preferred embodiments and with reference to FIGS. 22-25, the crossing striped structures depicted in FIG. 17 have been used to create small, densely arranged features that occur at regular intervals in two dimensions. In particular, FIGS. 17, and 22-25 have shown one approach to making such features.

Fifth Phase

FIGS. 26-28 illustrate a fifth phase, as an alternative to either the third or fourth phases that can be used in conjunction with the structure of FIG. 17 to create mask pillars, and forms small pillars or islands in the underlying substrate that are densely and/or evenly spaced in an advantageous manner, similar to those depicted in FIGS. 24 and 25. One example of an etch sequence for this phase is the following: 1) nonselective etch that wears down all exposed materials (such as a sputter etch or a reactive ion etch); 2) extension of spacer pattern down through the final masking layer; 3) removal of spacer material; 4) removal of the remaining portions of one of the two stripe materials; and 5) use of the remaining stripe material as a mask to etch pillars or islands.

Figure 26A:
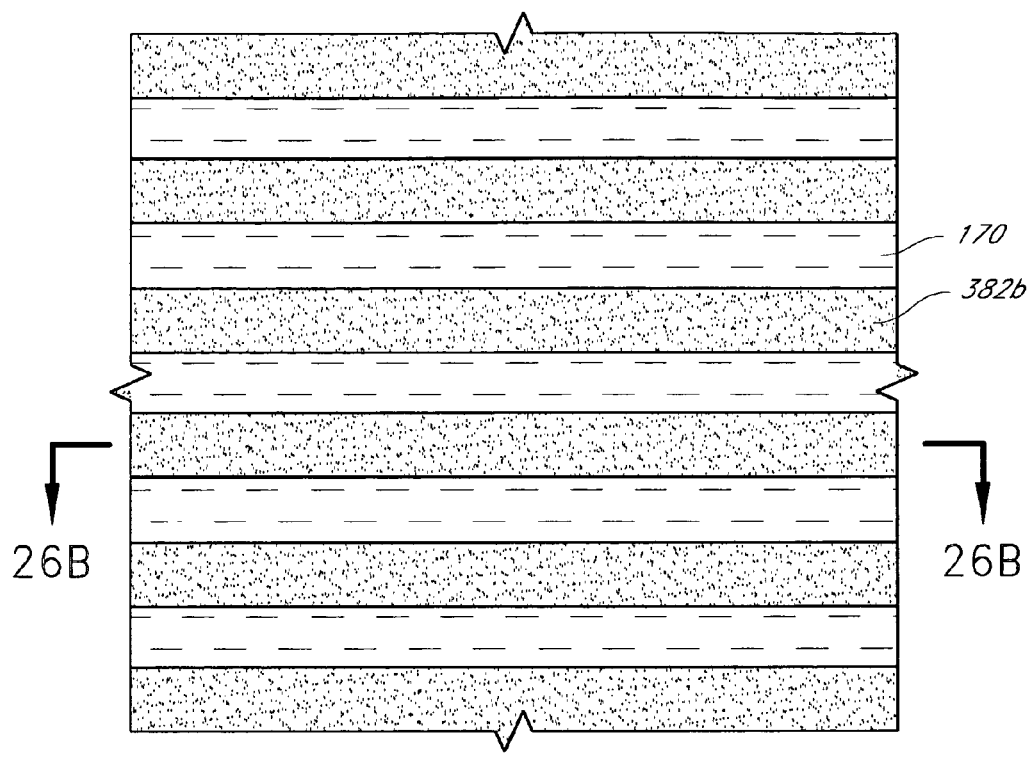
FIGS. 26A-26D show the structure of FIG. 17 after a nonselective etch (for example a sputter etch or reactive ion etch) that etches exposed portions of both striped materials, exposing crossing lines of an underlying mask or temporary layer. In the illustrated embodiment, the underlying temporary layer is amorphous carbon.
Figure 26B:
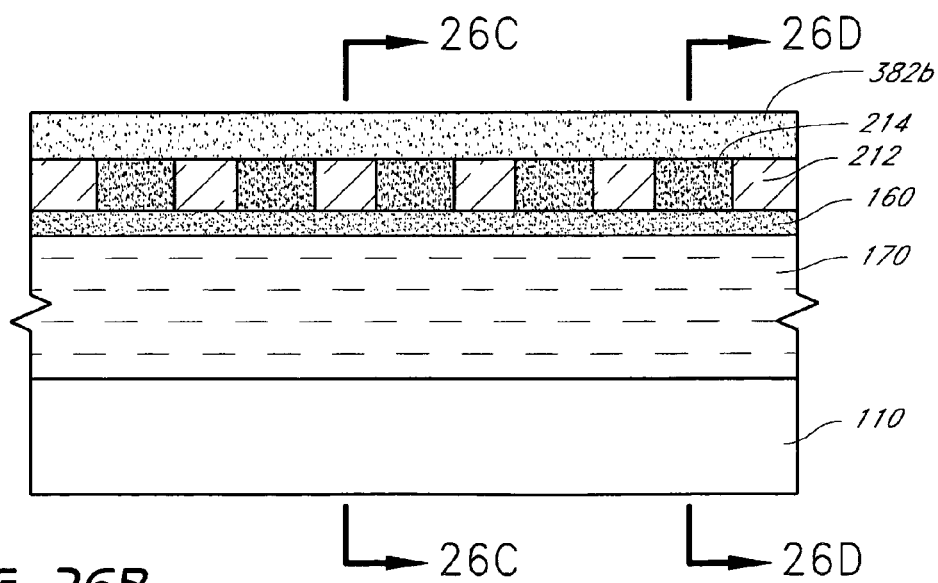
Figure 26C:
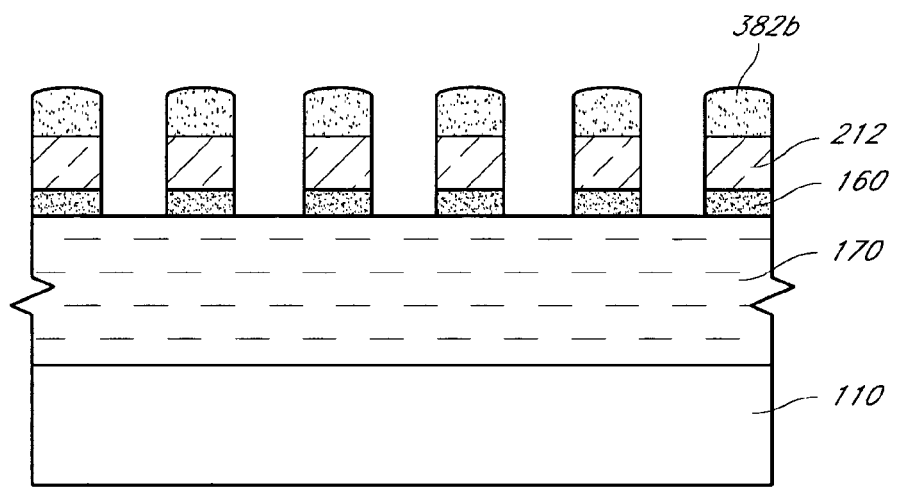
Figure 26D:
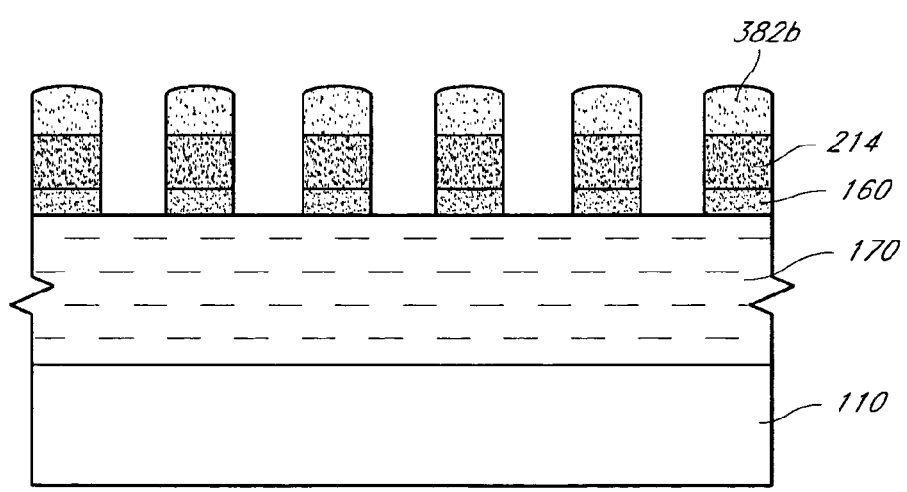

FIGS. 26A-26D show the structure of FIG. 17 after one or multiple etch processes have removed material from all exposed layers, shortening the spacers and sequentially exposing portions of the second hard mask layer 160 and then portions of the underlying third temporary layer 170. FIG. 26A shows a schematic plan view of the surface. FIG. 26B shows a schematic cross-sectional side view taken along lines 26B-26B of FIG. 26A. FIG. 26C shows a schematic, cross-sectional side view taken along lines 26C-26C of FIG. 26B. FIG. 26D shows a schematic, cross-sectional side view taken along lines 26D-26D of FIG. 26B.

As with the etch step described above with respect to FIGS. 18A-18D, this etch has diminished the size of the spacers 382, but modified spacers 382b are shorter than the modified spacers 382a. Furthermore, unlike the etch of FIGS. 23A-23B, the illustrated etch process has penetrated through exposed portions of the amorphous silicon stripes 212, in addition to the silicon dioxide stripes 214 and the second hard mask layer 160 to expose the underlying third temporary layer 170 everywhere that was not protected by the spacers 382. Thus, the height of the spacers 382 has been used to create a "thickness selective" etch that removes the thinner layers but only wears down thicker layers. The etching process has been halted before the thicker layer (spacers 382) has been completely removed. Thus, portions of the spacers 382 are still protecting portions of the striped pattern that underlies the spacers 382. One etch that can be used for this effect is a sputter etch or a reactive ion etch (RIE). Reactive ion etches are advantageous in that they can be selective and create vertical walls.

After portions of the underlying third temporary layer 170 have been exposed, an etch step similar to that described above with respect to FIGS. 23 and 24 can be performed to remove exposed portions of the third temporary layer 170 and extend the spacer pattern into the third temporary layer 170.

Figure 27A:
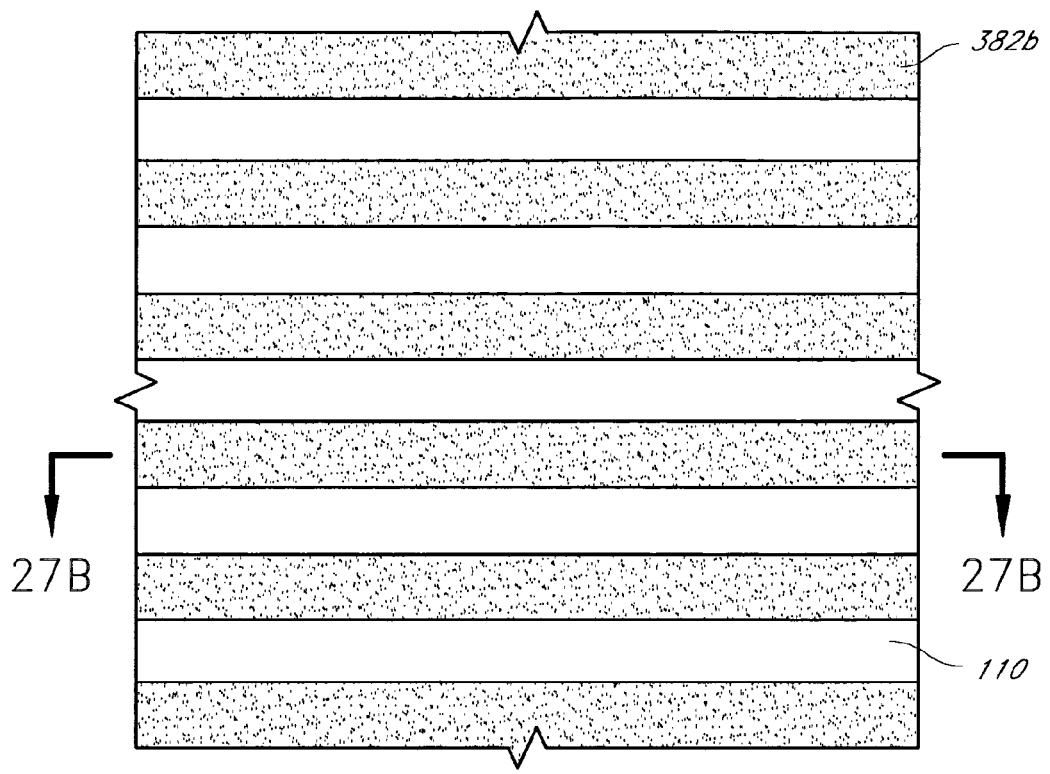
FIGS. 27A-27D show the structure of FIG. 26 after the spacer pattern has been extended into an underlying layer (i.e., an amorphous carbon layer).
Figure 27B:
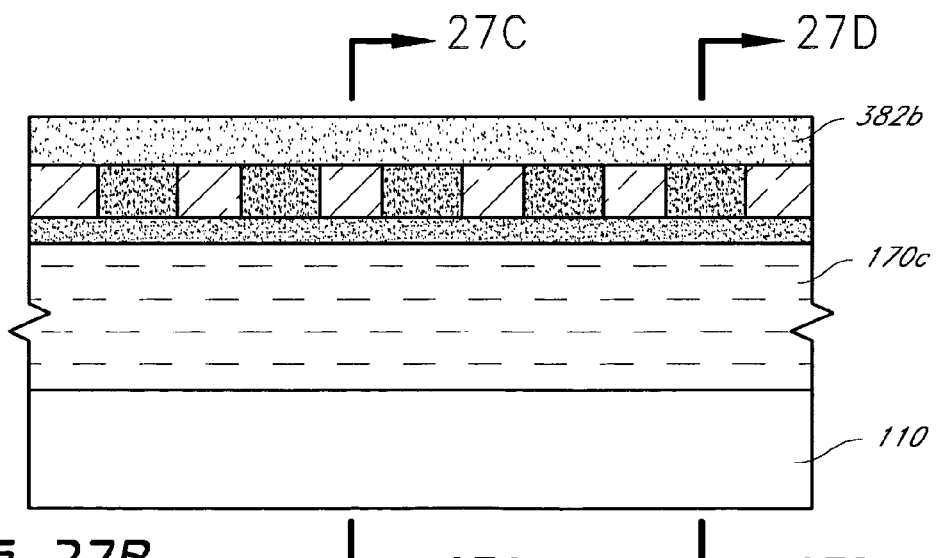
Figure 27C:
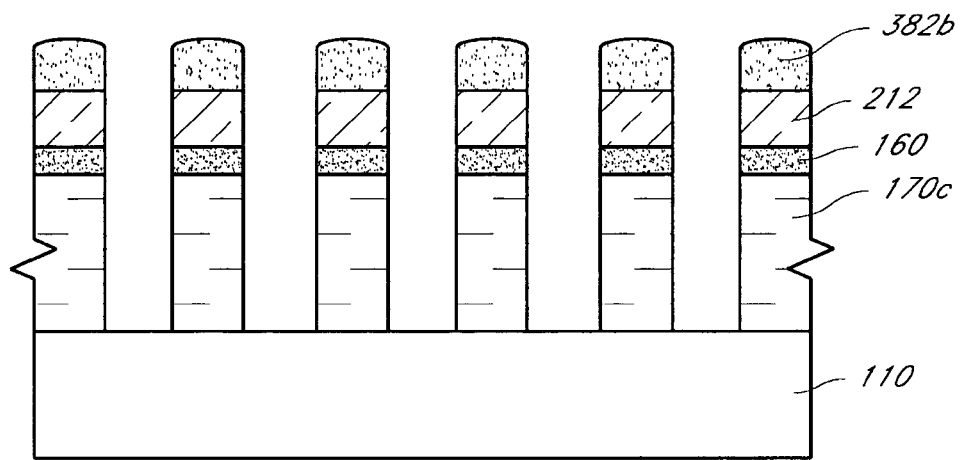
Figure 27D:
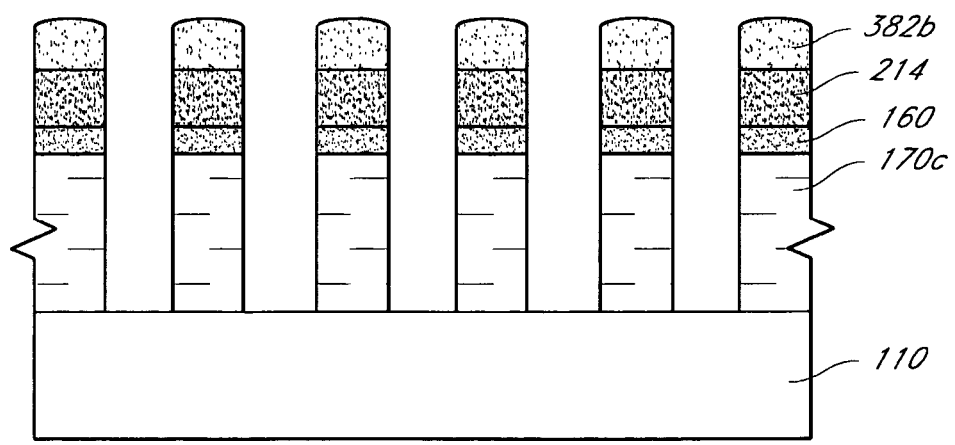

FIGS. 27A-27B show the structure of FIG. 26 after extension of the spacer pattern into an underlying layer. FIG. 27B shows a schematic cross-sectional side view taken along lines 27B-27B of FIG. 27A. FIG. 27C shows a schematic, cross-sectional side view taken along lines 27C-27C of FIG. 27B. FIG. 27D shows a schematic, cross-sectional side view taken along lines 27D-27D of FIG. 27B.

A selective amorphous carbon etch can be performed to remove unmasked portions of the layer 170, extending the line pattern into the layer 170 and forming a modified layer 170c. Thus, in the illustrated embodiment, the spacers 382b have been used as a mask for an etch that has created tall carbon lines.

Figure 28A:
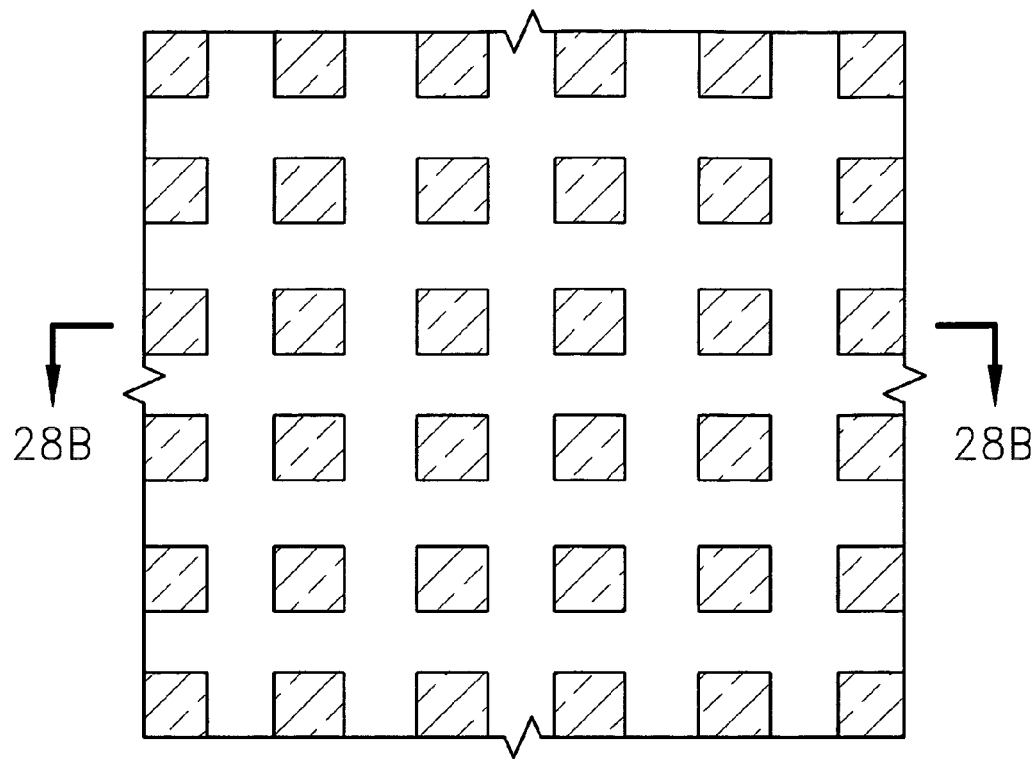
FIGS. 28A-28B show the structure of FIG. 27 after removal of the spacers, one of the stripe materials, and extension of the island pattern into the remaining portions of an underlying layer to leave standing pillars or posts, protected by amorphous silicon caps.
Figure 28B:
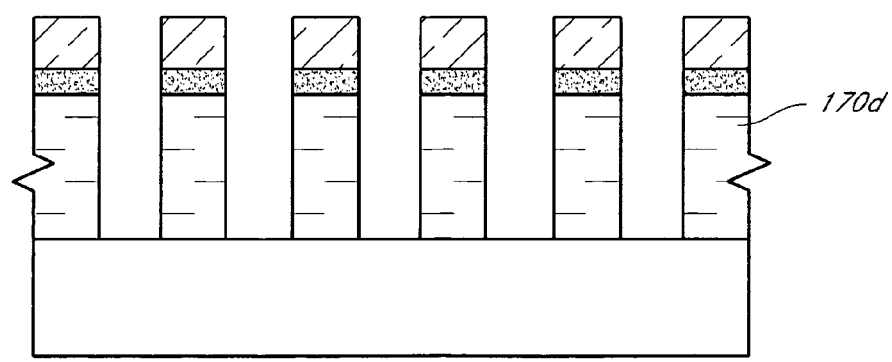

FIGS. 28A-28B show the structure of FIG. 27 after removal of the modified spacers as well as remaining portions of an underlying stripe material and unmasked portions of the hard mask layer. The island pattern has also been extended into the underlying carbon lines to form pillars. FIG. 28A shows a schematic plan view of the surface. FIG. 28B shows a schematic cross-sectional side view taken along lines 28B-28B of FIG. 28A.

The structure illustrated in FIG. 28A-28B can be achieved in the following way, starting from the structure of FIGS. 27A-27D. First one or multiple etches can remove the exposed portions of the modified spacers 382b, the stripes 214, and the second hard mask layer 160. If each of these layers is formed from a similar material, such as silicon oxide, a single etch step can be used. Then, another anisotropic selective amorphous carbon etch can be performed to remove the newly unmasked portions of the layer 170c (i.e., carbon lines), forming modified layer 170d (i.e., carbon pillars). The structure illustrated in FIGS. 28A and 28B is similar to that illustrated in FIGS. 24A and 24B, and subsequent steps can be identical to those described above with respect to those figures.

In a fifth, alternative phase of methods in accordance with preferred embodiments and with reference to FIGS. 26-28, the crossing striped structures depicted in FIG. 17 have been used to create small, densely arranged features that occur at regular intervals in two dimensions.

An alternative way to form a grid structure similar to the grid formed in modified layer 170a and illustrated in FIGS. 21A-21D is to form the pillars 430 illustrated in FIGS. 24 and 25, fill the spaces in between the pillars 430 with a material selectively etchable with respect to the amorphous carbon of pillars 430, polish the material back to the top of the pillars 430, and use a selective etch to remove the pillars 430. An alternative way to form a pillar structure similar to the structure illustrated in FIGS. 24 and 25 is to form the modified layer 170a, fill the holes 412 with a material selectively etchable with respect to the third temporary layer 170a, polish the material back to the surface of the amorphous carbon layer 170a, and use a selective etch to remove the modified layer 170a. Using these positive and negative approaches in turn, while masking off adjacent portions of the array, pillars or posts and grids can be formed in adjacent portions of an array.

EXAMPLE 1

Figure 29A:
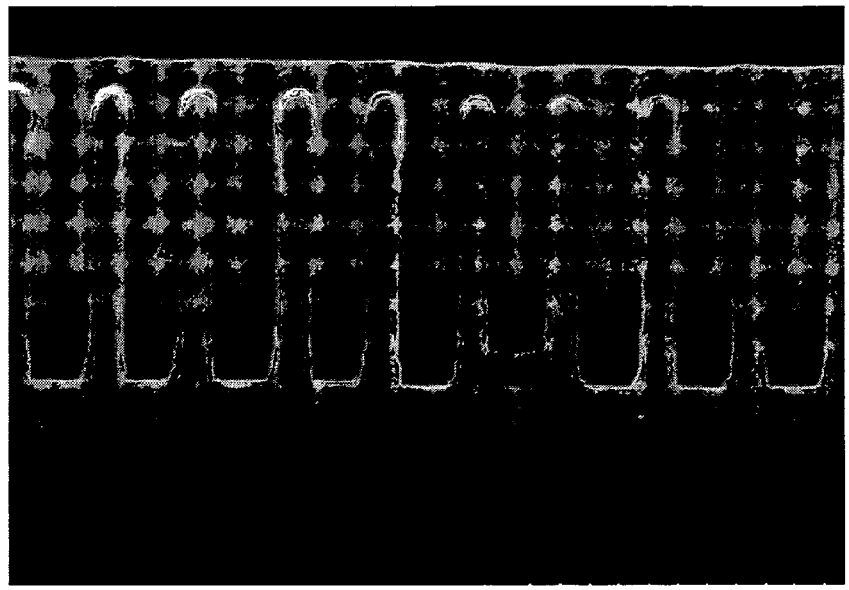
FIGS. 29A-29B are scanning electron micrographs (SEMs) illustrating a cross-sectional view of a dense array of small holes formed according to the described embodiments.
Figure 29B:
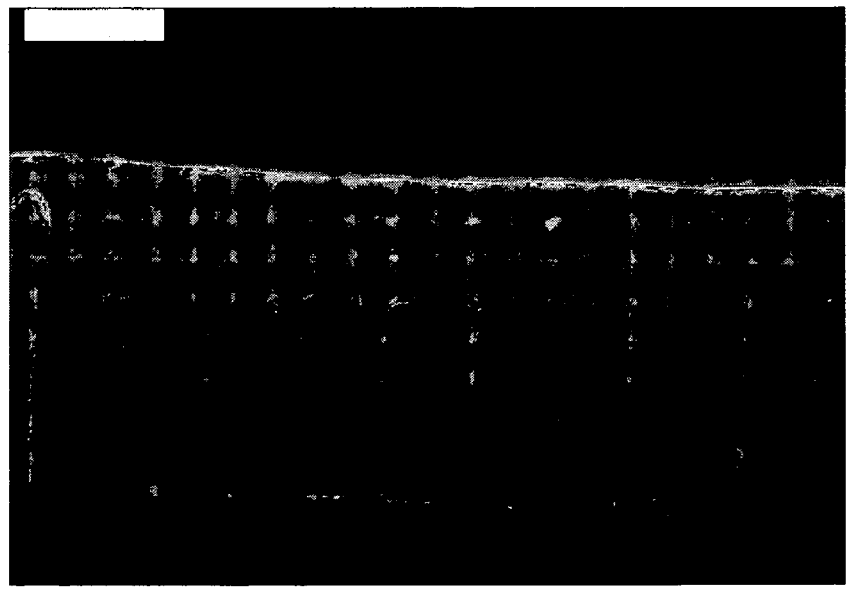

FIGS. 29A and 29B are scanning electron micrographs (SEMs) illustrating a dense array of small holes formed according to the described embodiments. These SEMs show holes having a pitch of less than 100 nm, where processing has employed a disposable hard mask and a 248 nm or 193 nm photolithography process.

Example 2

Figure 30A:
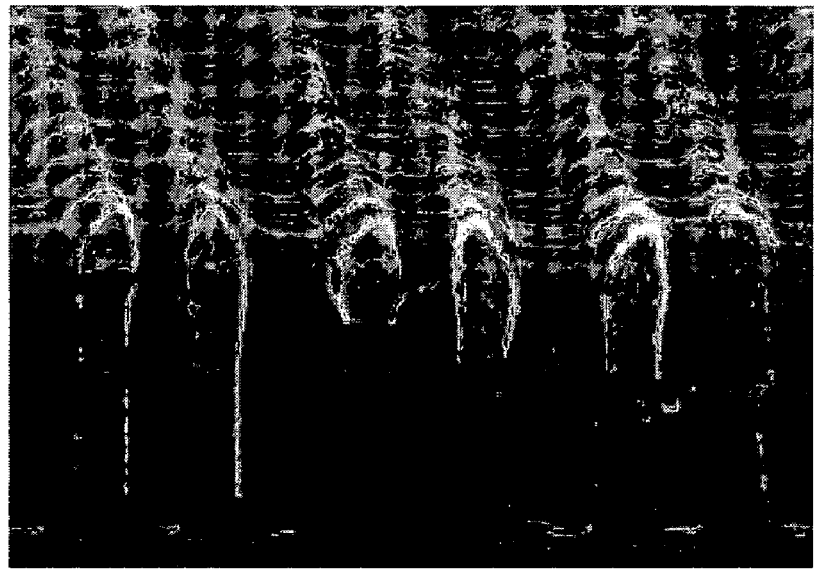
FIGS. 30A-30B are scanning electron micrographs (SEMs) illustrating a perspective views of a dense array of small holes formed according to the described embodiments.
Figure 30B:
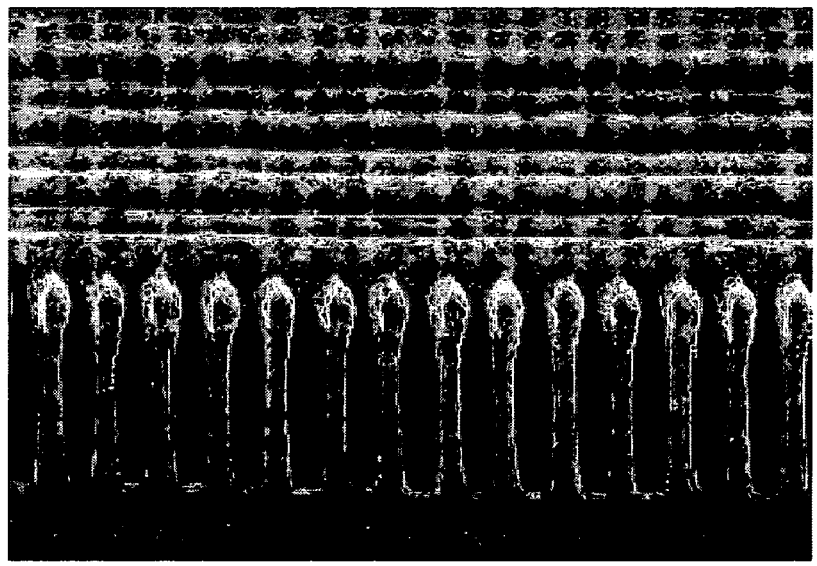

FIGS. 30A-30B are SEMs illustrating a dense array of small holes formed according to the described embodiments. FIG. 30A shows a cross-sectional view wherein the features have a pitch of approximately 140 nm. FIG. 30B shows a cross-sectional view wherein the features have a pitch of approximately 100 nm. These SEMs show an array that was formed using the following sequence of etch parameters:

| Etch Step | Stabilization | Last Spacer Etch (FIG. 17) | Strip α-C mandrels (FIG. 17) | SiO2 etch (FIG. 18) |
|---|---|---|---|---|
| Duration (minutes:seconds) | 3:00 | 0:37 | 0:35 | 0:35 |
| Electrode Spacing (mm) | 27 | 27 | 27 | 27 |
| Applied Power (W) | 0 | 300 | 300 | 300 |
| Chamber Pressure (mT) | 65 | 65 | 150 | 65 |
| Flow rate of $C_4F_8$ (sccm) | 9 | 9 | 0 | 9 |
| Flow rate of $CHF_3$ (sccm) | 20 | 20 | 0 | 20 |
| Flow rate of Ar (sccm) | 450 | 450 | 100 | 450 |
| Flow rate of $O_2$ LO (sccm) | 0 | 0 | 40 | 0 |

| Temperatures (° C.) | | |
|---|---|---|
| Upper Electrode Temperature | Wall Temperature | Lower Electrode Temperature |
| 70 | 60 | 40 |

Example 3

Figure 31A:
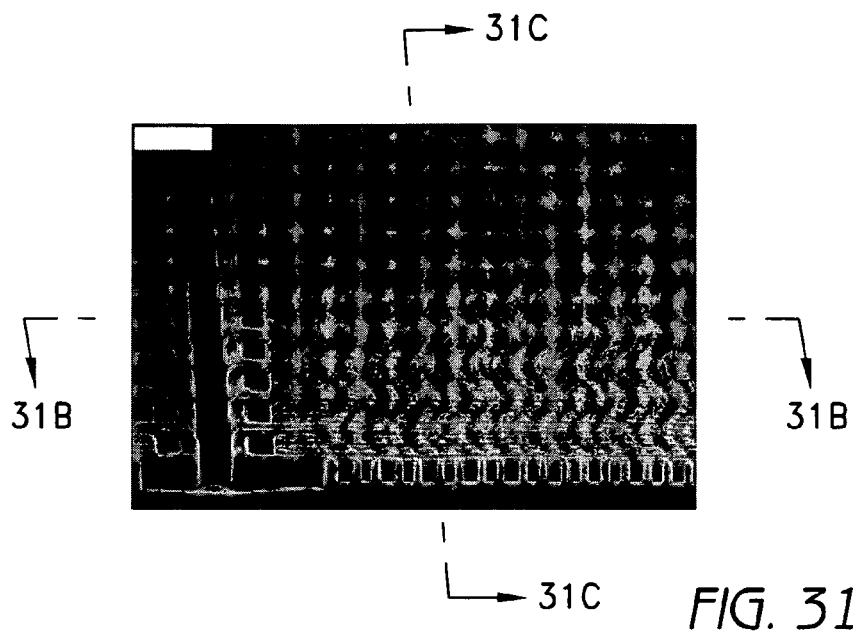
FIGS. 31A-31C are SEMs illustrating a dense array of small holes formed according to the described embodiments.
Figure 31B:
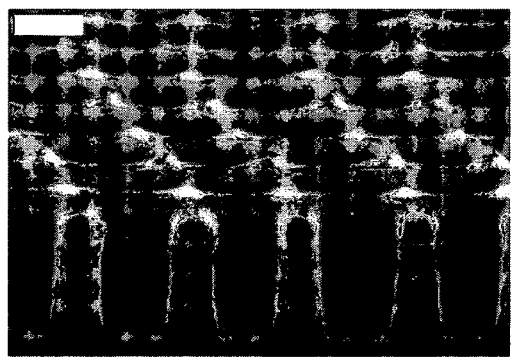
Figure 31C:
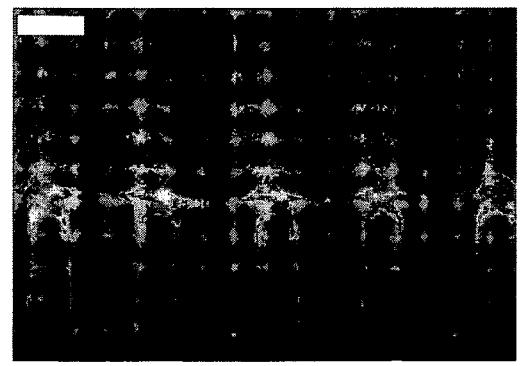

FIGS. 31A-31C are SEMs illustrating a dense array of small holes formed according to the described embodiments. The illustrated pattern was transferred into an underlying PSG insulator and a hard mask was stripped off in-situ. The pitch is approximately 100 nm in two perpendicular dimensions, as illustrated by FIGS. 31B and 31C. The array depicted in FIGS. 31A-31C has features that do not line up directly, but are offset in a regular wavy pattern. BeCause of this wavy pattern, the holes may not be square or rectangular, but instead resemble a trapezoid. Furthermore, the vertical walls do not appear to be completely sheer and perfectly vertical. As these figures illustrate, there are many embodiments and configurations covered by the inventions disclosed herein.

Example 4

Figure 32:
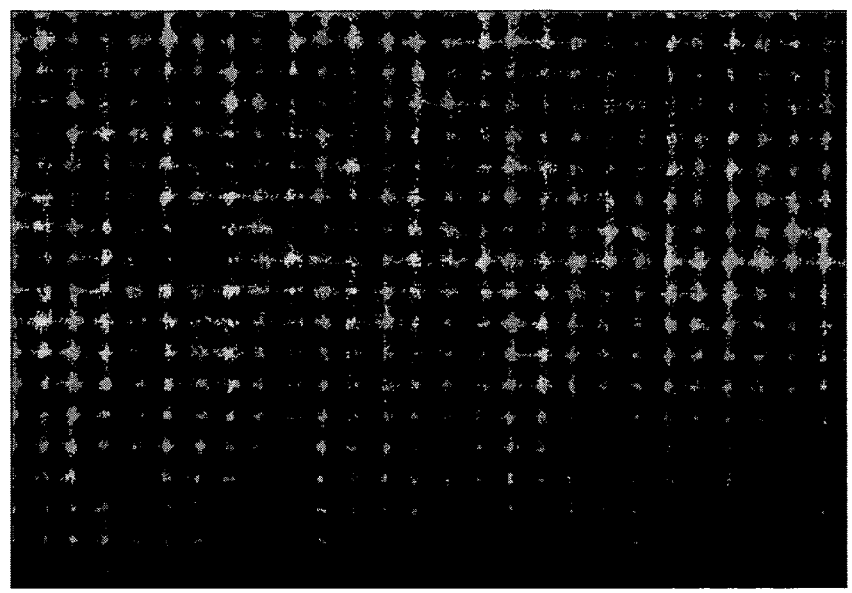
FIG. 32 is an SEM illustrating a dense array of small holes formed according to the described embodiments.

FIG. 32 is an SEM of an array of small, dense holes in a grid. This figure shows a perspective view.

Example 5

Figure 33A:
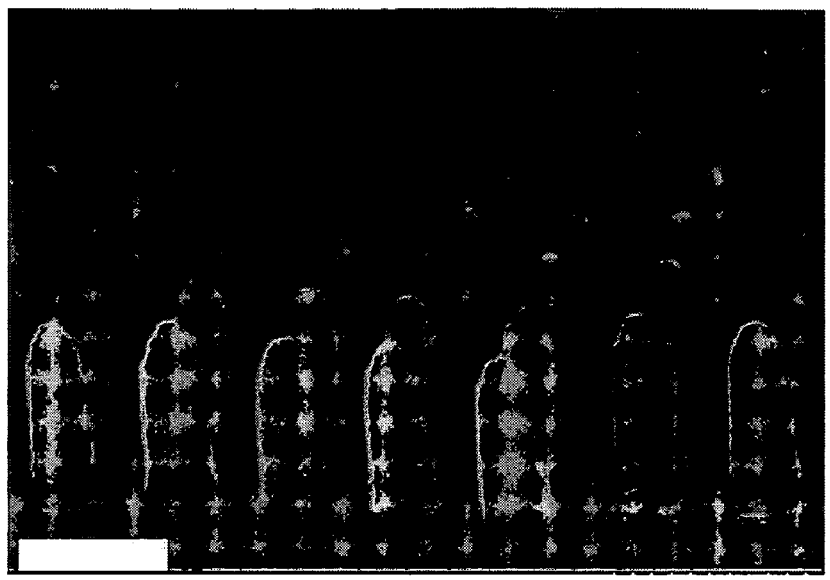
Figure 33B:
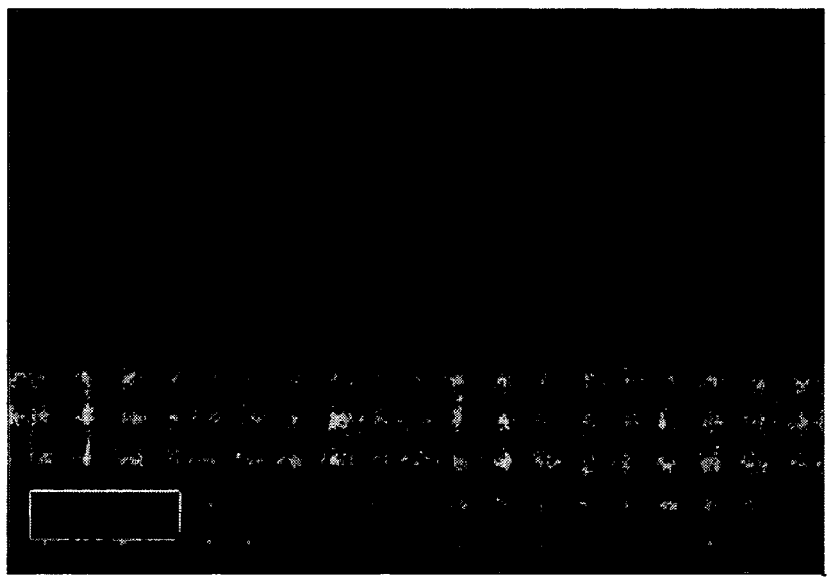

FIGS. 33a-b are SEMs of an array of small, dense pillars or posts in accordance with the disclosed embodiments. The illustrated pattern was transferred into PSG and a hard mask was stripped off in-situ. In these SEMs, the pitch is approximately 100 nm in both dimensions.

The principles and advantages discussed herein are applicable to a variety of contexts in which two or more mask patterns are juxtaposed in a crossing configuration and combined to form circuit features such holes or pillars.

Accordingly, it will be appreciated by those skilled in the art that various other omissions, additions and modifications may be made to the methods and structures described above without departing from the scope of the invention. All such modifications and changes are intended to fall within the scope of the invention, as defined by the appended claims.

We Claim:

1. A method of forming isolated features in an integrated circuit comprising:
   providing a substrate overlaid by multiple layers of masking material;
   creating a first series of selectively definable lines in a first layer of masking material;
   reducing the pitch of the first series of selectively definable lines using a spacer material to create a first arrangement of masking features having a smaller pitch than the first series of selectively definable lines, the first arrangement of masking features comprising pitch-reduced masking lines separated by pitch-reduced spaces, the first arrangement corresponding to a first pattern;
   creating a second series of selectively definable lines in a second layer of masking material, the second series of selectively definable lines not parallel to the first series of selectively definable lines;
   reducing the pitch of the second series of selectively definable lines using a spacer material to create a second arrangement of masking features having a smaller pitch than the second series of selectively definable lines, the second arrangement of masking features comprising pitch-reduced masking lines separated by pitch-reduced spaces, the second arrangement corresponding to a second pattern;
   etching the substrate in a third pattern derived by superimposing the first and second patterns to create isolated features comprising holes;
   filling the holes with conductive material until the conductive material overflows; and
   etching the overflow of conductive material with chemical mechanical planarization to create isolated contacts.

2. The method of claim 1, wherein the third pattern has been transferred to a distinct layer before the third pattern is etched into the substrate.

3. The method of claim 2, wherein the distinct layer is formed from amorphous carbon.

4. The method of claim 1, wherein the selectively definable lines are formed from photoresist.

5. The method of claim 1, wherein the lines in the second series of selectively definable lines are perpendicular to the lines in the first series of selectively definable lines.

6. The method of claim 1, wherein the pitch of the first series of selectively definable lines is reduced before the second series of selectively definable lines is formed.

7. The method of claim 1, wherein the second arrangement of masking features overlies the first arrangement of masking features, each of the first and second arrangements of masking features has portions that are formed from a common material, a first underlying layer is also formed from the common material, a second underlying layer lies below the first underlying layer, and wherein the method further comprises etching exposed portions of the common material from both first and second arrangements of masking features at the same time.

8. The method of claim 7, wherein subsequent to the steps of claim 7, exposed portions of the common material from the first underlying layer and the second arrangement of masking features are etched at the same time to expose isolated portions of the second underlying layer.

9. The method of claim 8, wherein subsequent to the steps of claim 8, the third pattern is extended into the second underlying layer by selectively etching the exposed isolated portions of the second underlying layer to create holes in the second underlying layer.

10. The method of claim 9, wherein the common material is an oxide.

11. The method of claim 9, wherein the common material is silicon dioxide.

12. The method of claim 9, wherein the second underlying layer is amorphous carbon.

13. The method of claim 1, wherein selectively definable lines in the first series of selectively definable lines are reduced in width before the spacer material is applied.

14. The method of claim 1, wherein the first series of selectively definable lines is transferred to an underlying layer of masking material before the spacer material is applied.

15. The method of claim 14, wherein the selectively definable lines in the first series of selectively definable lines are reduced in width before being transferred to an underlying layer of masking material.

16. The method of claim 1, wherein selectively definable lines in the second series of selectively definable lines are reduced in width before the spacer material is applied.

17. The method of claim 1, wherein the second series of selectively definable lines is transferred to an underlying layer of masking material before the spacer material is applied.

18. The method of claim 17, wherein the selectively definable lines in the second series of selectively definable lines are reduced in width before being transferred to an underlying layer of masking material.

19. The method of claim 1, wherein selectively definable lines in the first and second series of selectively definable lines are reduced in width before the spacer materials are applied.

20. The method of claim 1, wherein the first and second series of selectively definable lines are each transferred to an underlying layer of making material before the spacer materials are applied.

21. The method of claim 20, wherein the selectively definable lines in the first series of selectively definable lines are reduced in width before being transferred to an underlying layer of masking material, and the selectively definable lines in the second series of selectively definable lines are also reduced in width before being transferred to an underlying layer of masking material.

22. A method of forming isolated features in an integrated circuit comprising:
   providing a substrate overlaid by multiple layers of masking material;
   creating a first series of selectively definable lines in a first layer of masking material;
   reducing the pitch of the first series of selectively definable lines using a spacer material to create a first arrangement of masking features having a smaller pitch than the first series of selectively definable lines, the first arrangement of masking features comprising pitch-reduced masking lines separated by pitch-reduced spaces, the first arrangement corresponding to a first pattern;
   creating a second series of selectively definable lines in a second layer of masking material, the second series of selectively definable lines not parallel to the first series of selectively definable lines;
   reducing the pitch of the second series of selectively definable lines using a spacer material to create a second of arrangement of masking features having a smaller pitch than the second series selectively definable lines, the second arrangement of masking features comprising pitch-reduce masking lines separated by pitch-reduced spaces, the second arrangement corresponding to a second pattern; and etching the substrate in a third pattern derived by superimposing the first and second patterns to create isolated features, wherein the isolated features comprises pillars.

23. The method of claim 22, wherein the second arrangement of masking features overlies the first arrangement of masking features, each of the first and second arrangements of masking features has portions that are formed from a common material, and an underlying layer is also formed from the common material, wherein the method further comprises removing those portions of the first arrangement of masking features that are not formed from the common material and that are not masked by the common material.

24. The method of claim 23, wherein subsequent to the steps of claim 23, exposed portions of the common material from the underlying layer and both first and second arrangements of masking features are etched at the same time, exposing masking islands that are not formed from the common material, the masking islands corresponding to the third pattern.

25. The method of claim 24, wherein the portions of the common material that are not masked by the masking islands are removed to leave behind masking islands that are not formed from the common material.

26. The method of claim 25, wherein the common material is an oxide.

27. The method of claim 25, wherein the common material is silicon dioxide.

28. The method of claim 22, wherein the second arrangement of masking features overlies the first arrangement of masking features, each of the first and second arrangements of masking features has portions that are formed from a common material, and an underlying layer is also formed from the common material, wherein the method further comprises removing portions of all exposed materials.

29. The method of claim 28, wherein subsequent to the steps of claim 28, the second pattern is extended through the first arrangement of masking materials and into at least one underlying layer.

30. The method of claim 29, wherein the method further comprises removing exposed portions of the common material to leave behind masking islands that are not formed from the common material, the masking islands corresponding to the third pattern.

31. The method of claim 30, wherein the method further comprises extending the pattern of masking islands into an underlying layer to create pillars.

32. The method of claim 22, wherein the pillars are formed from a conductive material.

33. The method of claim 32, wherein the pillars are formed within an inter-level dielectric and a chemical-mechanical process is used to remove excess material and isolate the features.

34. The method of claim 22, wherein the pillars are formed from a semiconductor.

35. The method of claim 34, wherein the pillars form vertical surround gate transistors.

36. A method of forming features in an array, the method comprising:

reducing the pitch of a column of first photodefinable lines to form a column pattern;

reducing the pitch of a row of second photodefinable lines to form a row pattern that crosses the column pattern, the row pattern having row lines and row spaces, the row lines masking off unexposed portions of the underlying column pattern and the row spaces leaving exposed portions of the underlying column pattern;

removing at least some of the exposed portions of the column pattern to define a combined mask layer; and removing portions of the row lines to define a mask of isolated islands.

37. The method of claim 36, wherein the row pattern has been extended into an underlying layer before the row lines are removed.

38. A method of forming a feature array for an integrated circuit comprising:

forming a first feature array in a first mask layer, a plurality of first features of the first feature array being elongate with a first axis of elongation, the first feature array having a first pattern;

forming a second feature array in a second mask layer, a plurality of second features of the second feature array having elongate features with a second axis of elongation that is not parallel to the first axis, the second feature array having a second pattern;

consolidating the first and second patterns into a combined third pattern, the third pattern corresponding to an arrangement of features in a single vertical level of the integrated circuit; and pitch multiplying the first features and the second features;

wherein the first features and the second features of the first and second patterns are pitch multiplied before the first and second patterns are consolidated into the combined third pattern.

39. The method of claim 38, wherein the first features are pitch multiplied before the second features are formed.

40. The method of claim 38, wherein the first features and the second features are pitch multiplied in separate steps.

41. The method of claim 38, wherein the arrangement of features in a single vertical level of the integrated circuit comprises mask pillars.

42. The method of claim 38, wherein the arrangement of features in a single vertical level of the integrated circuit comprises holes in a mask grid.

* * * * *

UNITED STATES PATENT AND TRADEMARK OFFICE
CERTIFICATE OF CORRECTION

PATENT NO. : 7,429,536 B2
APPLICATION NO. : 11/134982
DATED : September 30, 2008
INVENTOR(S) : Abatchev et al.

It is certified that error appears in the above-identified patent and that said Letters Patent is hereby corrected as shown below:

On the Title page, in field (57), under "Abstract", in column 2, lines 6-7, delete "sumperimposed," and insert -- superimposed, --, therefor.

In column 30, line 40, in Claim 20, delete "making" and insert -- masking --, therefor.

In column 30, line 67, in Claim 22, after "second" delete "of".

In column 31, line 2, in Claim 22, after "series" insert -- of --.

In column 31, line 4, in Claim 22, delete "pitch-reduce" and insert -- pitch-reduced --, therefor.

In column 31, line 9, in Claim 22, delete "comprises" and insert -- comprise --, therefor.

Signed and Sealed this

Twenty-fifth Day of November, 2008

JON W. DUDAS
*Director of the United States Patent and Trademark Office*